(12) United States Patent
Duan et al.

(10) Patent No.: US 11,508,927 B2
(45) Date of Patent: Nov. 22, 2022

(54) ORGANIC ELECTROLUMINESCENCE DEVICE, PREPARATION METHOD THEREOF AND DISPLAY APPARATUS

(71) Applicants: KunShan Go-Visionox Opto-Electronics Co., Ltd, Kunshan (CN); TSINGHUA UNIVERSITY, Beijing (CN)

(72) Inventors: Lian Duan, Kunshan (CN); Minghan Cai, Kunshan (CN); Xiaozeng Song, Kunshan (CN); Jinbei Wei, Kunshan (CN)

(73) Assignees: KunShan Go-Visionox Opto-Electronics Co., Ltd, Kunshan (CN); TSINGHUA UNIVERSITY, Beijing (CN)

( * ) Notice: Subject to any disclaimer, the term of this patent is extended or adjusted under 35 U.S.C. 154(b) by 513 days.

(21) Appl. No.: 16/804,383

(22) Filed: Feb. 28, 2020

(65) Prior Publication Data

US 2020/0203652 A1 Jun. 25, 2020

Related U.S. Application Data

(63) Continuation of application No. PCT/CN2019/082695, filed on Apr. 15, 2019.

(30) Foreign Application Priority Data

Aug. 31, 2018 (CN) .......................... 201811012898.9

(51) Int. Cl.
*H01L 51/54* (2006.01)
*H01L 51/50* (2006.01)
*H01L 51/00* (2006.01)

(52) U.S. Cl.
CPC ........ *H01L 51/5028* (2013.01); *H01L 51/008* (2013.01); *H01L 51/0059* (2013.01);
(Continued)

(58) Field of Classification Search
None
See application file for complete search history.

(56) References Cited

U.S. PATENT DOCUMENTS

2017/0194585 A1 7/2017 Yan

FOREIGN PATENT DOCUMENTS

| CN | 106328828 | * | 6/2015 | ............. | H01L 51/54 |
| CN | 105895811 A | | 8/2016 | | |

(Continued)

OTHER PUBLICATIONS

International Search Report and Written Opinion dated Jul. 12, 2019 in corresponding International application No. PCT/CN2019/082695; 11 pages including Partial English-language translation.

(Continued)

*Primary Examiner* — Gregory D Clark
(74) *Attorney, Agent, or Firm* — Maier & Maier, PLLC

(57) ABSTRACT

An organic electroluminescence device, a preparation method thereof, and a display apparatus, the organic electroluminescence device including an organic light emitting layer which includes a host material, a sensitizer material, and a resonance thermally activated delayed fluorescent material, where the host material is a wide bandgap material, and the sensitizer material is a thermally activated delayed fluorescent material. The singlet state energy level of the thermally activated delayed fluorescent material falls between the singlet state energy level of the wide bandgap material and the singlet state energy level of the resonance thermally activated delayed fluorescent material. The triplet state energy level of the thermally activated delayed fluorescent material falls between the triplet state energy level of the wide bandgap material and the triplet state energy level of the resonance thermally activated delayed fluorescent material.

20 Claims, 1 Drawing Sheet

(52) U.S. Cl.
CPC ...... *H01L 51/0067* (2013.01); *H01L 51/0072* (2013.01); *H01L 51/0073* (2013.01); *H01L 51/0094* (2013.01)

(56) References Cited

FOREIGN PATENT DOCUMENTS

| CN | 106206974 A | 12/2016 |
|----|-------------|---------|
| CN | 106328828 A | 1/2017 |
| CN | 106537630 A | 3/2017 |
| CN | 107507921 A | 12/2017 |
| CN | 108409742 A | 8/2018 |
| CN | 108409762 A | 8/2018 |
| CN | 109411634 A | 3/2019 |
| WO | 2016091219 A1 | 6/2016 |

OTHER PUBLICATIONS

Chinese Office Action dated Jul. 1, 2019 in corresponding Chinese application No. 201811012898.9; 6 pages.

Liang et al., "Peripheral Amplification of Multi-Resonance Induced Thermally Activated Delayed Fluorescence for Highly Efficient OLEDs", Angewandte Chemie, 2018, pp. 11316-11320, vol. 57; 5 pages.

* cited by examiner

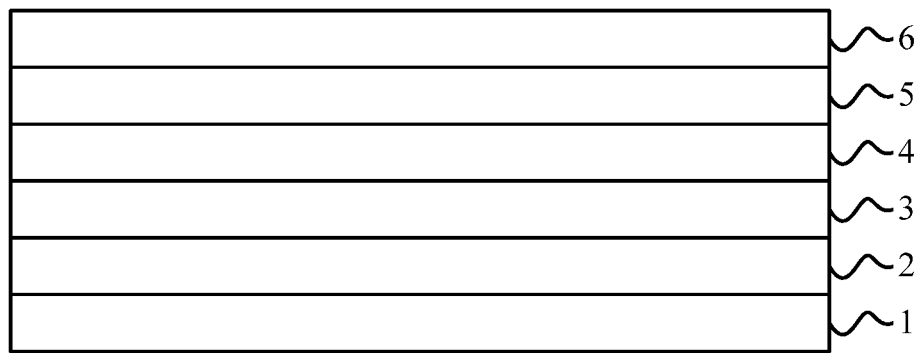

ORGANIC ELECTROLUMINESCENCE DEVICE, PREPARATION METHOD THEREOF AND DISPLAY APPARATUS

CROSS-REFERENCE TO RELATED APPLICATIONS

This application is a continuation of International Application No. PCT/CN2019/082695, filed on Apr. 15, 2019, which claims the priority benefit of China Patent Application No. 201811012898.9, filed on Aug. 31, 2018. The contents of the above identified applications are incorporated herein by reference in their entireties.

FIELD

The present application relates to the technical field of organic electroluminescence and, in particular, to an organic electroluminescence device, a preparation method thereof, and a display apparatus.

BACKGROUND

An organic light emitting diode (OLED) is a device that achieves the purpose of light emission when driven by an electrical current. Its main feature comes from the organic light emitting layer therein. When an appropriate voltage is applied thereto, electrons and holes are combined in the organic light emitting layer to generate excitons, emitting light at various wavelengths according to the characteristics of the organic light emitting layer. At present, the light emitting layer is made from a host material and a dopant dye, where the dye is often selected from traditional fluorescent materials and traditional phosphorescent materials. Specifically, traditional fluorescent materials have the defect that triplet excitons cannot be used. Although traditional phosphorescent materials can introduce heavy metal atoms, such as iridium or platinum, to realize transition of singlet excitons to a triplet state to achieve 100% energy usage efficiency. However, heavy metals such as iridium and platinum are very scarce, expensive and can easily cause environmental pollution, so phosphorescent materials cannot be the first choice for dyes.

Compared with traditional phosphorescent materials and traditional fluorescent materials, thermally activated delayed fluorescence (TADF) materials can absorb ambient heat to realize reverse intersystem crossing for the triplet excitons to a singlet state, thus emitting fluorescence from the singlet state, thereby enabling 100% utilization of excitons without the need for any heavy metal. Hence, at present, 100% energy usage efficiency is mostly achieved by doping the host material with the TADF material. However, most TADF materials themselves also have certain defects, such as excessively wide emission spectrum, large device roll-off, and short service life.

SUMMARY

The application provides an organic electroluminescence device, a preparation method thereof, and a display apparatus. An organic light emitting layer of the organic electroluminescence device uses a wide bandgap material as a host material, and uses TADF as a sensitizer material to assist a sensitized resonance TADF dye to emit light, thereby overcoming the defects of short device service life and wide spectrum caused by existing use of traditional TADF materials to emit light.

The present application provides an organic electroluminescence device including an organic light emitting layer, where the organic light emitting layer includes a host material, a sensitizer material, and a resonance thermally activated delayed fluorescent material; the host material is a wide bandgap material; the sensitizer material is a thermally activated delayed fluorescent material; and a singlet state energy level for the wide bandgap material is greater than a singlet state energy level for the sensitizer material, and a triplet state energy level for the wide bandgap material is greater than a triplet state energy level for the sensitizer material; a singlet state energy level for the sensitizer material is greater than a singlet state energy level for the resonance thermally activated delayed fluorescent material, and a triplet state energy level for the sensitizer material is greater than a triplet state energy level for the resonance thermally activated delayed fluorescent material.

Optionally, the resonance thermally activated delayed fluorescent material has a structure represented by formula [1]:

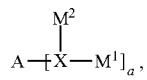

Formula [1]

where X is independently selected from one of B, P, P=O, P=S, $SiR_1$; $R_1$ is selected from hydrogen, substituted or unsubstituted $C_1$-$C_{36}$ alkyl, substituted or unsubstituted $C_6$-$C_{30}$ aryl, substituted or unsubstituted $C_3$-$C_{30}$ heteroaryl; A is selected from substituted or unsubstituted $C_6$-$C_{30}$ aryl, substituted or unsubstituted $C_3$-$C_{30}$ heteroaryl, substituted or unsubstituted $C_6$-$C_{30}$ arylamino; $M^1$ and $M^2$ are each independently selected from H, substituted or unsubstituted $C_1$-$C_{36}$ alkyl, substituted or unsubstituted $C_6$-$C_{30}$ aryl, substituted or unsubstituted $C_6$-$C_{30}$ heteroaryl; at least three of adjacent X, A, $M^1$ and $M^2$ are joined into a ring that includes X; a is an integer from 1 to 12; when a substituent is presented in the above group, the substituent is individually and independently selected from one or more of halogen, cyano, $C_1$-$C_{10}$ alkyl, $C_2$-$C_6$ alkenyl, $C_1$-$C_6$ alkoxy or thioalkoxy, $C_6$-$C_{30}$ aryl and $C_3$-$C_{30}$ heteroaryl.

Optionally, three of adjacent X, A, $M^1$ and $M^2$ are joined into a hexatomic ring including two heteroatoms; and the heteroatoms are selected from two of B, P, Si, O, S, N, and Se.

Optionally, the resonance thermally activated delayed fluorescent material has a molecular mass of 200-2000.

Optionally, a is an integer from 1 to 6.

Optionally, the resonance thermally activated delayed fluorescent material is a compound having one of the general formulas (F-1) to (F-29) in the present application, where R is individually and independently selected from one or more of hydrogen, halogen, cyano, $C_1$-$C_{10}$ alkyl, $C_2$-$C_6$ alkenyl, $C_1$-$C_6$ alkoxy or thioalkoxy, $C_6$-$C_{30}$ aryl and $C_3$-$C_{30}$ heteroaryl, and Y is independently selected from O, S, and Se.

Optionally, the resonance thermally activated delayed fluorescent material is a compound having one of the general formulas (M-1) to (M-72) of the present application.

Optionally, the thermally activated delayed fluorescent material is a compound including an electron donating group and an electron accepting group.

Optionally, the electron donating group includes at least one of carbazolyl, phenothiazinyl, phenoxazinyl, indolocarbazolyl, diphenylamino, triphenylamino, acridinyl, and phenazinyl.

Optionally, the electron donating group is selected from at least one of the groups D1-D17 in the present application, where R is individually and independently selected from one or more of hydrogen, halogen, cyano, $C_1$-$C_{10}$ alkyl, $C_2$-$C_6$ alkenyl, $C_1$-$C_6$ alkoxy or thioalkoxy, $C_6$-$C_{30}$ aryl and $C_3$-$C_{30}$ heteroaryl.

Optionally, the electron accepting group includes at least one of triazinyl, pyrimidinyl, sulfone, thiazolyl, oxazolyl, oxadiazolyl, thiadiazolyl, triazolyl, boron, pyrazinyl, carbonyl, cyano, and pyridyl.

Optionally, the electron accepting group is selected from at least one of the groups A1-A23 in the present application, where R is individually and independently selected from one or more of hydrogen, halogen, cyano, $C_1$-$C_{10}$ alkyl, $C_2$-$C_6$ alkenyl, $C_1$-$C_6$ alkoxy or thioalkoxy, $C_6$-$C_{30}$ aryl and $C_3$-$C_{30}$ heteroaryl.

Optionally, energy level difference of a singlet state and a triplet state of the thermally activated delayed fluorescent material is ≤0.3 eV.

Optionally, the thermally activated delayed fluorescent material is a compound having one of (T-1) to (T-88) of the present application.

Optionally, energy level difference between HOMO energy level and LUMO energy level of the wide bandgap material is ≥2 eV.

Optionally, the wide bandgap material is a compound including at least one of carbazolyl, carbolinyl, spirofluorenyl, fluorenyl, silyl, and phosphonooxy.

Optionally, the wide bandgap material is a compound having one of (W-1) to (W-46) of the present application.

Optionally, the mass percentage (doping concentration) of the sensitizer material in the organic light emitting layer is 1-60 wt %; the mass percentage (doping concentration) of the wide bandgap material in the organic light emitting layer is 20-98.9 wt %; the mass percentage (doping concentration) of the resonance thermally activated delayed fluorescent material in the organic light emitting layer is 0.1-20 wt %.

The present application also provides a method for preparing an organic electroluminescence device, including: forming an organic light emitting layer by co-evaporation plating of a wide bandgap material source, a thermally activated delayed fluorescent material source, and a resonance thermally activated delayed fluorescent material source.

The present application also provides a display apparatus including any one of the organic electroluminescence devices described above.

The organic electroluminescence device of the present application uses a wide bandgap material as a host material, and uses a TADF material as an auxiliary host material to sensitize the resonance TADF material to emit light. After absorbing external heat, the singlet excitons and triplet excitons of the sensitizer TADF material can be used and transported to the singlet state and triplet state energy levels, respectively, of the resonance TADF material. Meanwhile, the resonance TADF materials can emit light using both singlet and triplet excitons. In addition, the sensitizer material can convert a part of its triplet energy into the singlet state, which inhibits Dexter energy transfer process and promotes Foster energy transfer process, effectively improving the light emitting efficiency of the organic electroluminescence device of the present application while reducing the efficiency roll-off caused by over extensive triplet state life at high brightness. Meanwhile, the wide bandgap host can effectively dilute the exciton concentration for the sensitizer material and the resonance TADF, reducing the triplet-triplet annihilation (TTA) and triplet-polaron annihilation (TPA), which enhances the stability of the device. In addition, the resonance TADF material used in the present application does not have any significant intramolecular electron transfer, so it is beneficial to narrow the spectrum and improve the color purity of the device.

BRIEF DESCRIPTION OF THE DRAWINGS

FIG. 1 is a schematic structural diagram of an organic electroluminescence device of the present application.

DESCRIPTION OF EMBODIMENTS

FIG. 1 is a schematic structural diagram of an organic electroluminescence device of the present application. As shown in FIG. 1, the organic electroluminescence device of the present application includes a substrate 1, on which an anode 2, a hole transporting region 3, an organic light emitting layer 4, an electron transporting region 5 and a cathode 6 are deposited in sequence.

Specifically, the substrate 1 may be made of glass or a polymer material having excellent mechanical strength, thermal stability, water resistance, and transparency. In addition, the substrate 1 may also be provided with a thin film transistor (TFT).

The anode 2 can be formed by sputtering or depositing an anode material on a substrate. The anode material can be made from a transparent and conductive oxide material, such as indium tin oxide (ITO), indium zinc oxide (IZO), tin dioxide ($SnO_2$), zinc oxide (ZnO) and any combination thereof. The cathode 6 can be made from a metal or an alloy, such as magnesium (Mg), silver (Ag), aluminum (Al), aluminum-lithium (Al—Li), calcium (Ca), magnesium-indium (Mg—In), magnesium-silver (Mg—Ag) and any combination thereof.

An organic material layer in the hole transporting region 3, organic light emitting layer 4 and electron transporting region 5 can be prepared, in sequence, on the anode 2 by methods such as vacuum thermal evaporation plating, spin coating, and printing, etc. A compound used for the organic material layer may be organic micro-molecular, organic macro-molecular, polymers, and combinations thereof.

Now, the organic light emitting layer 4 will be described in detail.

Most TADF materials are flawed as dyes to emit light. For example, due to the intramolecular charge transfer in TADF materials, the light emitting spectrum is often too wide and the light color is not pure. Moreover, due to the high triplet state energy level and long lifecycle of the triplet exciton of the TADF materials, the device is resulted in suffering large roll-off and short service life, etc. In addition, most host materials are characterized by unipolar transmission, resulting in uneven transportation of electrons and holes in the light emitting layer, as well as serious efficiency roll-off at high brightness, providing poor spectral stability.

Accordingly, the organic light emitting layer of the present application includes a host material, a sensitizer material, and a resonance thermally activated delayed fluorescent material, where the host material is a wide bandgap material, the sensitizer material is a thermally activated delayed fluorescent material, the singlet state energy level for the wide bandgap material is greater than the singlet state energy level for the sensitizer material, the triplet state energy level for the wide bandgap material is greater than the triplet state energy level for the sensitizer material; the singlet state energy level for the sensitizer material is greater than the singlet state energy level for the resonance thermally activated delayed fluorescent material, the triplet state energy level for the sensitizer material is greater than the triplet state energy level for the resonance thermally activated delayed fluorescent material.

The host material of the present application is a wide bandgap material, which can dilute the concentrations of the sensitizer material and the resonance TADF material, effectively reducing the exciton density and thereby effectively inhibiting triplet-triplet annihilation (TTA) and excitons-polaron annihilation (TPA), which further enhances the stability of the organic electroluminescence device, improves device life, and reduces efficiency roll-off. Preferably, the energy level difference between the HOMO energy level and the LUMO energy level of the wide bandgap material of the present application is ≥2 eV, so as to ensure that the singlet state and triplet state of the wide bandgap material are at higher energy levels, which is beneficial for occurring Foster energy transfer process and inhibiting Dexter energy transfer process from the wide bandgap material to the sensitizer material.

The sensitizer material of the present application is a TADF material, which is the material used to assist the wide bandgap host material to sensitize the resonance TADF. The sensitizer material can absorb ambient heat and undergo an up-conversion process to convert the triplet excitons into singlet excitons for emitting fluorescence.

The resonance TADF material of the present application emits light as a dye. Since the resonance TADF molecules mostly have a rigid planar aromatic structure, the structure is stable. In resonance TADF molecules, the different resonance effects of different atoms lead to the spatial separation of HOMO and LUMO of molecule in different atoms, with small overlap areas, which leads to small energy level difference between the singlet state and triplet state of the resonance TADF. Thus, the resonance TADF material can experience reverse intersystem crossing. Preferably, the energy level difference between the singlet state and the triplet state of the resonance TADF of the present application is 0.3 eV or less, and is capable of performing the reverse intersystem crossing by absorbing ambient heat. Meanwhile, there is no significant donor group and acceptor group in the resonance TADF molecule, so the resonance TADF molecule has weak intramolecular charge transfer and high stability.

In the present application, the singlet state energy level for the wide bandgap material of the host material is greater than the singlet state energy level for the sensitizer material TADF, and the singlet state energy level for the sensitizer TADF is greater than the singlet state energy level for the resonance TADF. The triplet state energy level for the wide bandgap material of the host material is greater than the triplet state energy level for the sensitizer material TADF, and the triplet state energy level for the sensitizer material TADF is greater than the triplet state energy level for the resonance TADF. Therefore, when the organic electroluminescence device is electrically excited, energy of both the singlet and triplet excitons of the wide bandgap material can be respectively transferred to the singlet and triplet states of the sensitizer material, or the holes and electrons are directly recombined on the sensitizer. Since the sensitizer material is a thermally activated delayed fluorescent material, the triplet exciton of the sensitizer material will transit to the singlet state of the sensitizer material TADF, and then the energy will be transferred from the singlet state of the sensitizer material to the singlet state of the resonance TADF. In addition, the triplet excitons of the resonance TADF also occurs the reverse intersystem crossing to their own singlet state. As a result, energy of both the singlet state and triplet state in the organic electroluminescence device are fully utilized, improving light emitting efficiency of the organic electroluminescence device. Meanwhile, the sensitizer can convert its triplet excitons into singlet state, which effectively inhibits the Dexter energy transfer between the sensitizer and the resonance dye and promotes the Föster energy transfer process. Thus, the present application can effectively reduce the concentration of triplet excitons, thereby solving the problem of significant reduce of roll-off at high brightness and effectively enhancing the stability of the organic electroluminescence device.

In addition, the present application uses the resonance TADF as the dye. Since there is no significant intramolecular charge transfer excitation state in the resonance TADF molecule, a narrow light emitting spectrum can be obtained.

The present application introduces innovation into the composition of the organic light emitting layer by using the TADF sensitizer to assist the wide bandgap material to sensitize the resonance TADF, allowing for not only improving the service life of the organic electroluminescence device, reducing roll-off, narrowing the spectrum, but also great significance in industrial applications.

In order to further reduce the roll-off efficiency of the device, the mass percentage of the sensitizer in the organic light emitting layer is 1 wt %-60 wt %, the mass percentage of the wide bandgap material in the organic light emitting layer is 20 wt %-98.9 wt %, and the mass percentage of the resonance thermally activated delayed fluorescent material in the organic light emitting layer is 0.1 wt %-20 wt %.

Further, the above-mentioned resonance thermally activated delayed fluorescent material has a structure represented by formula [1]:

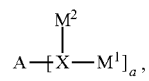

Formula [1]

where X is independently selected from one of B, P, P=O, P=S, SiR$_1$; R$_1$ is selected from hydrogen, substituted or unsubstituted C$_1$-C$_{36}$ alkyl, substituted or unsubstituted C$_6$-C$_{30}$ aryl, substituted or unsubstituted C$_3$-C$_{30}$ heteroaryl; A is selected from substituted or unsubstituted C$_6$-C$_{30}$ aryl, substituted or unsubstituted C$_3$-C$_{30}$ heteroaryl, substituted or unsubstituted C$_6$-C$_{30}$ arylamino; M$^1$ and M$^2$ are each independently selected from H, substituted or unsubstituted C$_1$-C$_{36}$ alkyl, substituted or unsubstituted C$_6$-C$_{30}$ aryl, substituted or unsubstituted C$_3$-C$_{30}$ heteroaryl; at least three of adjacent X, A, M$^1$ and M$^2$ are joined into a ring that includes X; a is an integer from 1 to 12; when a substituent is presented in the above group, the substituent is individually and independently selected from one or more of halogen, cyano, C$_1$-C$_{10}$ alkyl, C$_2$-C$_6$ alkenyl, C$_1$-C$_6$ alkoxy or thioalkoxy, C$_6$-C$_{30}$ aryl and C$_3$-C$_{30}$ heteroaryl.

It can be understood that when X is independently selected from P=O and P=S, P is connected to M$^1$ and M$^2$, and when X is selected from SiR$_1$, Si is connected to M$^1$ and M$^2$ respectively.

It should be emphasized that in the structure of Formula [1], the X, M$^1$ and M$^2$ with the amount of a can be selected independently of each other, i.e., each unit containing the X, M$^1$ and M$^2$ can be the same or different, and the M$^1$ and M$^2$ in each unit may be the same or different. Furthermore, in the resonance TADF of the present application, at least one ring is created by joining at least three of adjacent X, A, $M^1$ and $M^2$, and the ring includes X.

Further, in the resonance TADF shown in Formula [1] of the present application, three of adjacent X, A, $M^1$, and $M^2$ are joined into a hexatomic ring including two heteroatoms, where the heteroatoms are selected from two of B, P, Si, O, S, N, and Se.

Specifically, adjacent X, A and $M^1$ may be joined into a hexatomic ring including two heteroatoms, adjacent X, A and $M^2$ may be joined into a hexatomic ring including two heteroatoms, and adjacent X, $M^1$ and $M^2$ may be joined into a hexatomic ring including two heteroatoms.

It can be understood that one heteroatom in the hexatomic ring comes from X, which may specifically be B, P or Si, and the other heteroatom is selected from one of O, S, N and Se. When the heteroatom is N, since the N atom is trivalent, it can be connected to a hydrogen atom as well as an alkyl substituent. Specifically, the substituent may be one or more of halogen, cyano, $C_1$-$C_{10}$ alkyl or cycloalkyl, $C_2$-$C_6$ alkenyl or cycloalkenyl, $C_1$-$C_6$ alkoxy or thioalkoxy, $C_6$-$C_{30}$ aryl, and $C_3$-$C_{30}$ heteroaryl.

As a preferred solution, the present application selects a resonance TADF material with a molecular mass of 200-2000 as the dye because a resonance TADF material whose molecule is too large is undesirable for evaporation plating in practice operating process.

As an implementation, the controlling of the molecular mass of the resonance TADF can be achieved by limiting the a to an integer of 1-6. That is, the resonance TADF of the present application may include 1-6 units having X, $M^1$ and $M^2$.

Preferably, the resonance TADF material of the present application may have a structure represented by one of the following general formulas (F-1) to (F-29):

F-1
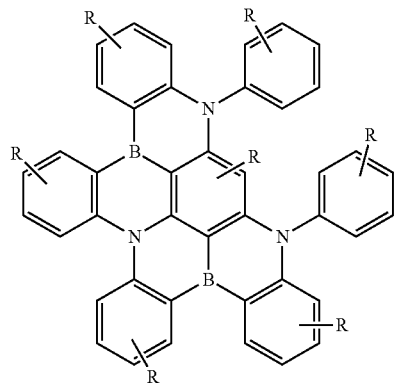

F-2
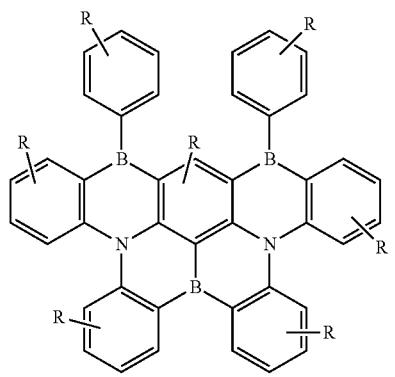

F-3
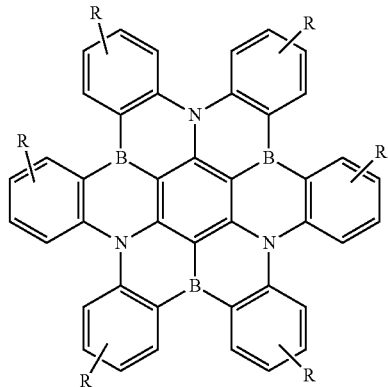

F-4
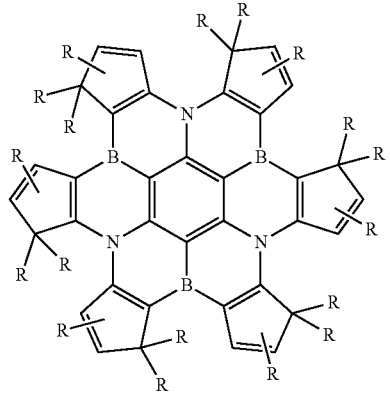

F-5
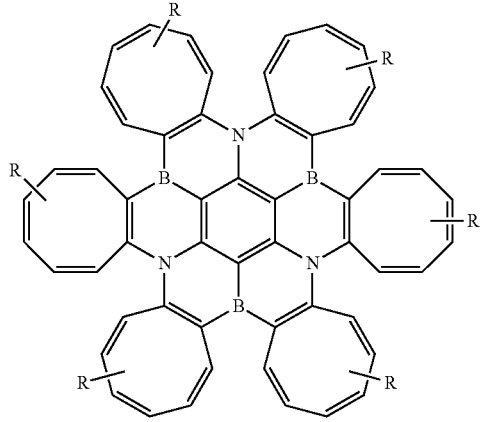

F-6
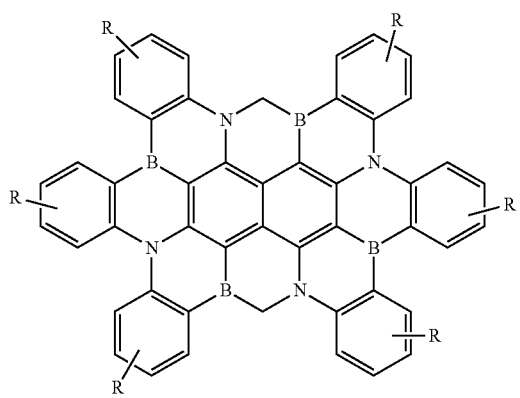

F-7
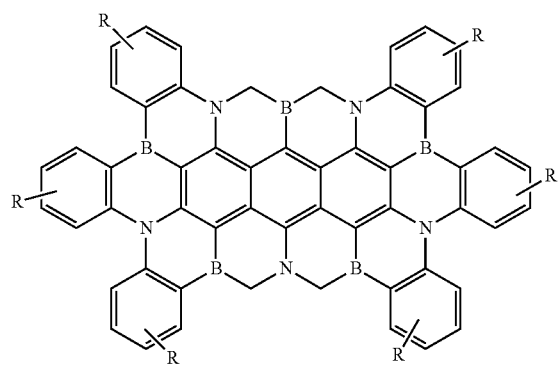
F-8
F-9
F-10
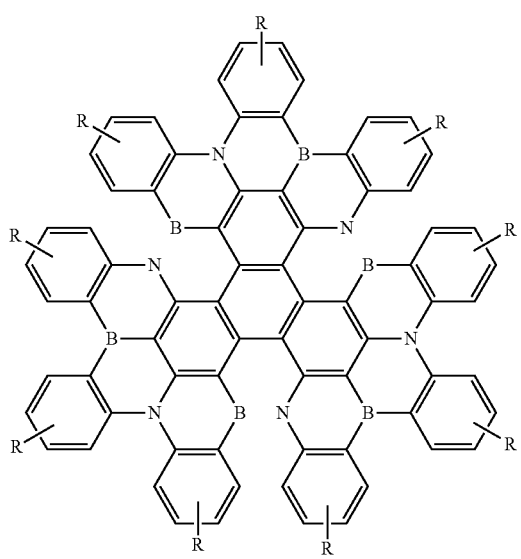
F-11
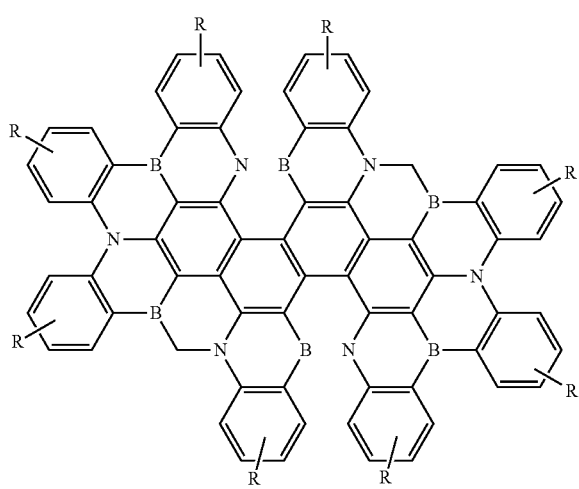
F-12
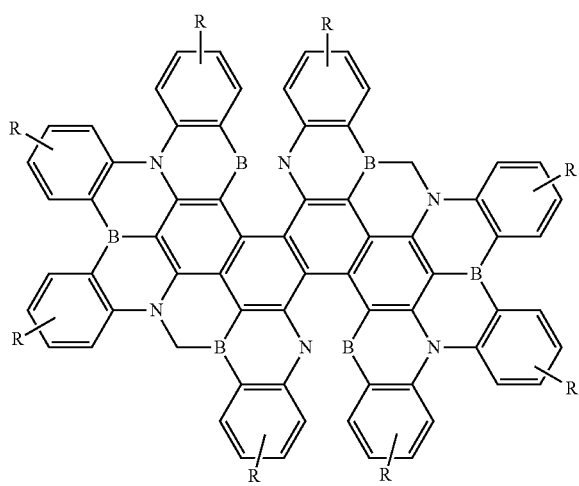

F-13
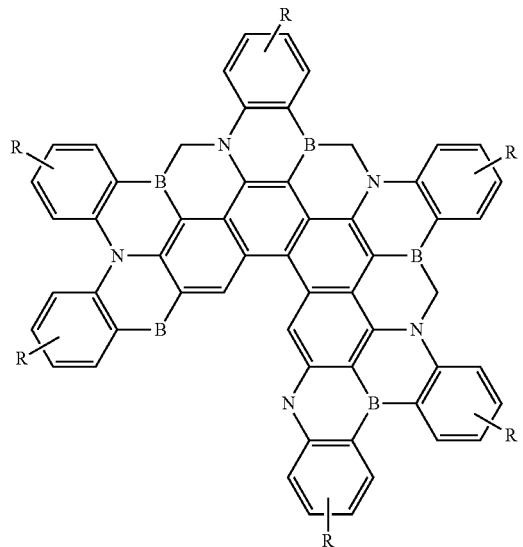
F-14
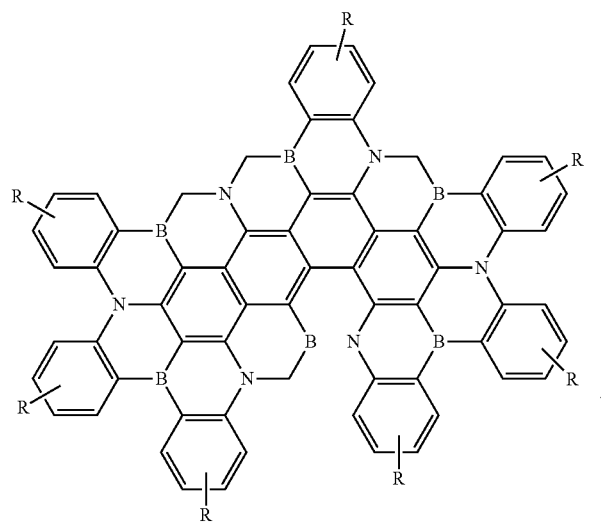
F-15
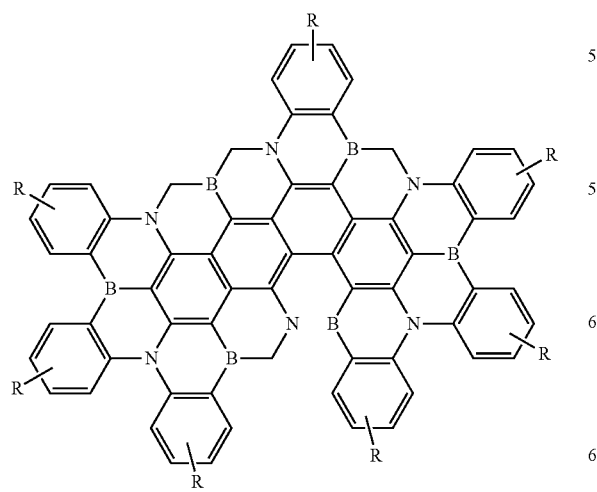
F-16
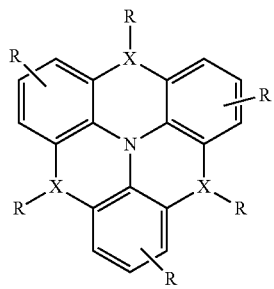
F-17
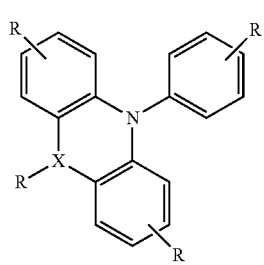
F-18
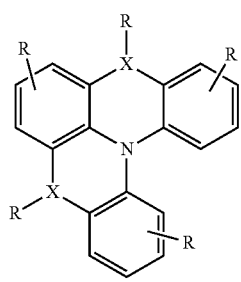
F-19
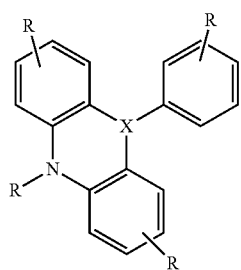
F-20
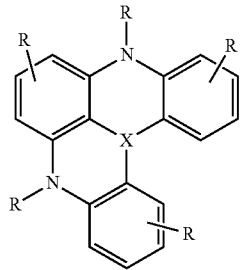

F-21 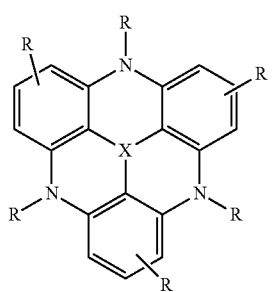
F-22 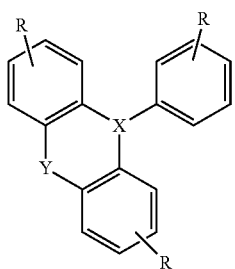
F-23 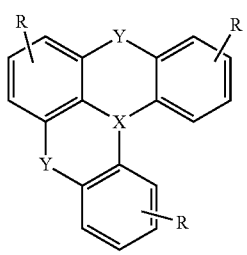
F-24 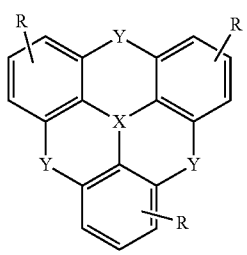
F-25 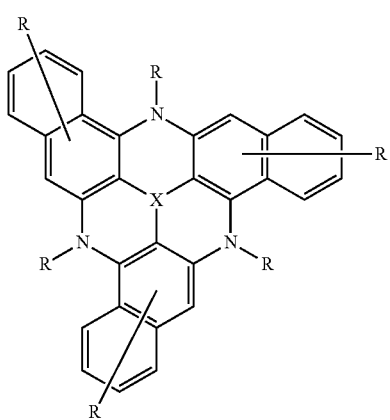
F-26 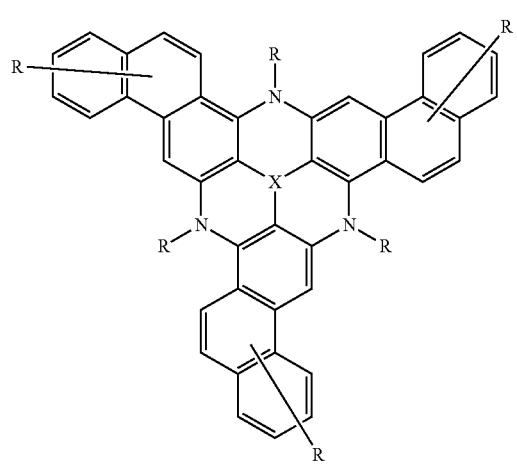
F-27 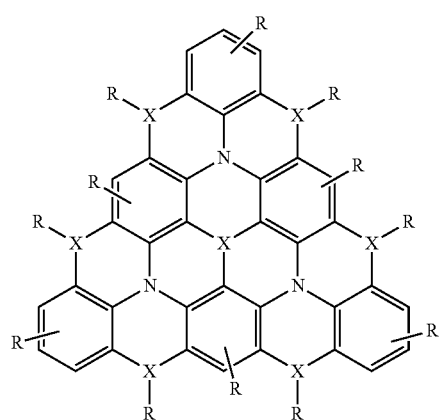
F-28 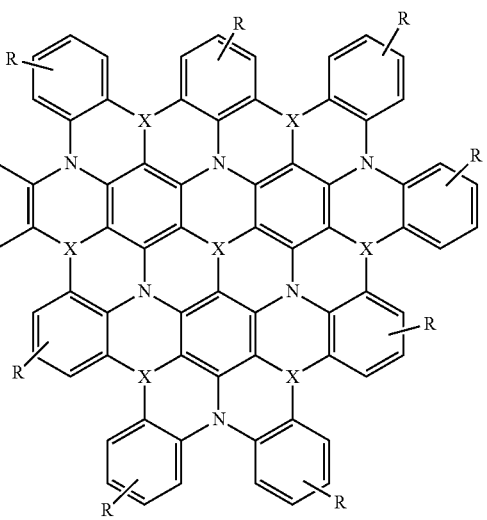

-continued

F-29

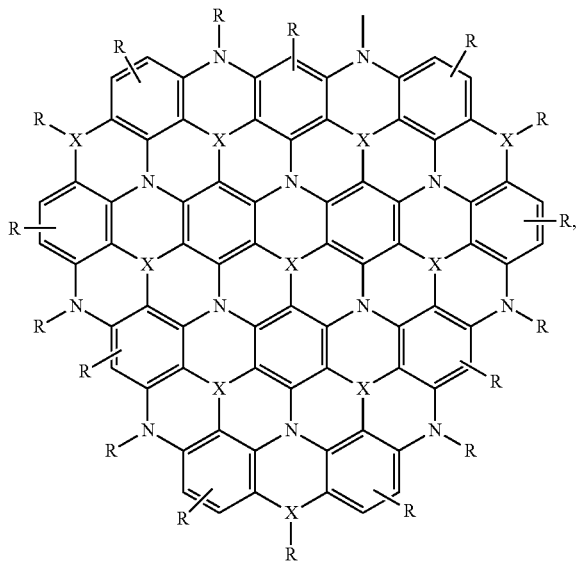

where R is individually and independently selected from one or more of hydrogen, halogen, cyano, $C_1$-$C_{10}$ alkyl, $C_2$-$C_6$ alkenyl, $C_1$-$C_6$ alkoxy or thioalkoxy, $C_6$-$C_{30}$ aryl and $C_3$-$C_{30}$ heteroaryl; and Y is independently selected from O, S, and Se.

Preferably, the resonance thermally activated delayed fluorescent material of the present application is a compound having one of the following structure:

M-1

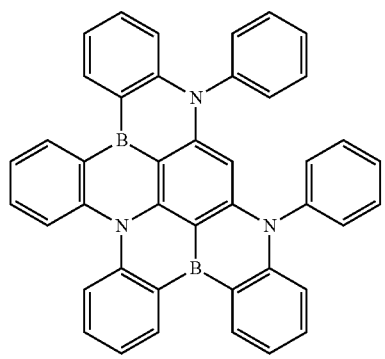

M-2

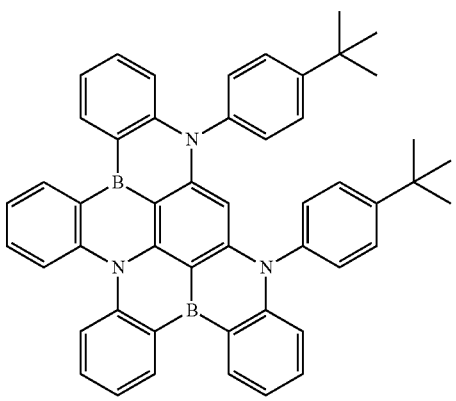

M-3

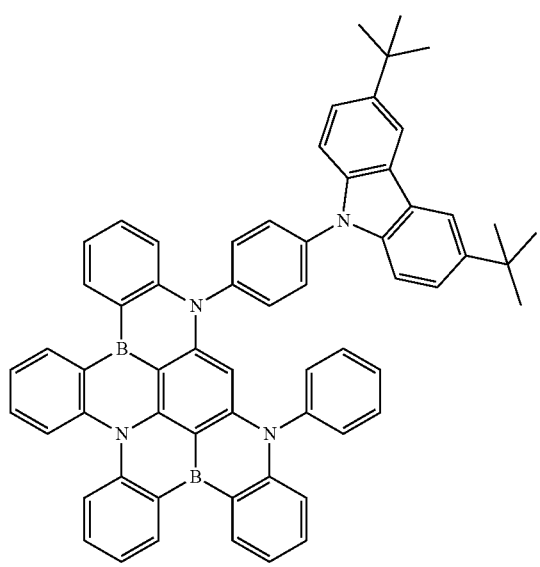

M-4

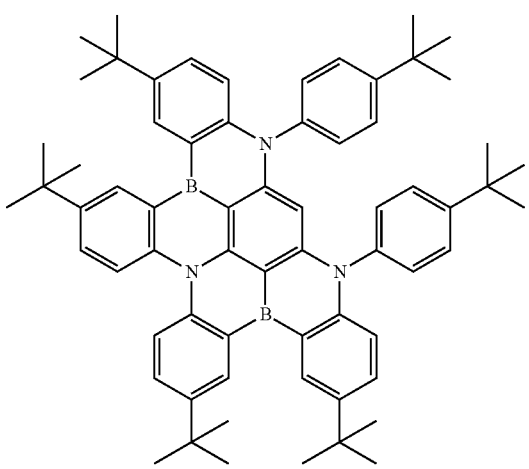

-continued
M-5
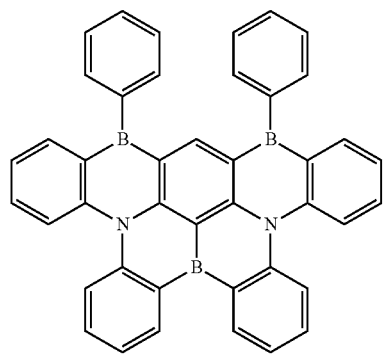
M-6
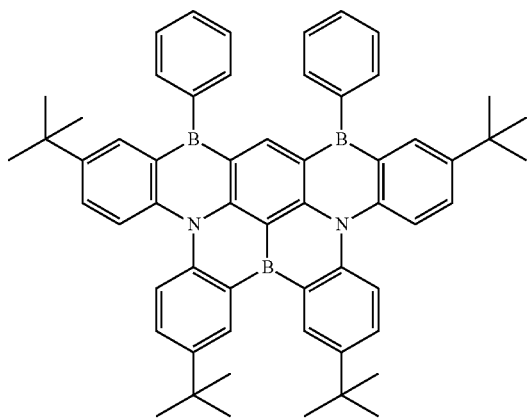
M-7
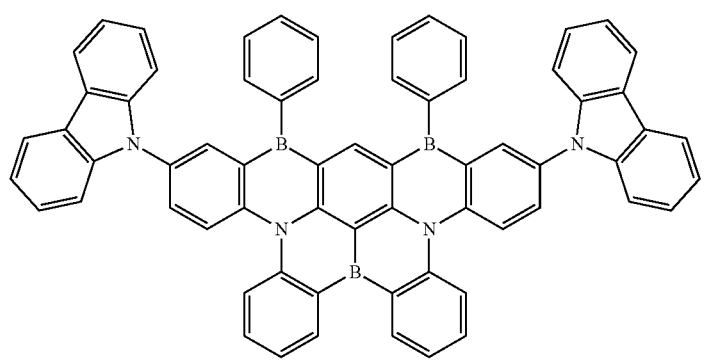
M-8
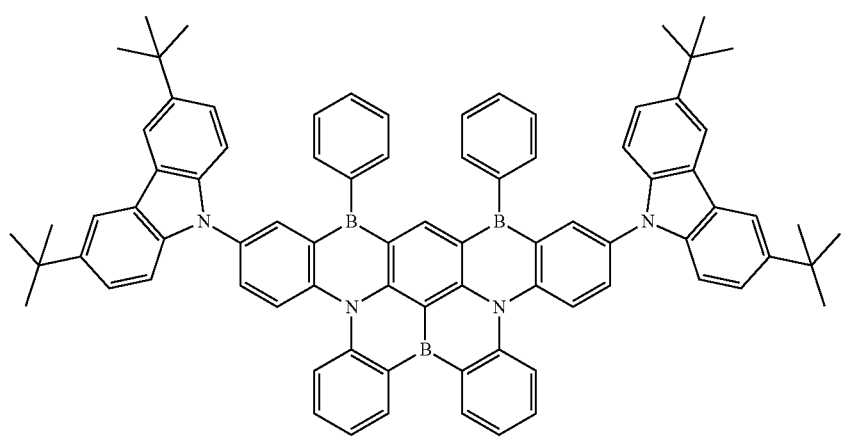

-continued
M-9
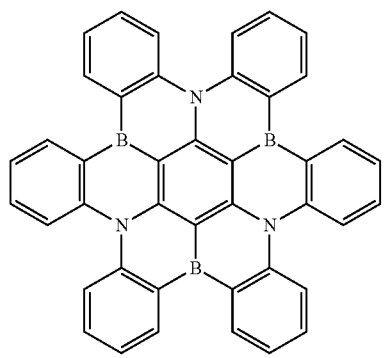
M-10
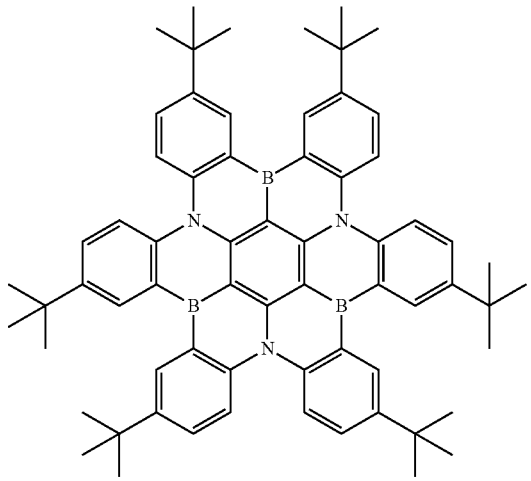
M-11
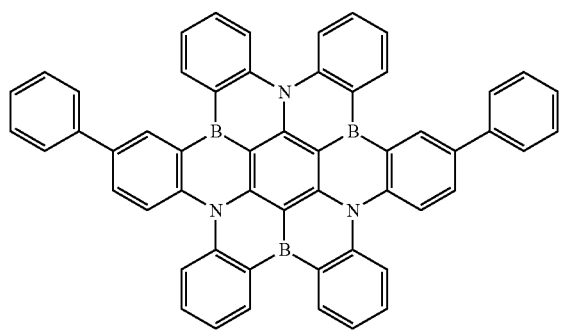
M-12
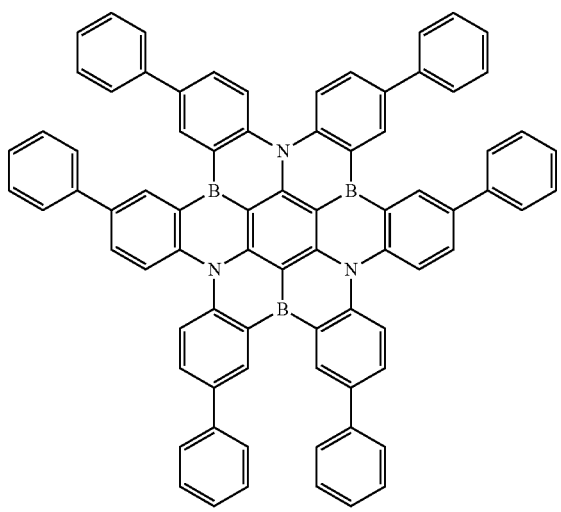
M-13
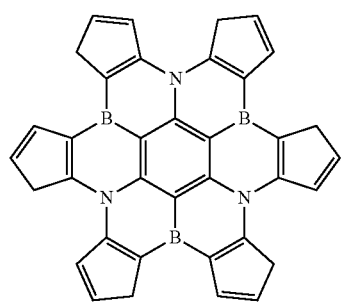
M-14
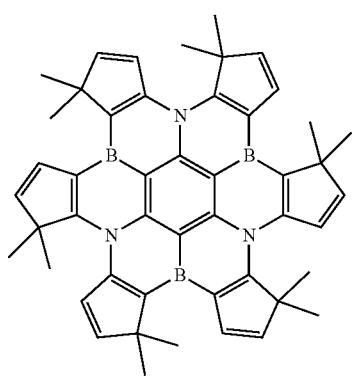

-continued
M-15
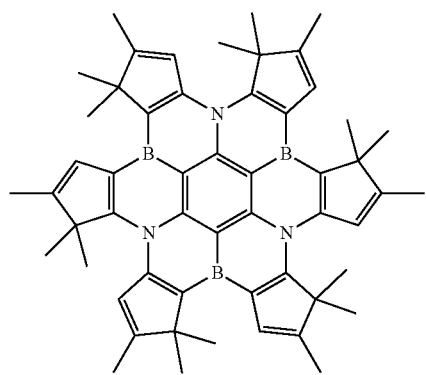
M-16
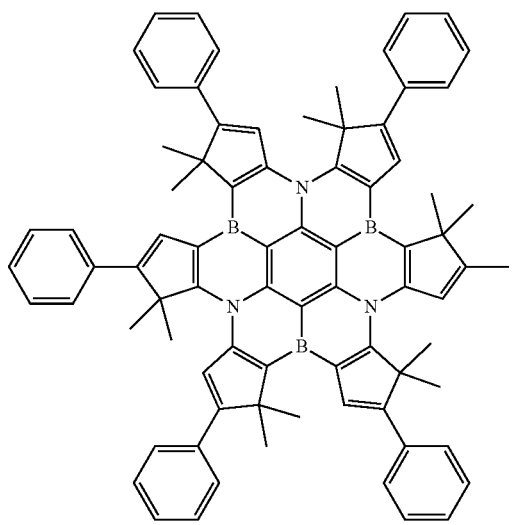
M-17
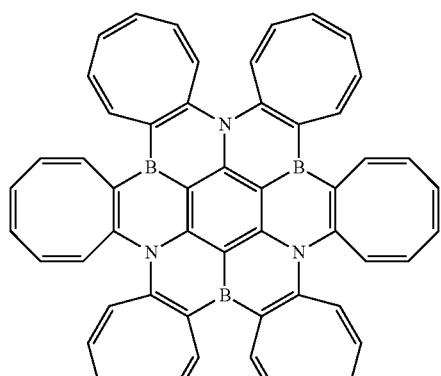
M-18
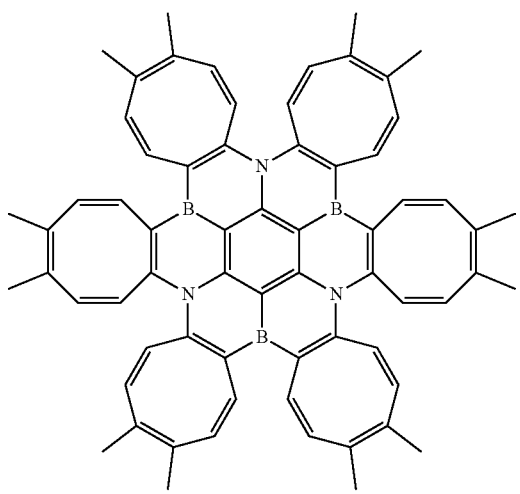
M-19
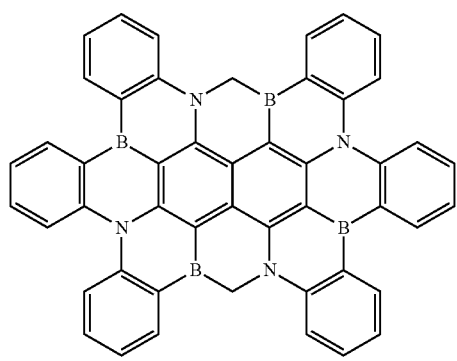
M-20
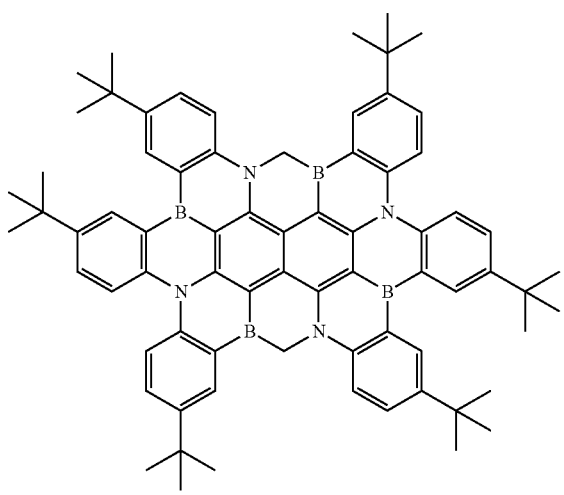

M-21
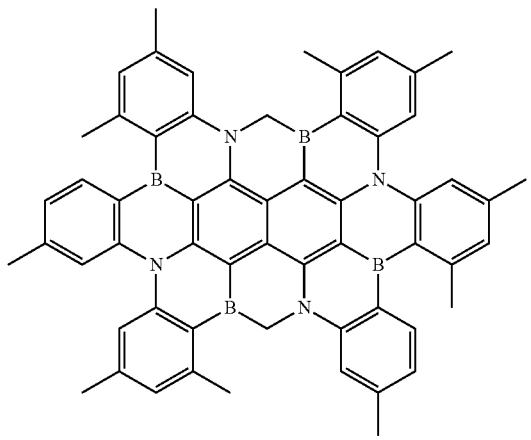
M-22
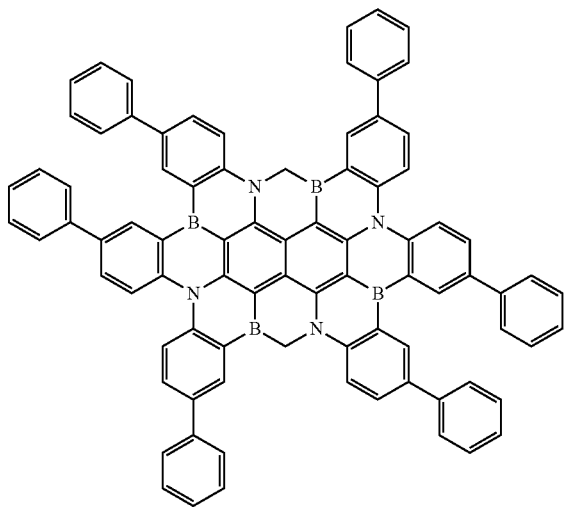
M-23
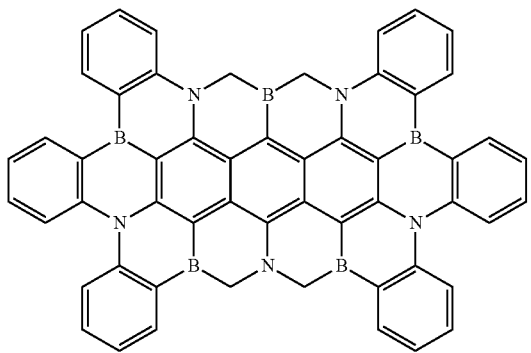
M-24
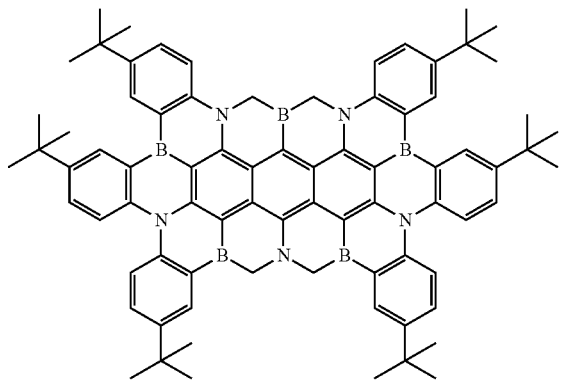
M-25
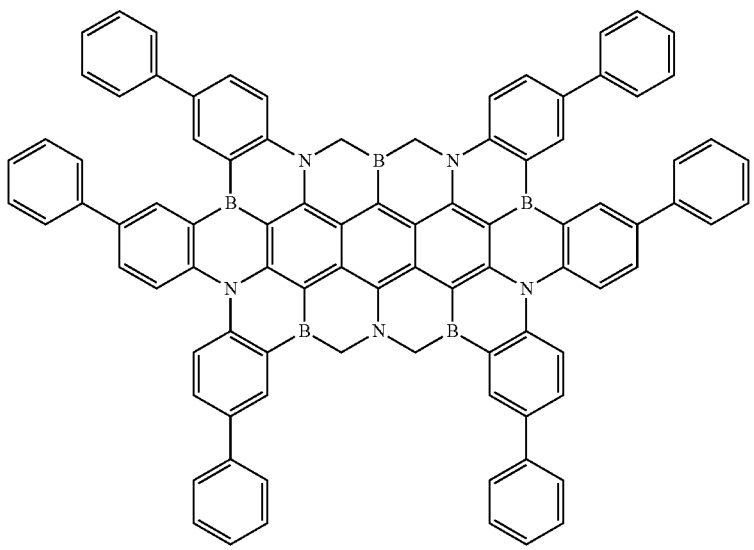

-continued
M-26
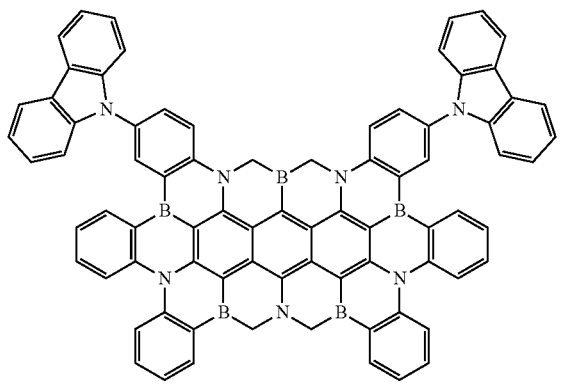
M-27
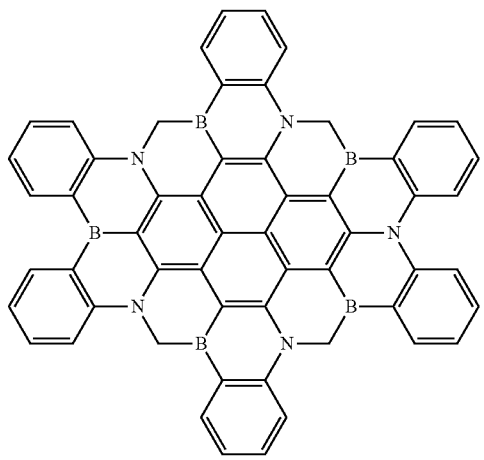
M-28
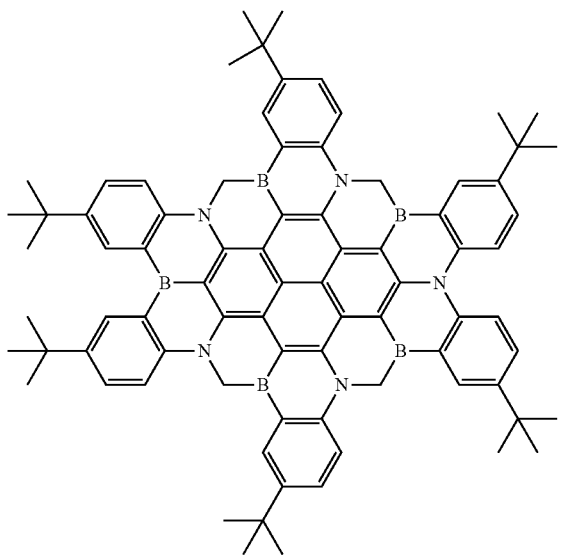
M-29
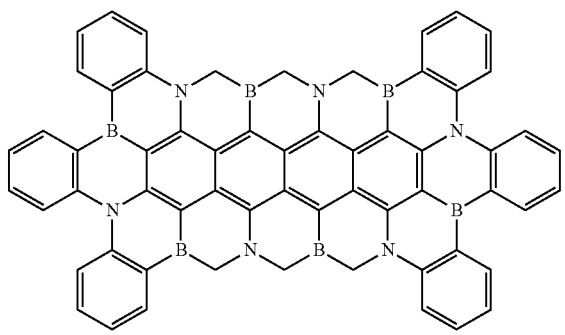
M-30
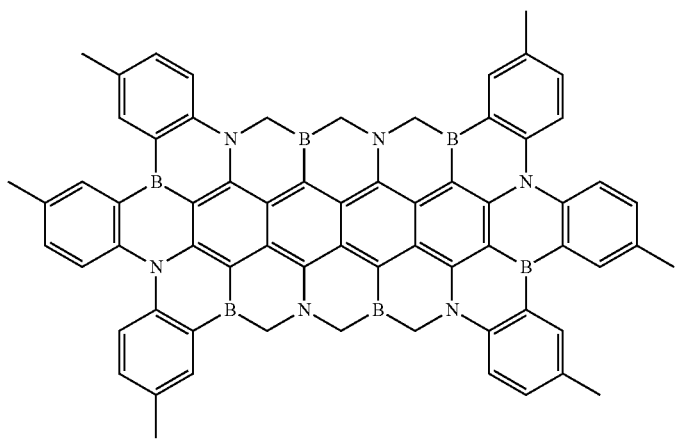

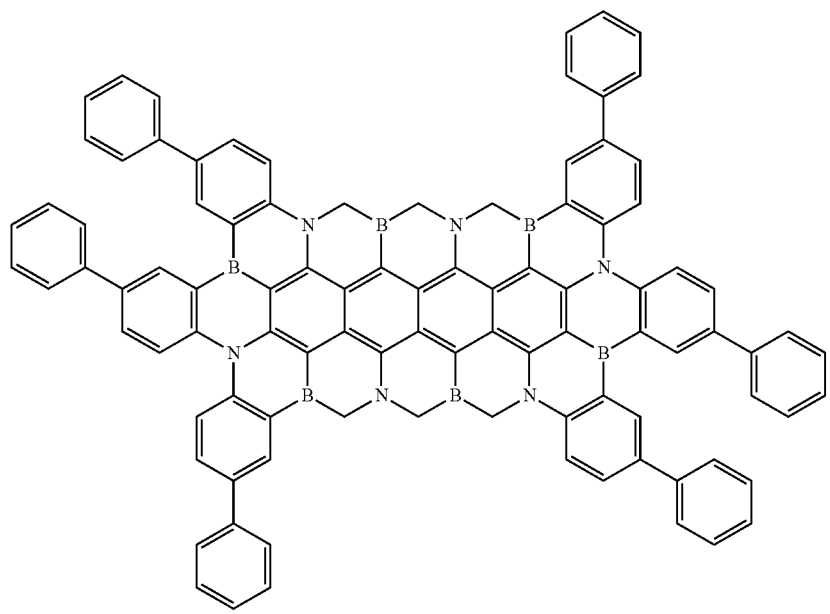
M-31
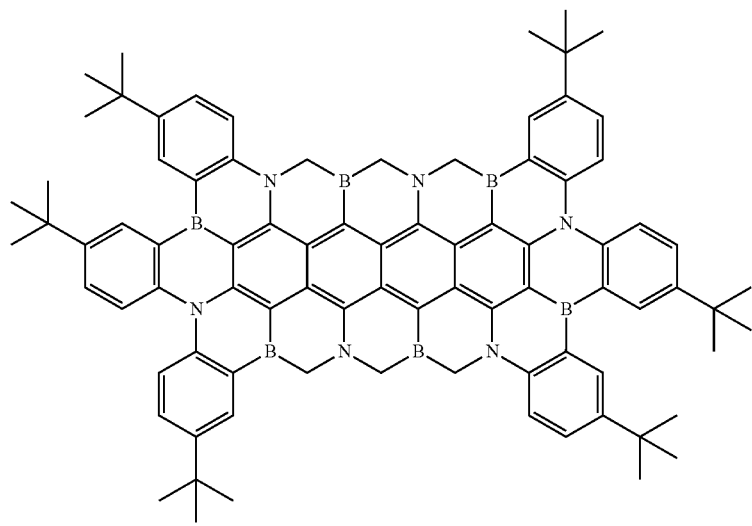
M-32

-continued
M-33
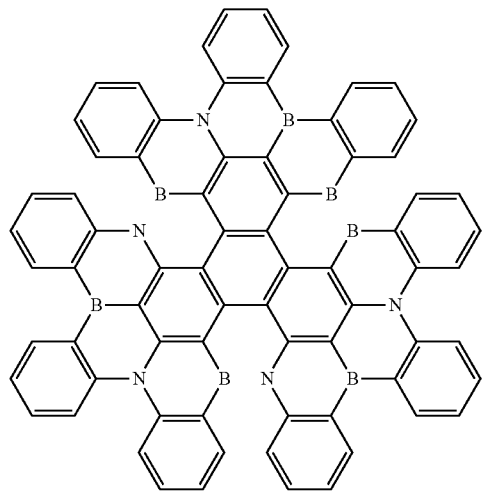
M-34
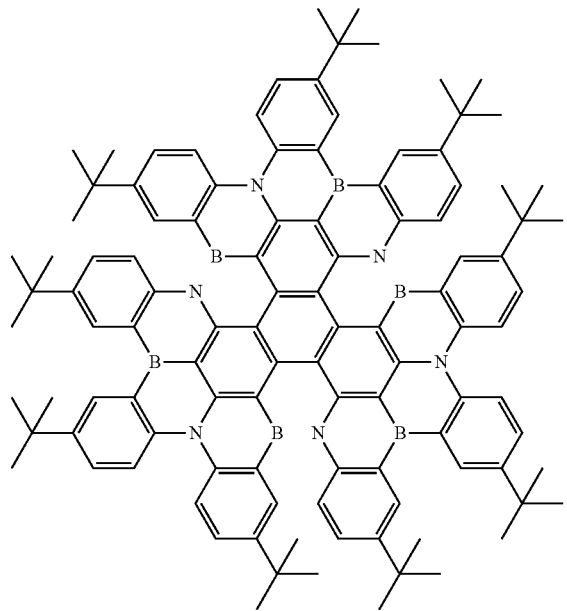
M-35
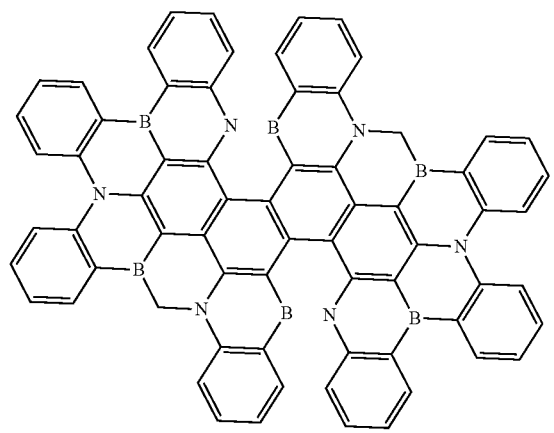
M-36
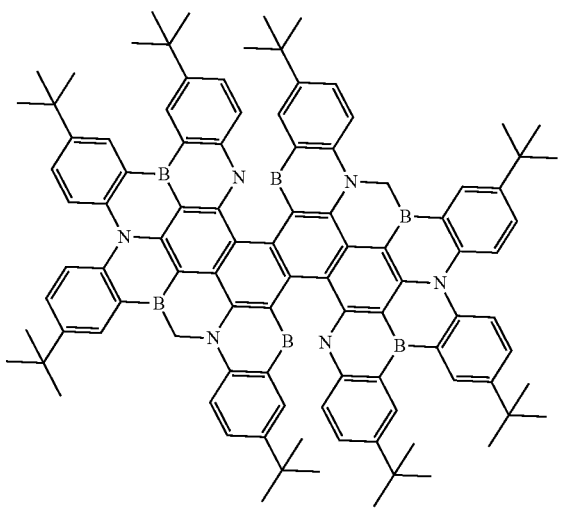
M-37
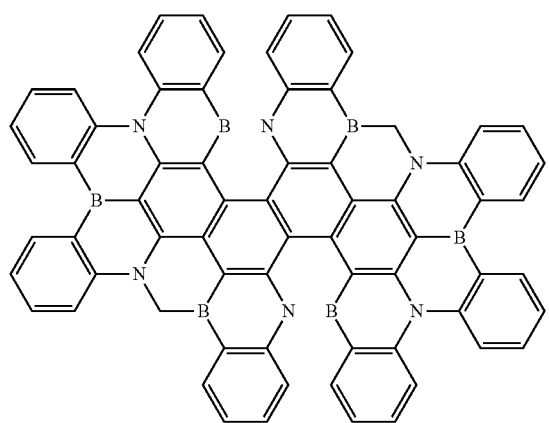
M-38
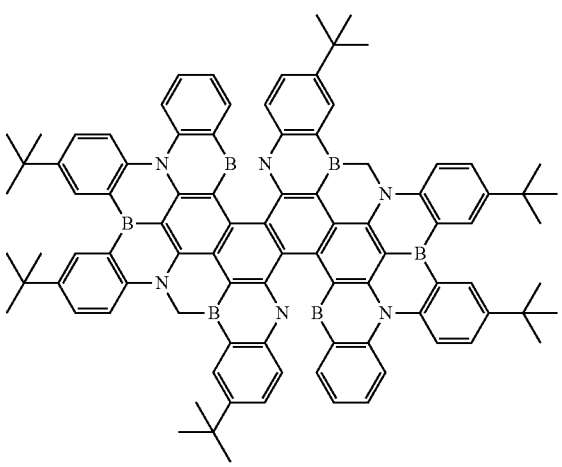

-continued
M-39
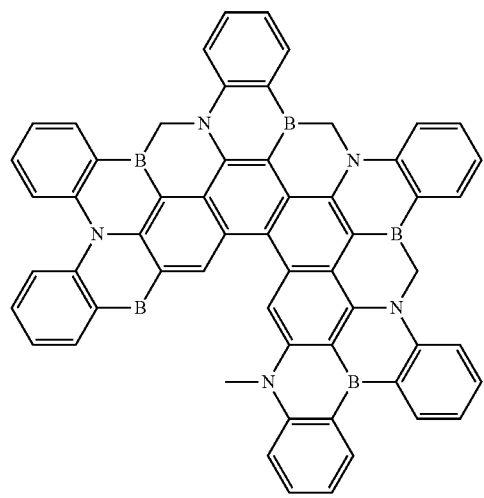
M-40
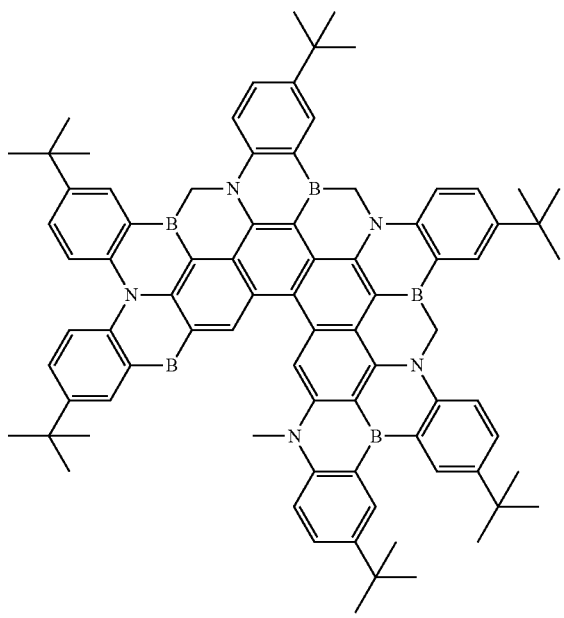
M-41
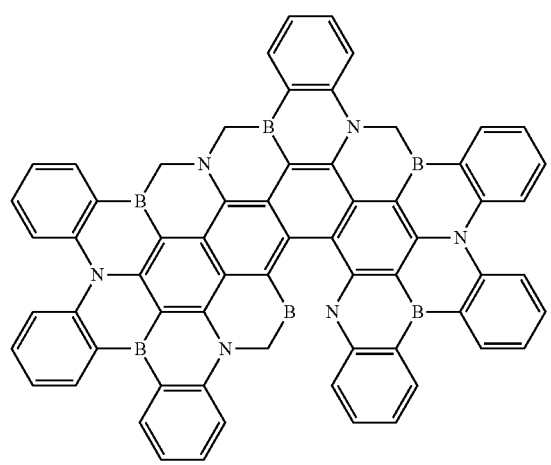
M-42
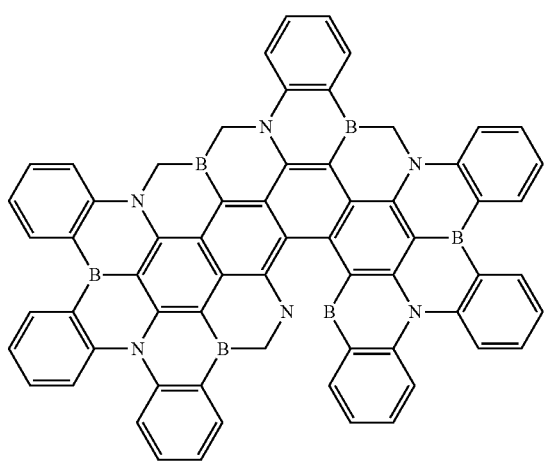
M-43
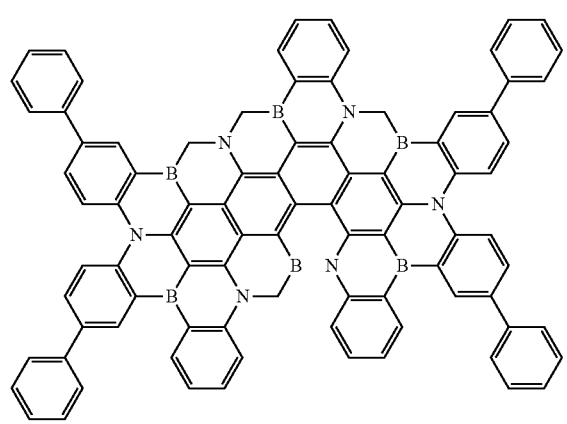
M-44
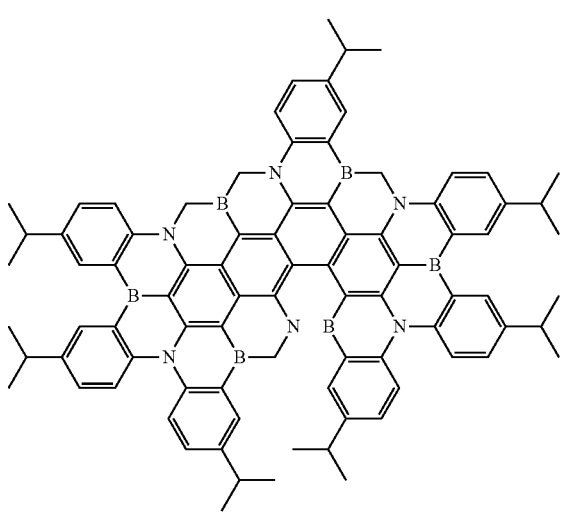

-continued
M-45
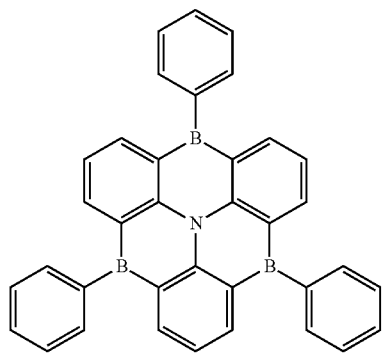
M-46
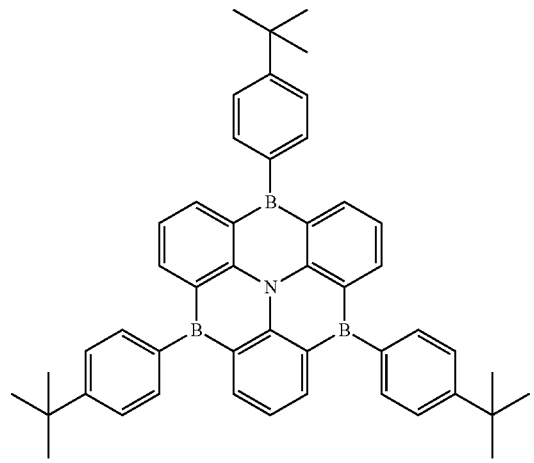
M-47
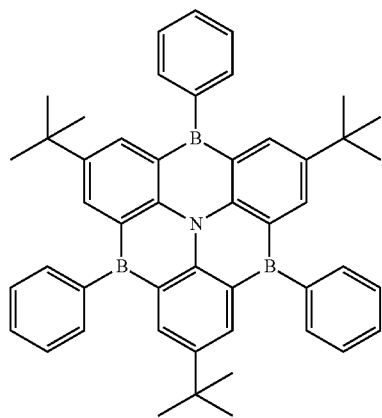
M-48
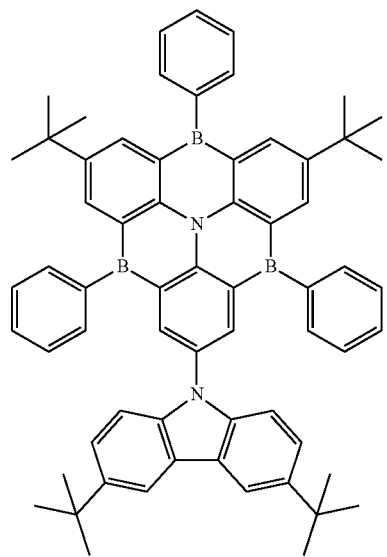
M-49
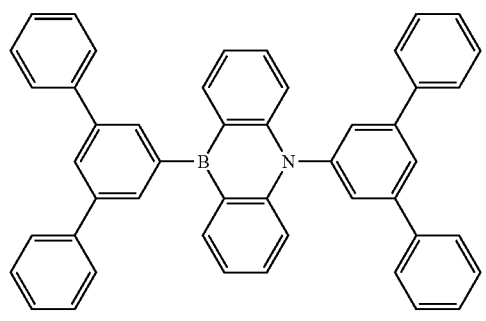
M-50
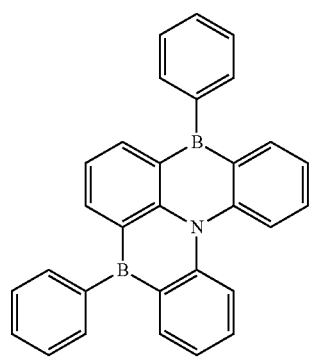

-continued
M-51
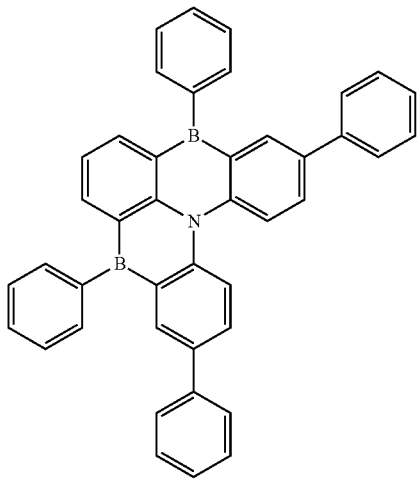
M-52
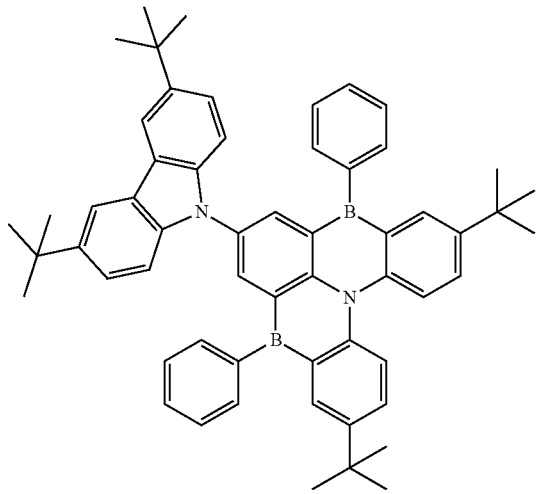
M-53
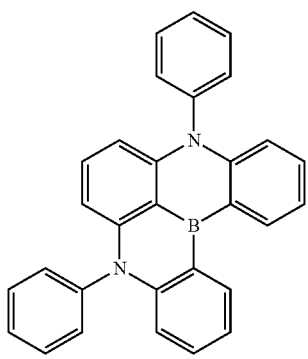
M-54
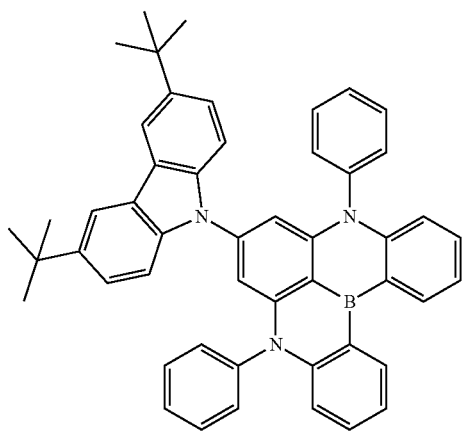
M-55
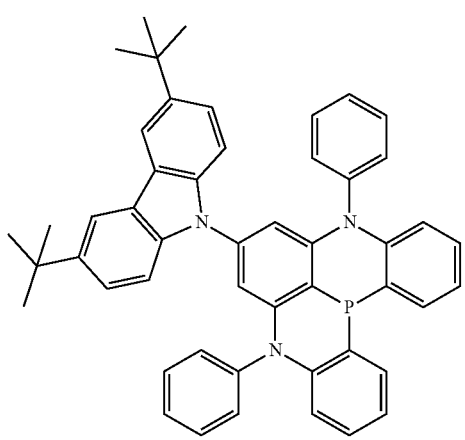
M-56
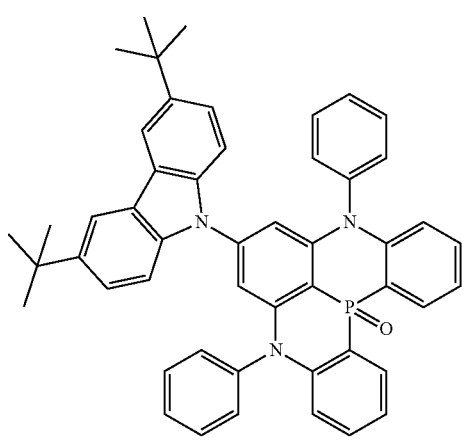

-continued
M-57
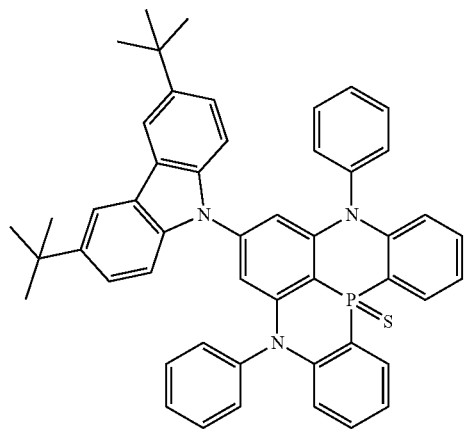
M-58
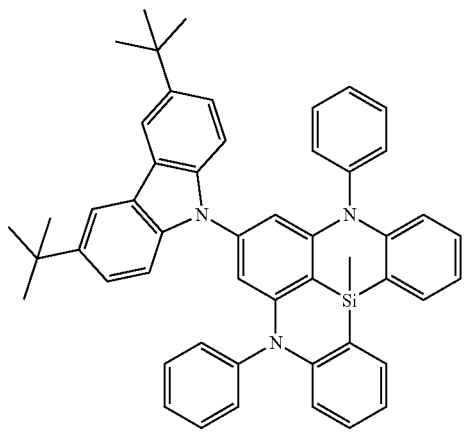
M-59
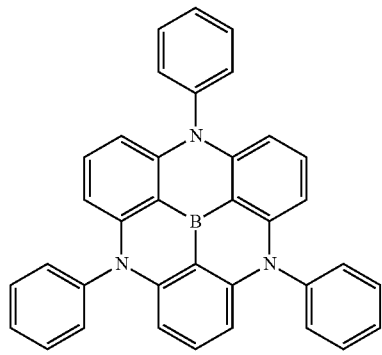
M-60
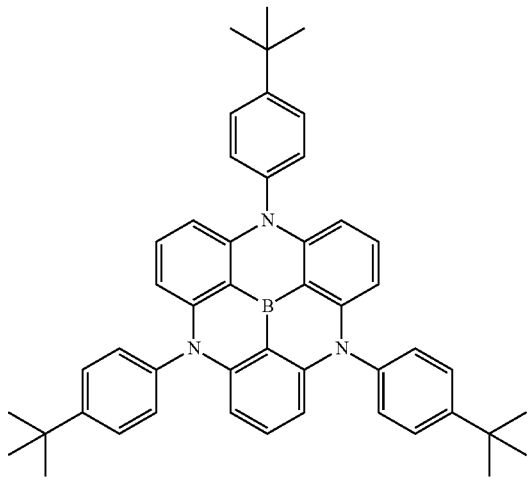
M-61
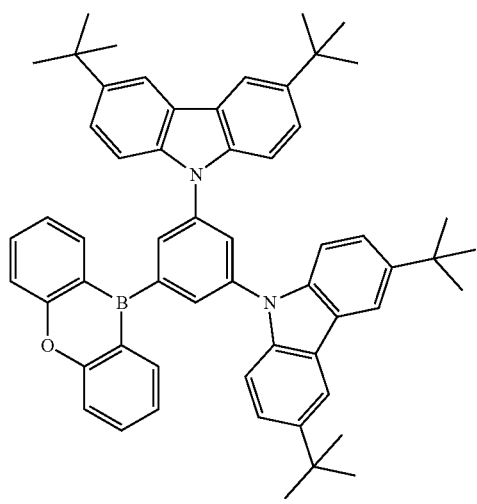
M-62
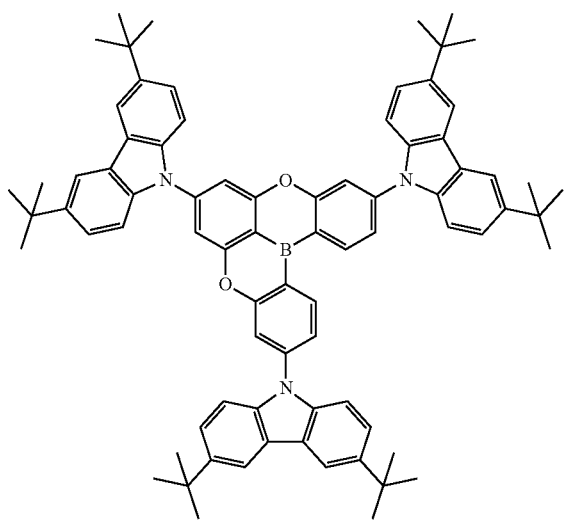

-continued
M-63
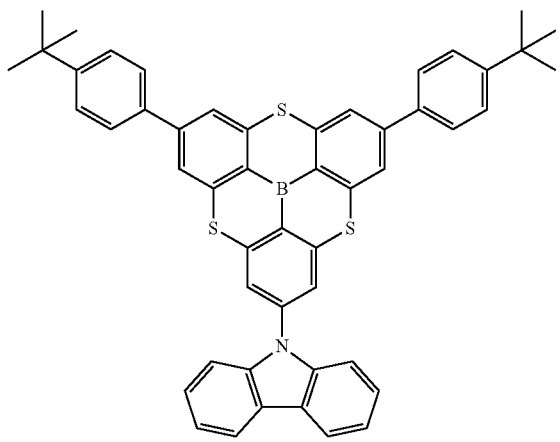
M-64
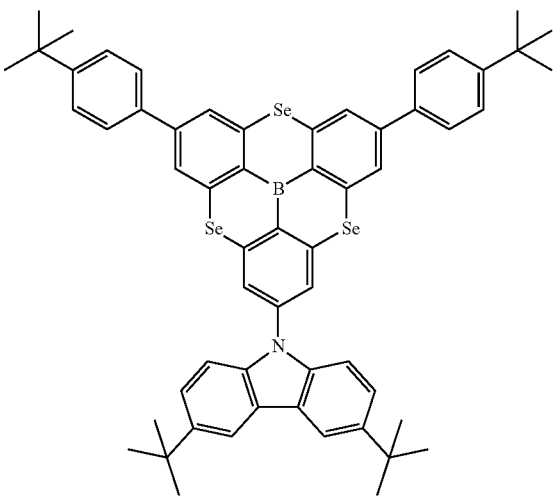
M-65
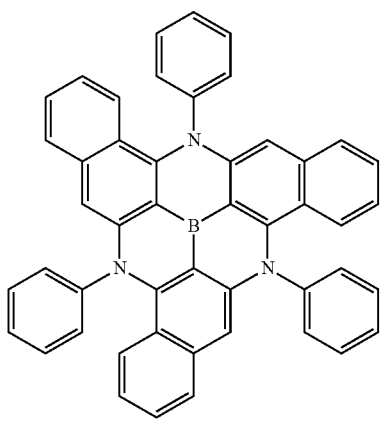
M-66
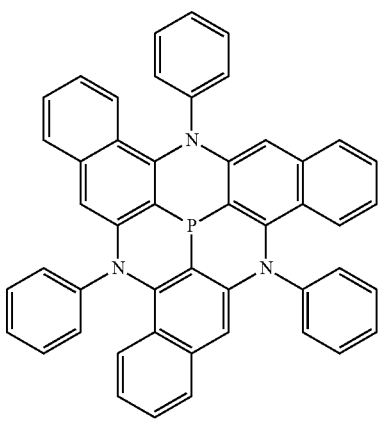
M-67
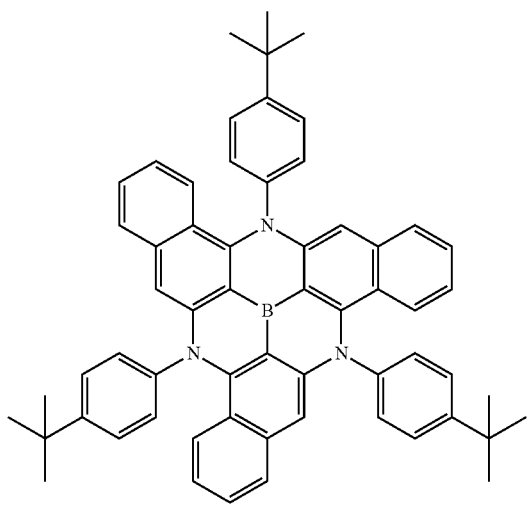
M-68
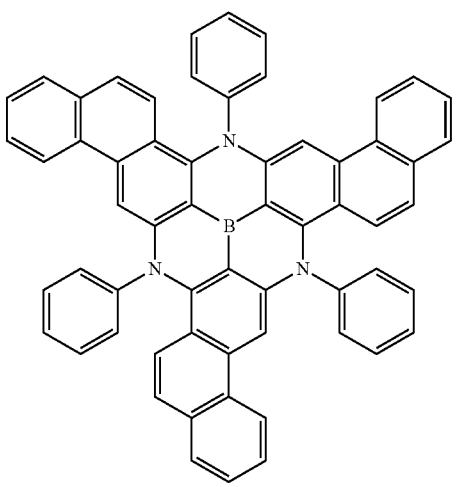

M-69
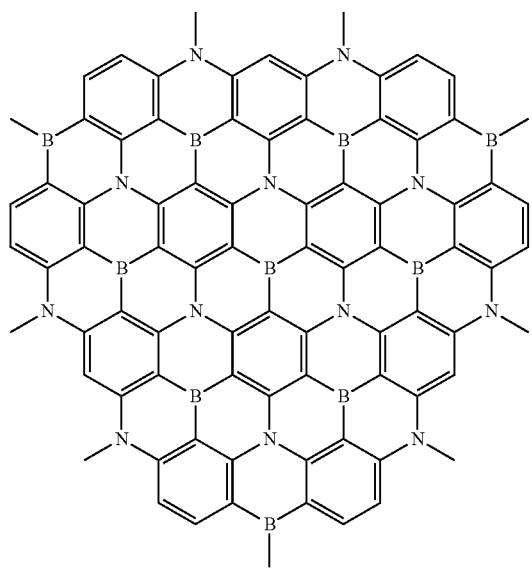
M-70
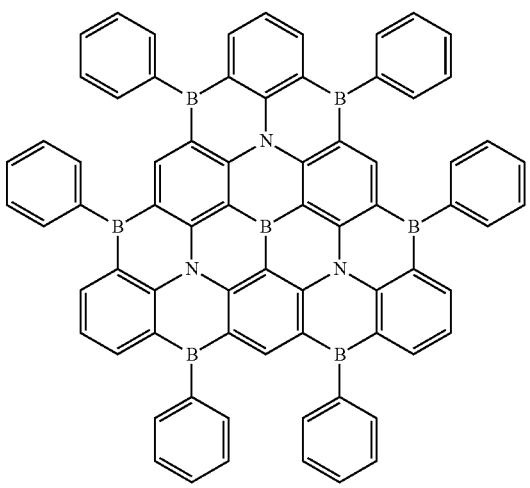
M-71
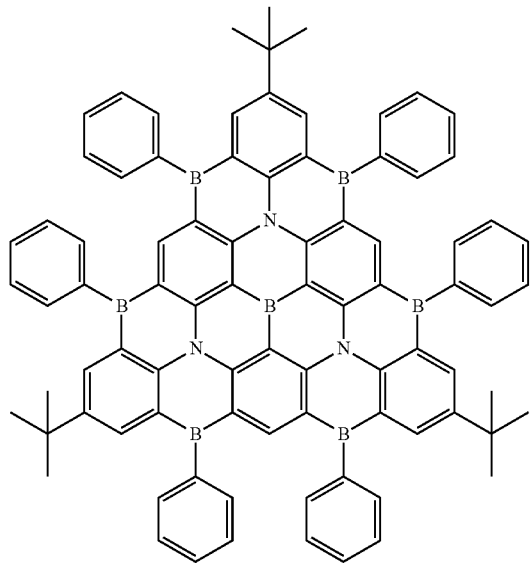
M-72
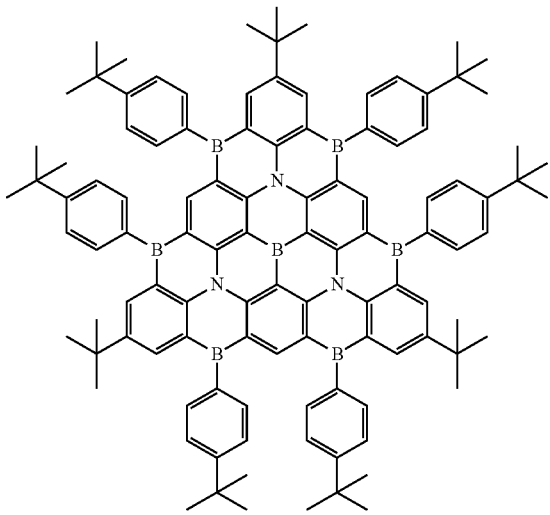
The sensitizer material TADF of the present application is a compound including an electron donating group and an electron accepting group, where the electron donating group can be directly bonded, or be connected through a linking group indicated by La-Lm, to the electron accepting group.
La
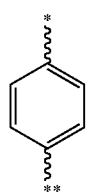
Lb
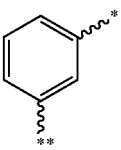
Lc
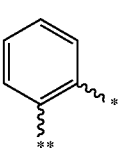

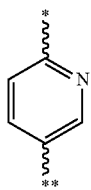
Ld

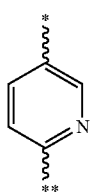
Le

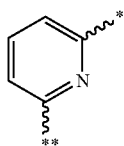
Lf

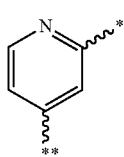
Lg

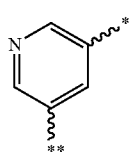
Lh

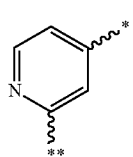
Li

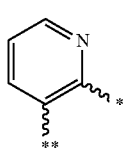
Lj

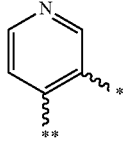
Lk

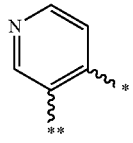
Ll

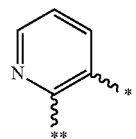
Lm where * indicates the connecting site for the electron donating group, and ** indicates the connecting site for the electron accepting group.

The electron donating group includes at least one of carbazolyl, phenothiazinyl, phenoxazinyl, indolocarbazolyl, diphenylamino, triphenylamino, acridinyl, and phenazinyl; and/or the electron accepting group includes at least one of triazinyl, pyrimidinyl, sulfone, thiazolyl, oxazolyl, oxadiazolyl, thiadiazolyl, triazolyl, boron, pyrazinyl, carbonyl, cyano, and pyridyl.

Further, the electron donating group is selected from at least one of the following groups:

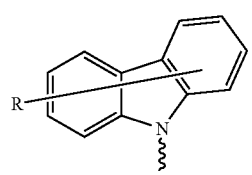
D1

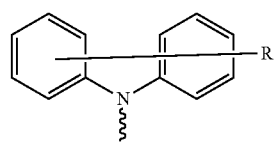
D2

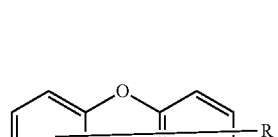
D3

D4

D5

-continued
D6
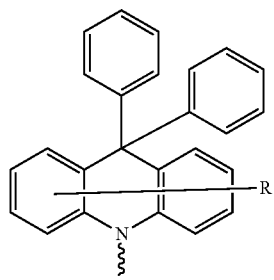
D7
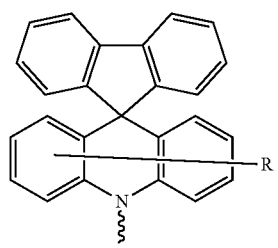
D8
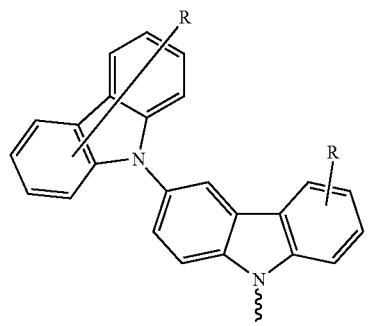
D9
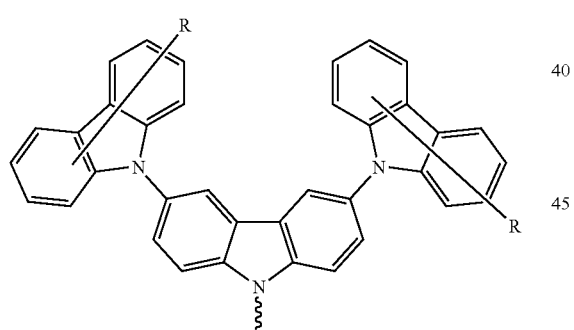
D10
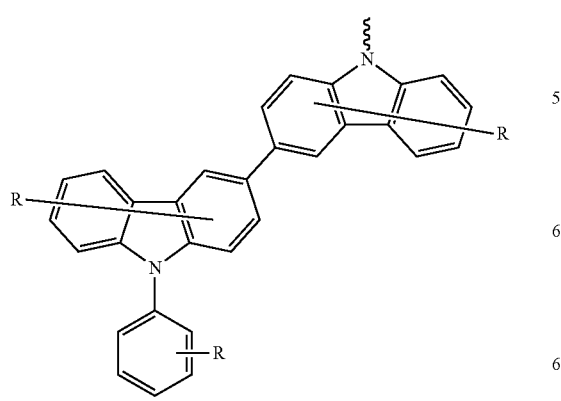
-continued
D11
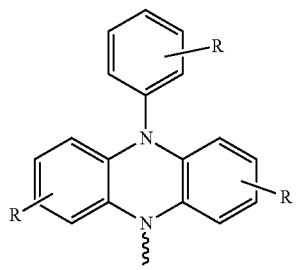
D12
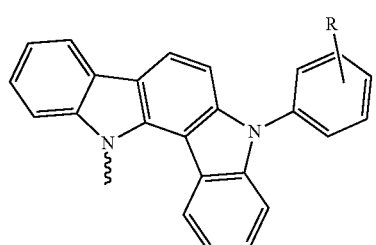
D13
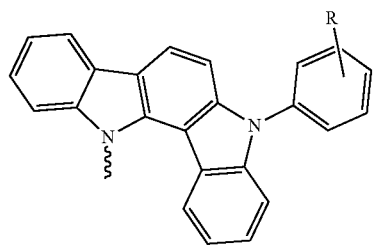
D14
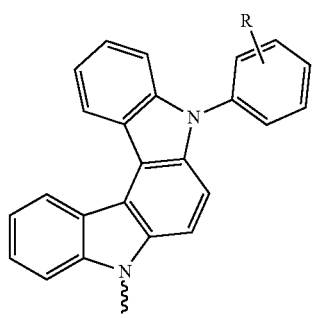
D15

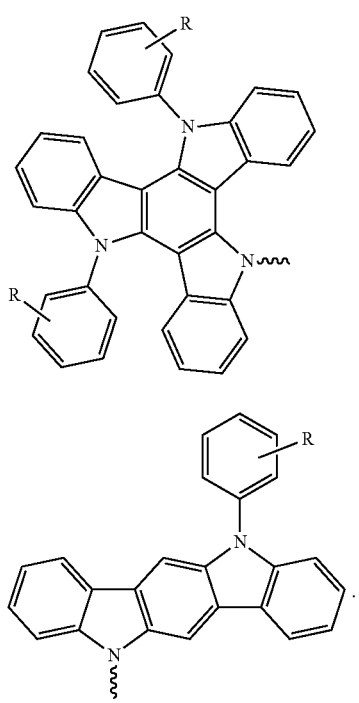
and/or the electron accepting group is selected from at least one of the following groups:
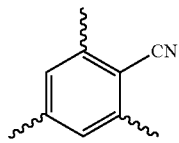 A1
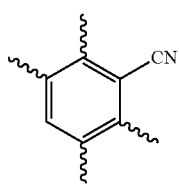 A2
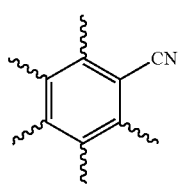 A3
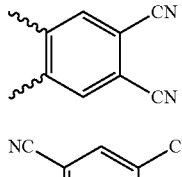 A4
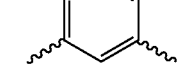 A5
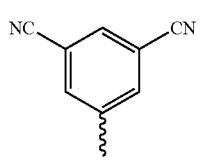 A6
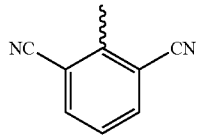 A7
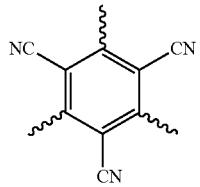 A8
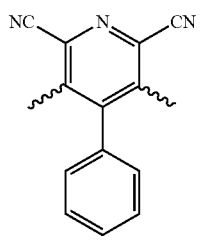 A9
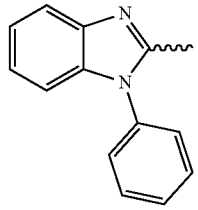 A10
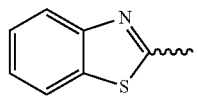 A11
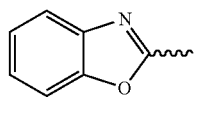 A12
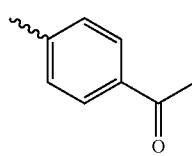 A13
A14

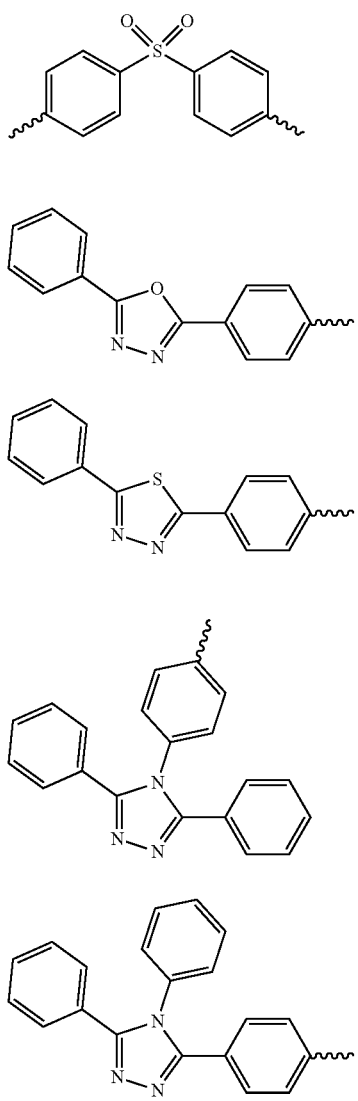
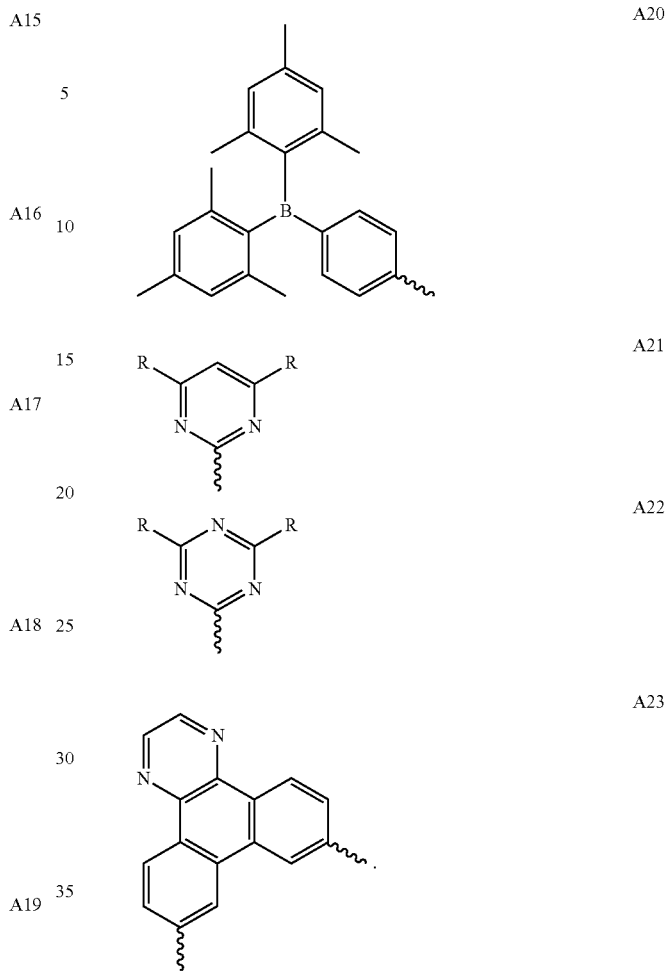
Specifically, in order to achieve reverse intersystem crossing for the sensitizer easier, a TADF material whose energy level difference of the singlet state and triplet state is ≤0.3 eV may be preferably selected as a sensitizer. Preferably, the TADF material of the present application may be a compound having one of the following structures:
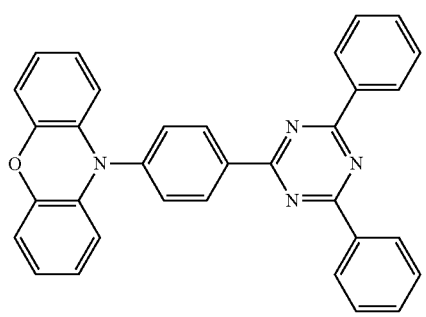
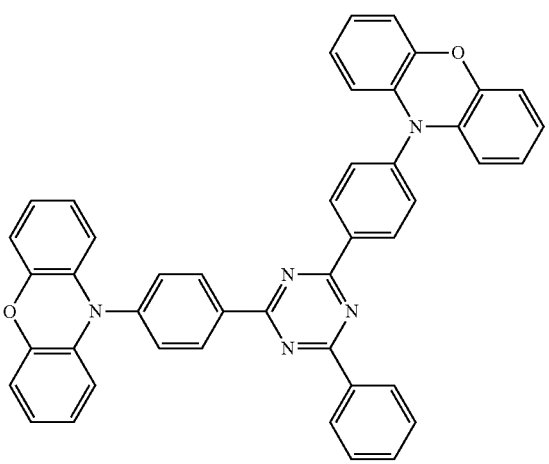

-continued
T-3
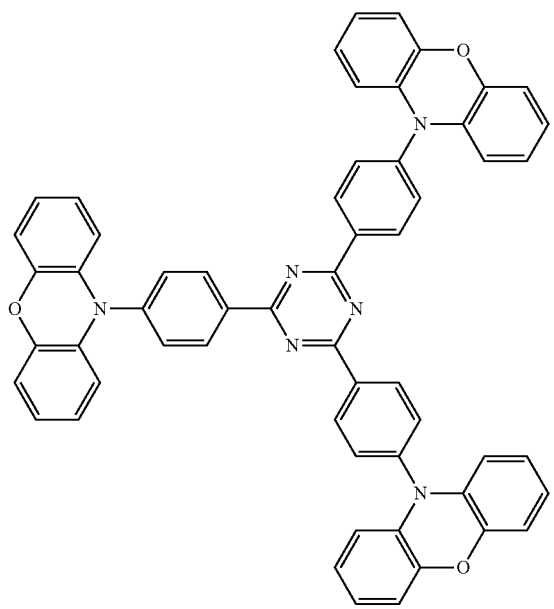
T-4
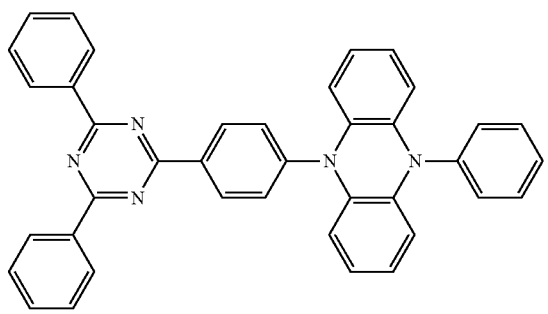
T-5
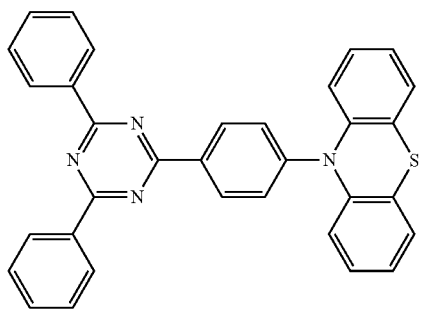
T-6
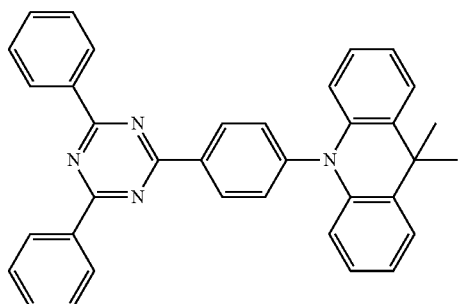
T-7
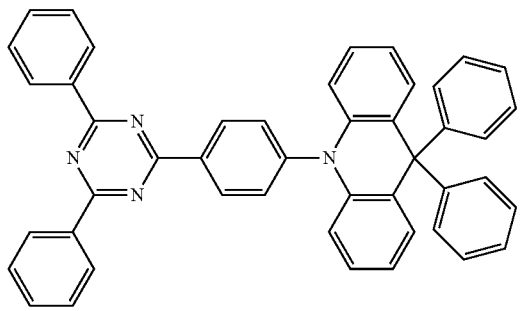
T-8
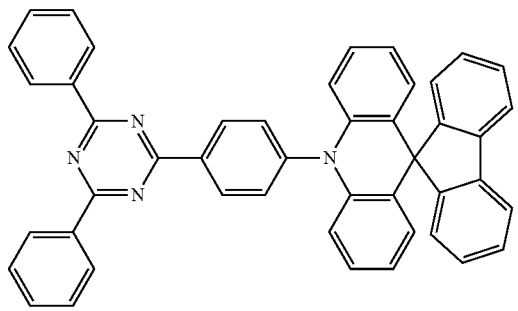
T-9
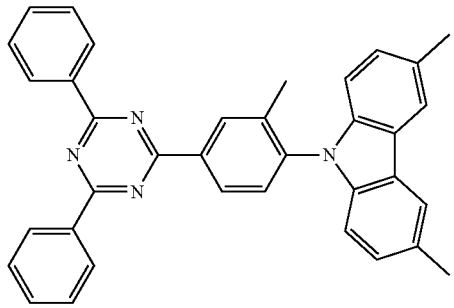
T-10
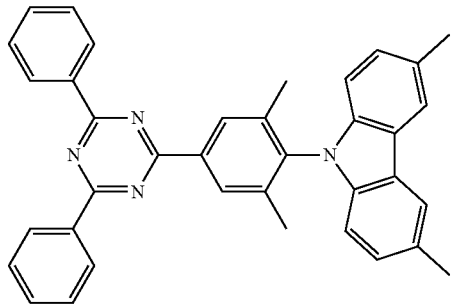

-continued
T-11
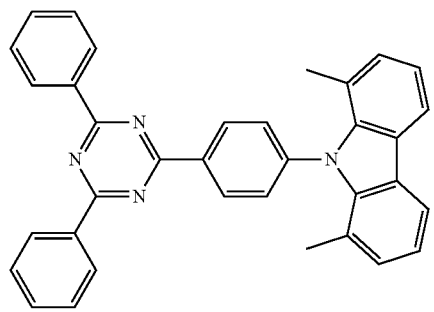
T-12
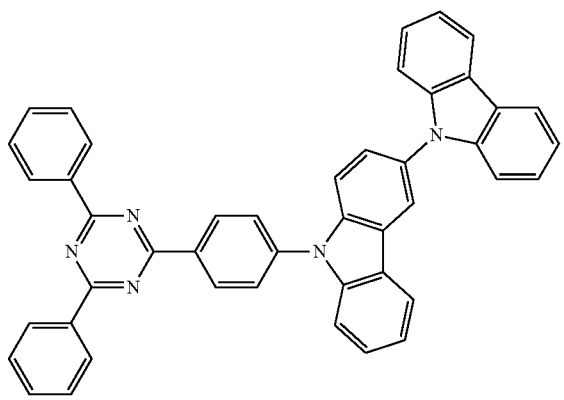
T-13
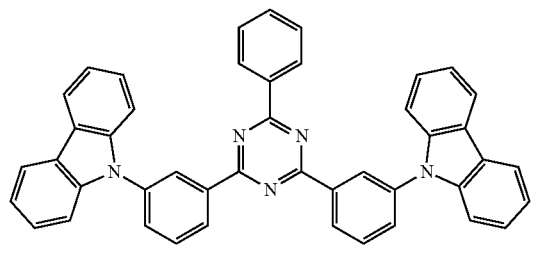
T-14
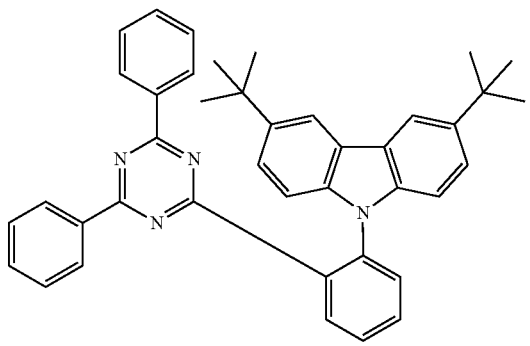
T-15
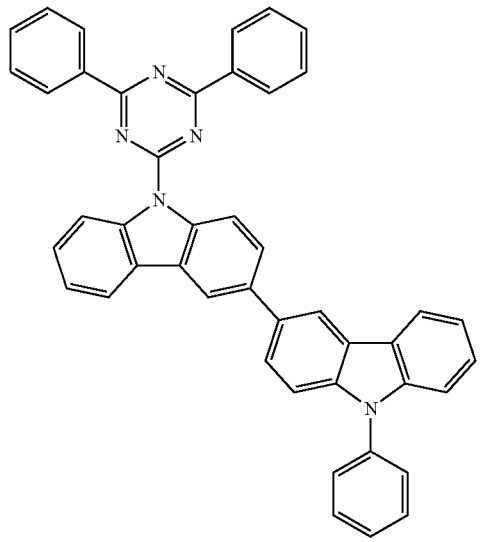
T-16
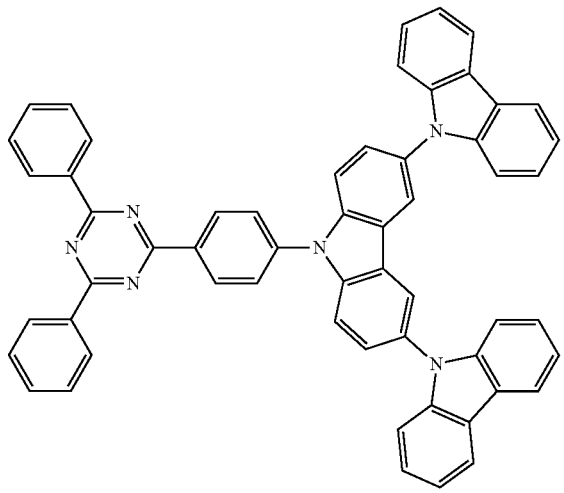

-continued
T-17
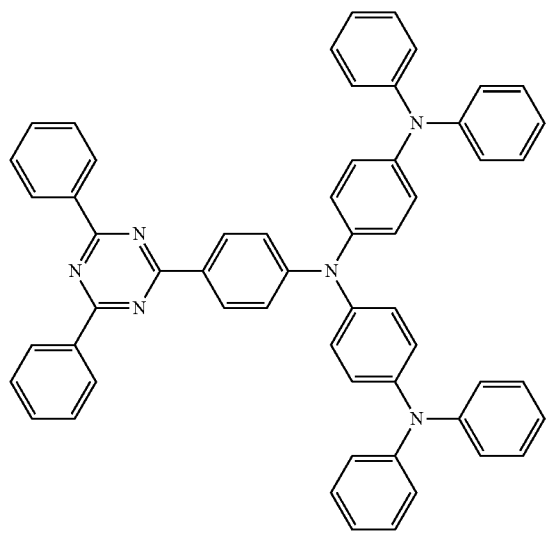
T-18
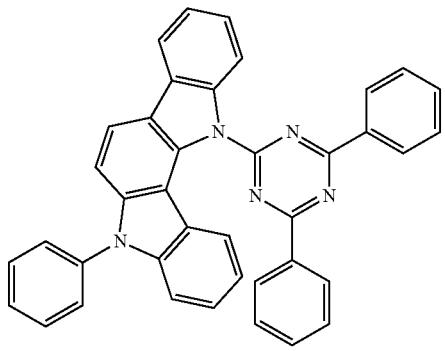
T-19
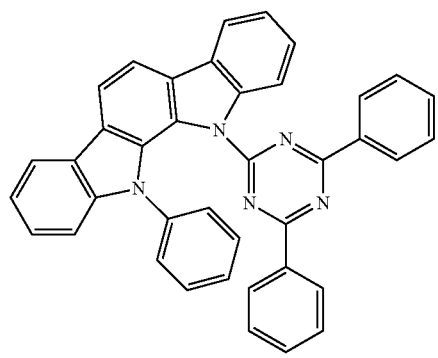
T-20
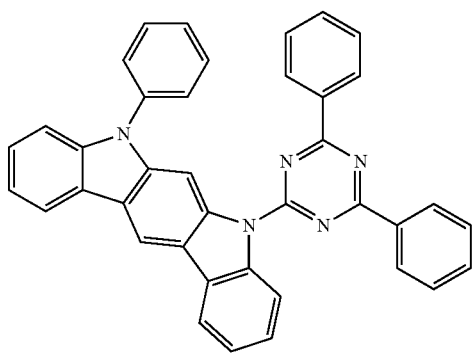
T-21
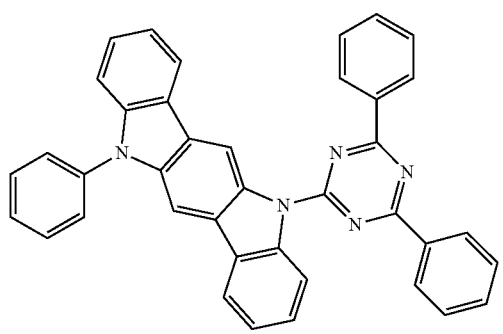
T-22
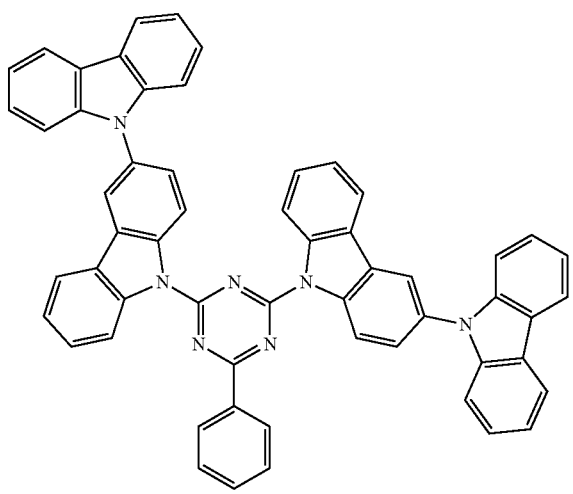

-continued
T-23
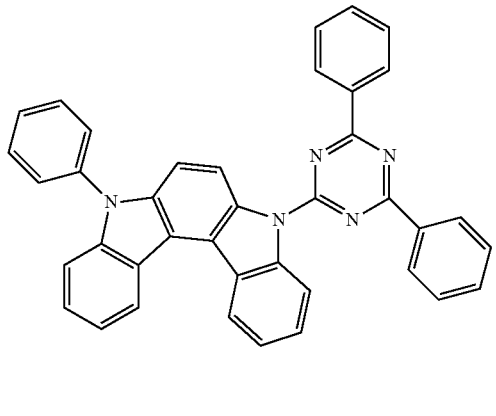
T-24
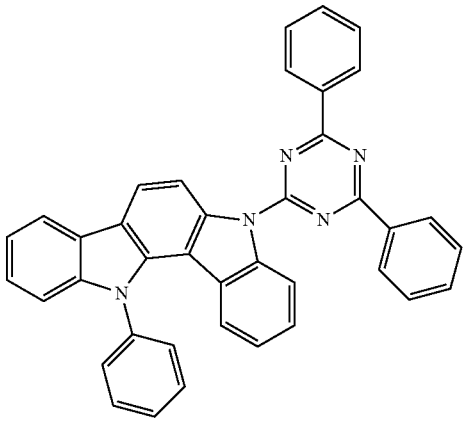
T-25
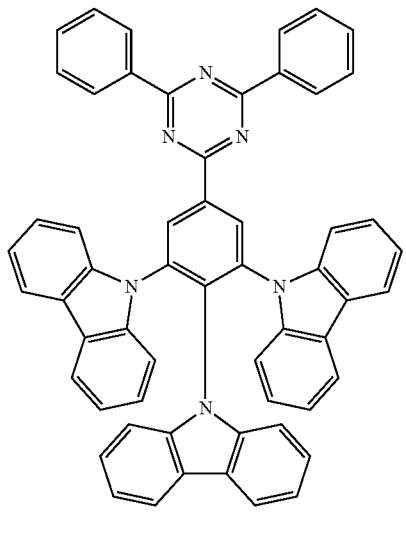
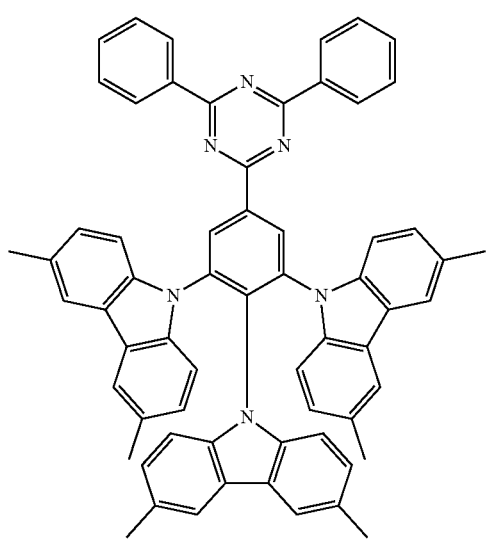
T-27
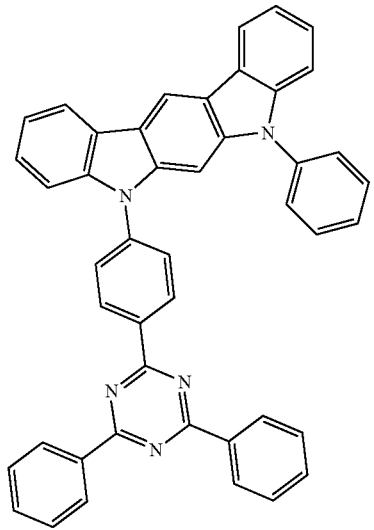
T-28
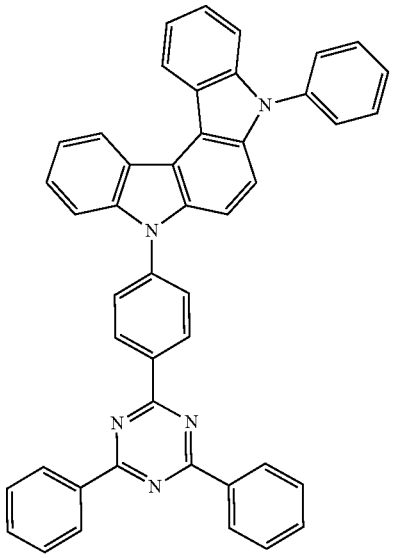

-continued
T-29
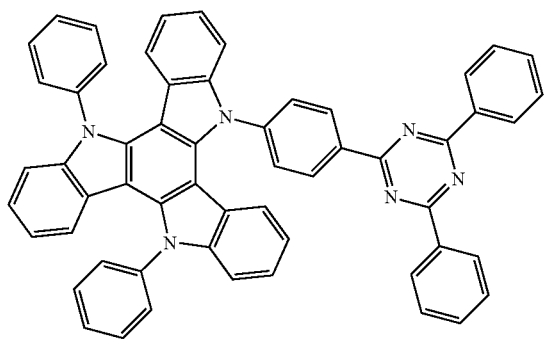
T-30
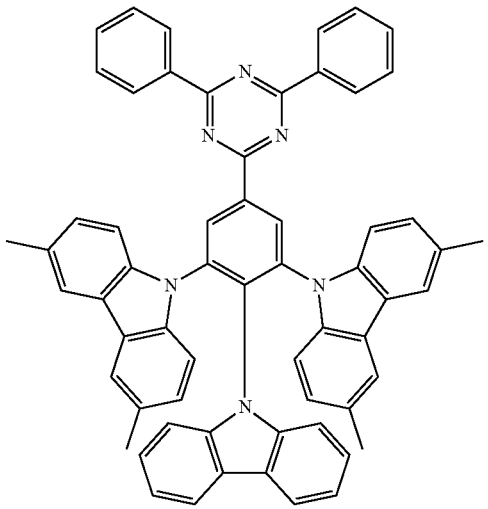
T-31
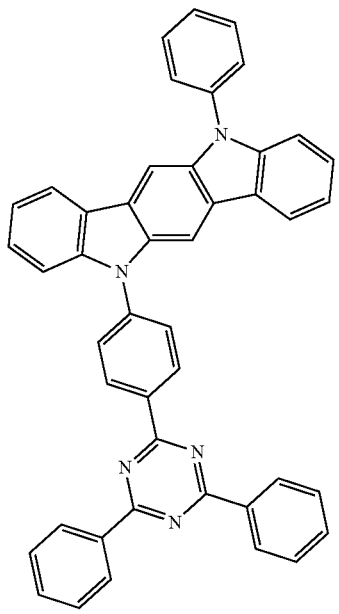
T-32
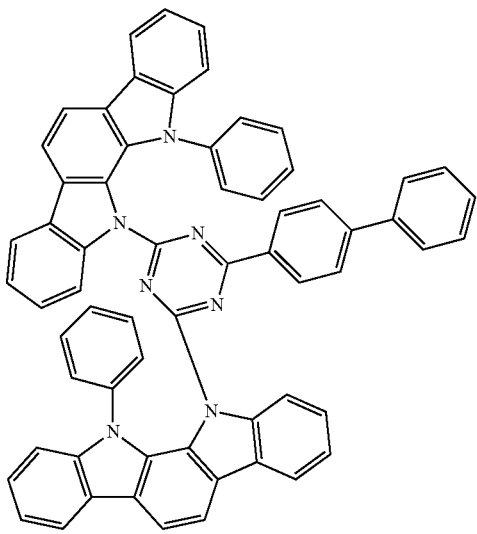
T-33
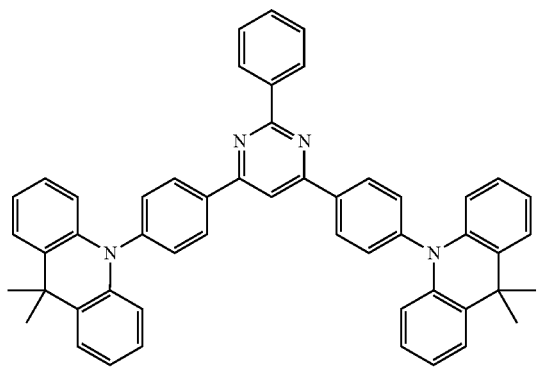
T-34
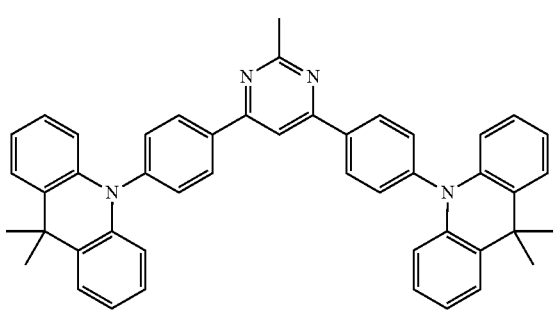

-continued
T-35
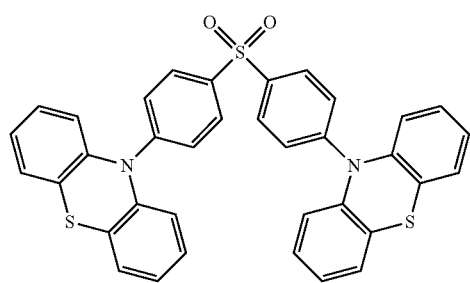
T-36
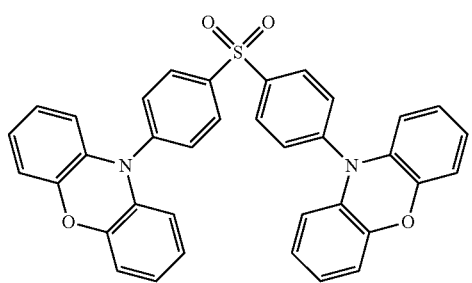
T-37
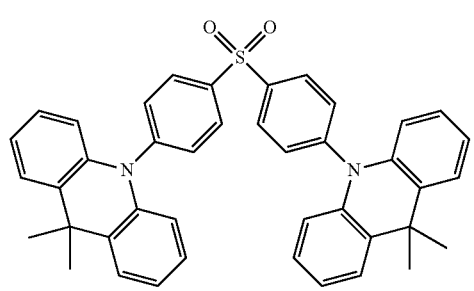
T-38
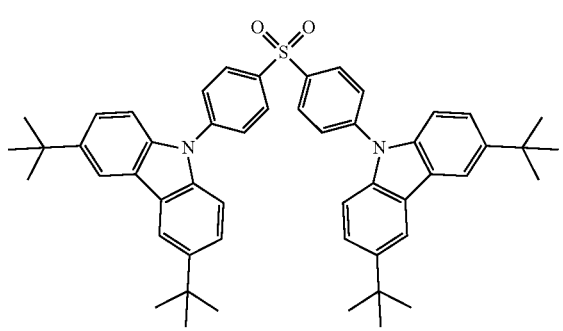
T-39
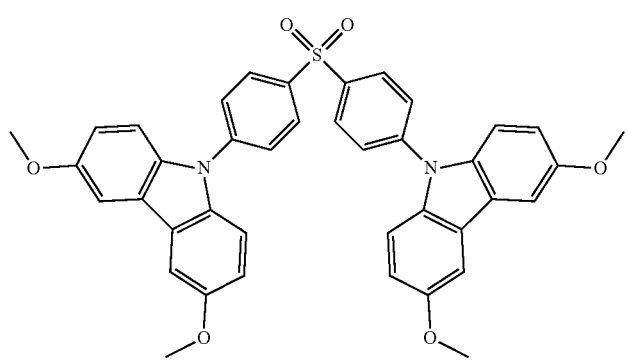
T-40
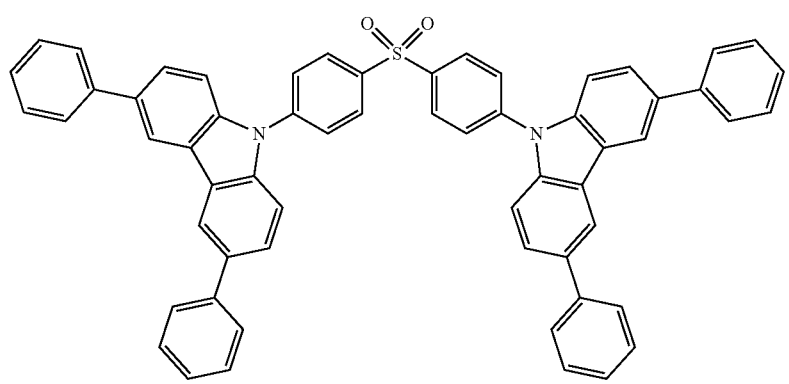

-continued
T-41
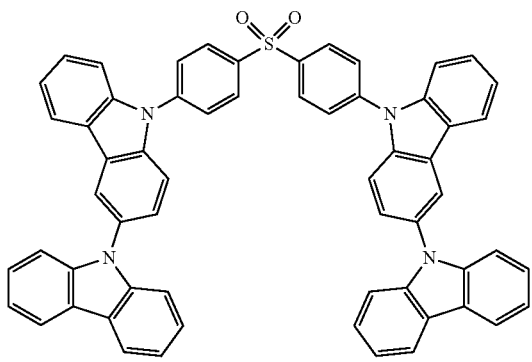
T-42
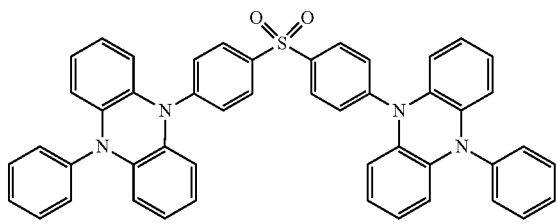
T-43
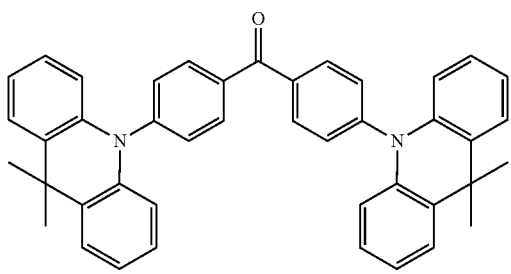
T-44
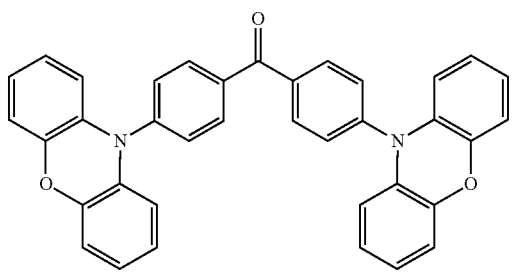
T-45
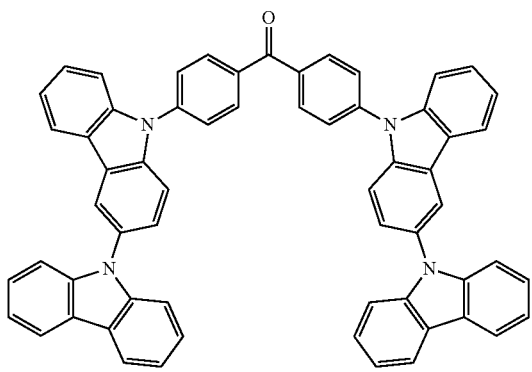
T-46
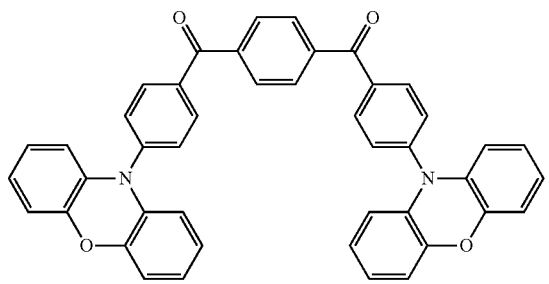
T-47
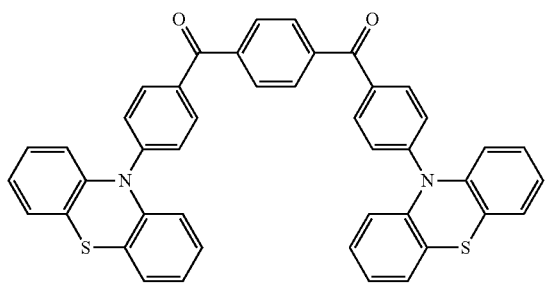
T-48
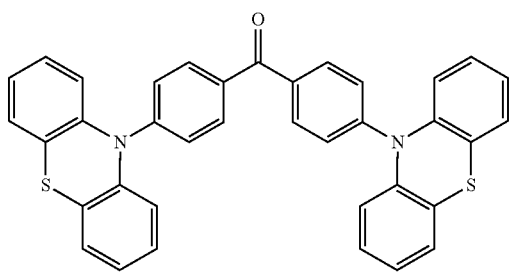

-continued
T-49
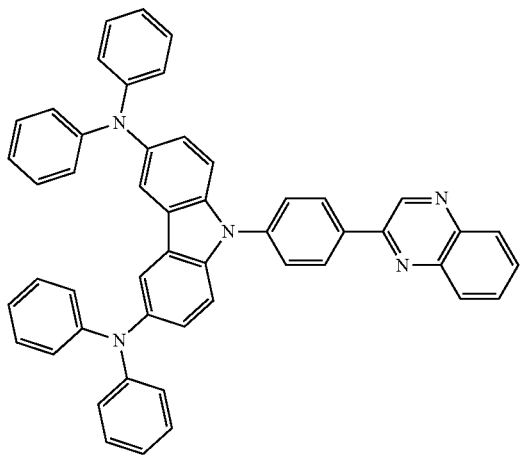
T-50
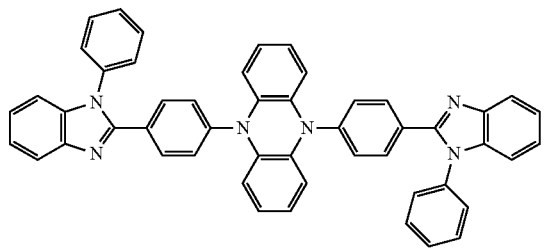
T-51
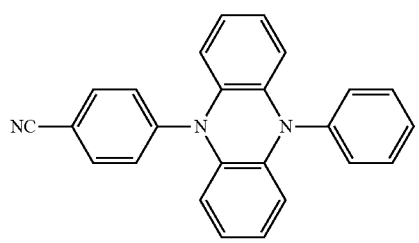
T-52
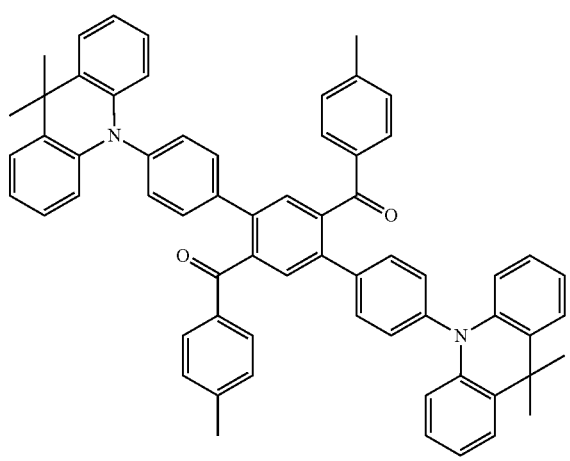
T-53
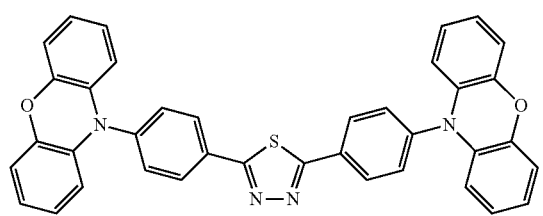
T-54
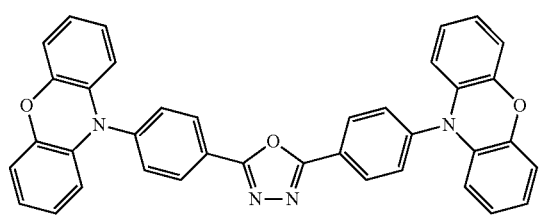
T-55
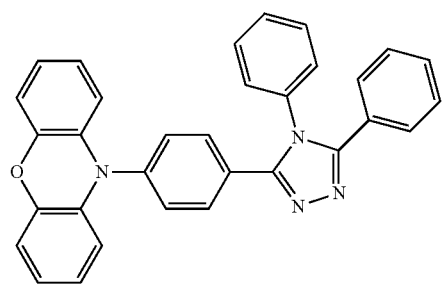
T-56
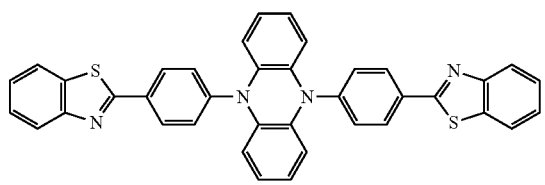

-continued
T-57
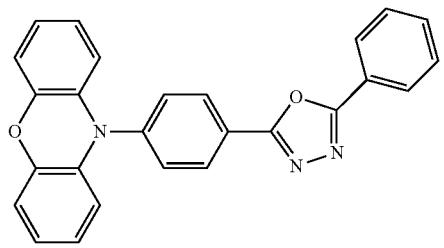
T-58
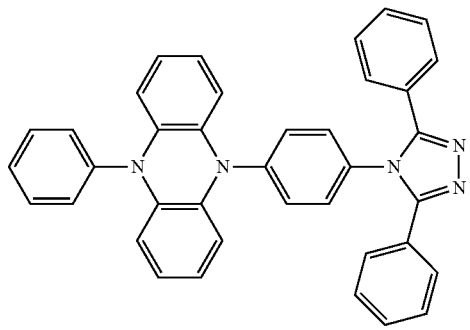
T-59
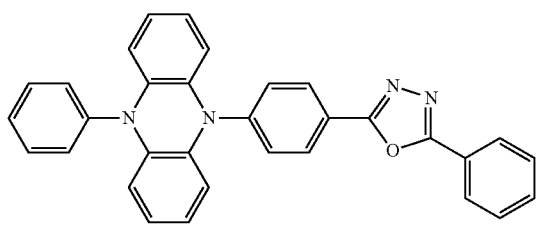
T-60
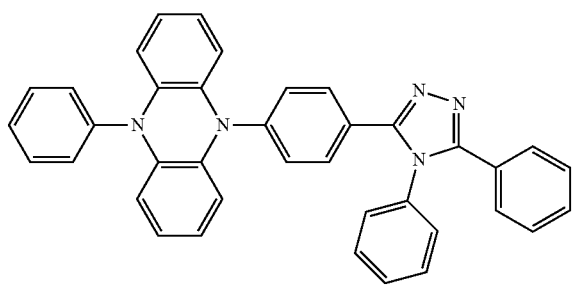
T-61
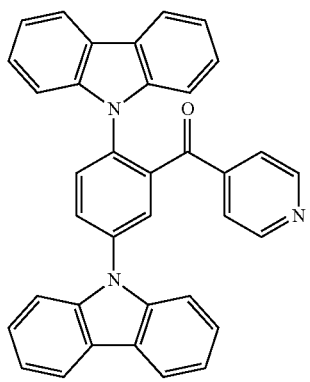
T-62
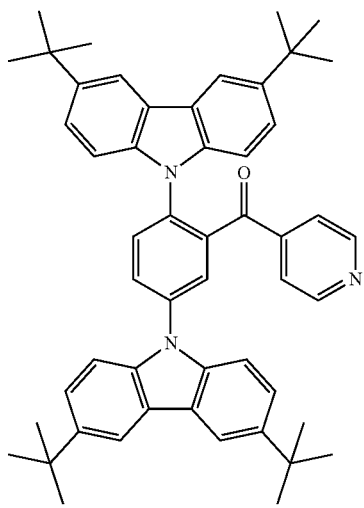
T-63
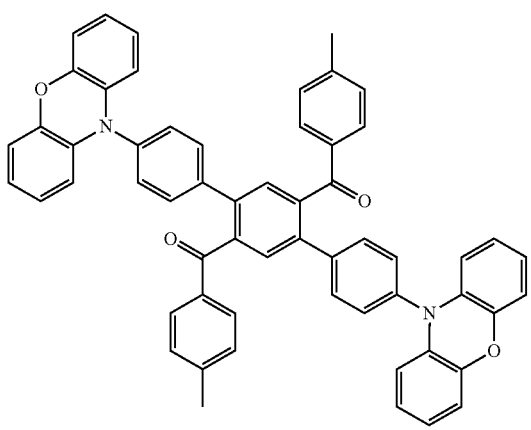
T-64
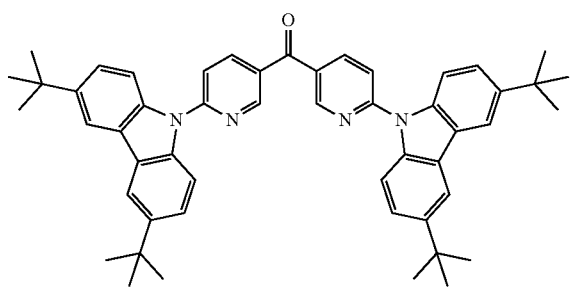

-continued
T-65
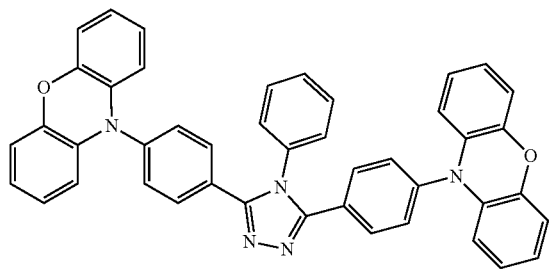
T-66
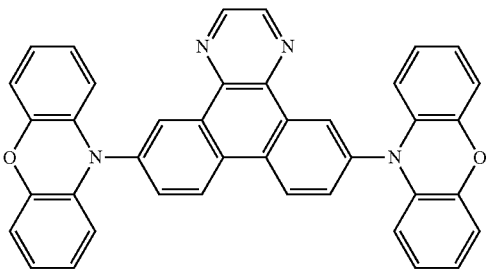
T-67
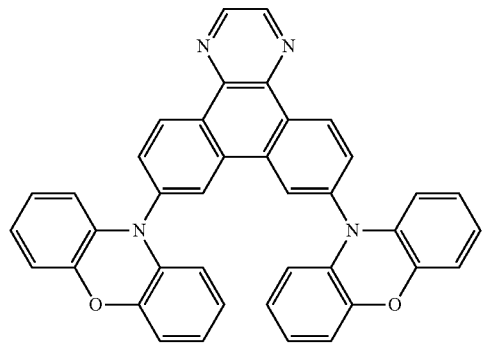
T-68
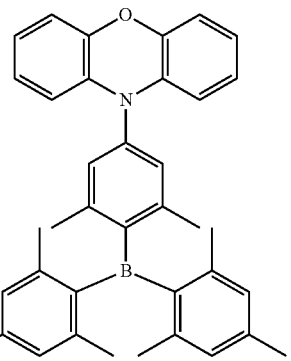
T-69
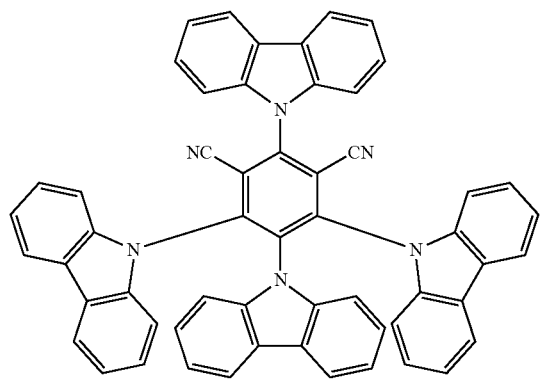
T-70
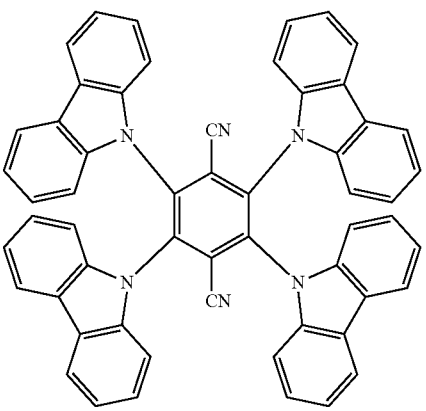
T-71
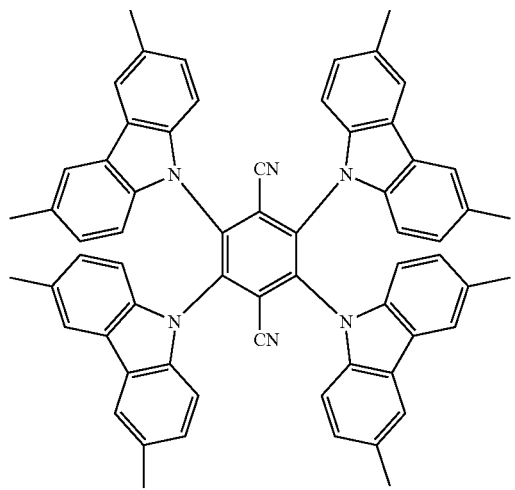
T-72
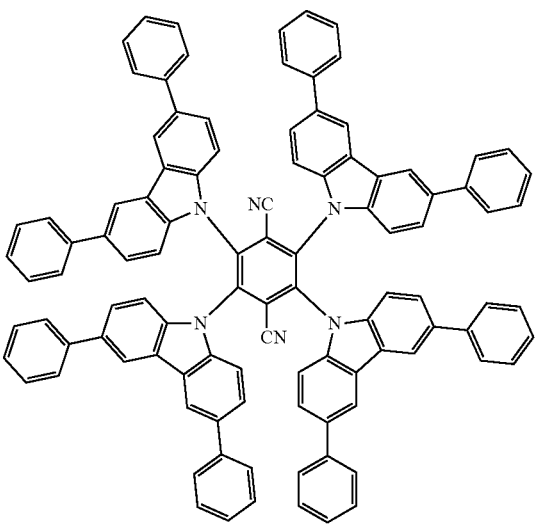

-continued
T-73
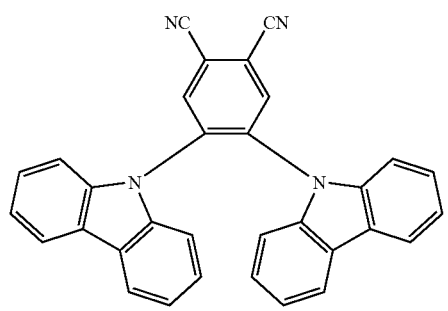
T-74
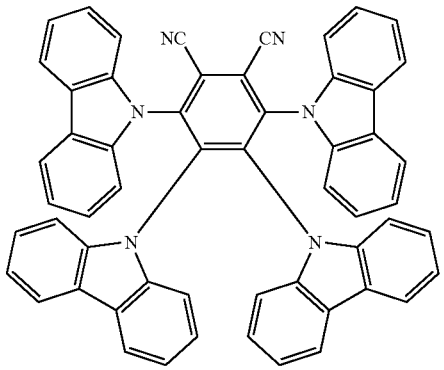
T-75
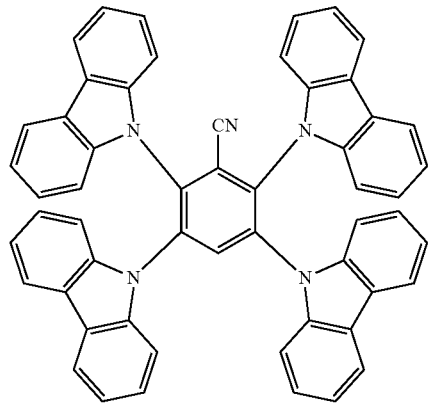
T-76
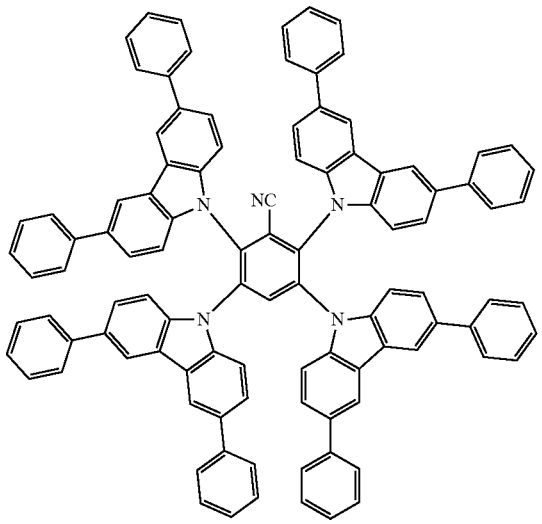
T-77
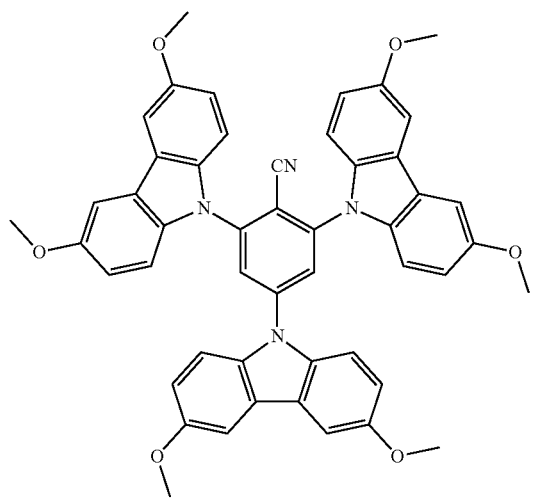
T-78
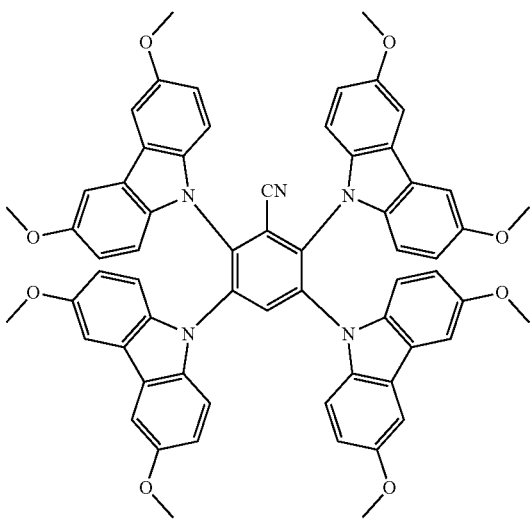

-continued
T-79
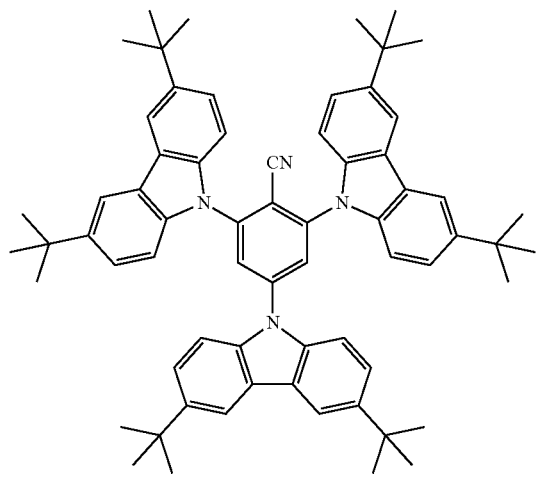
T-80
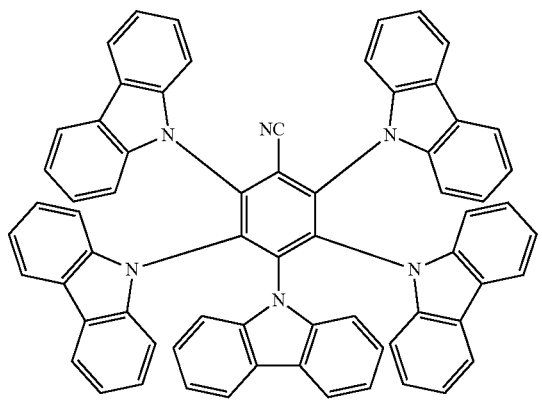
T-81
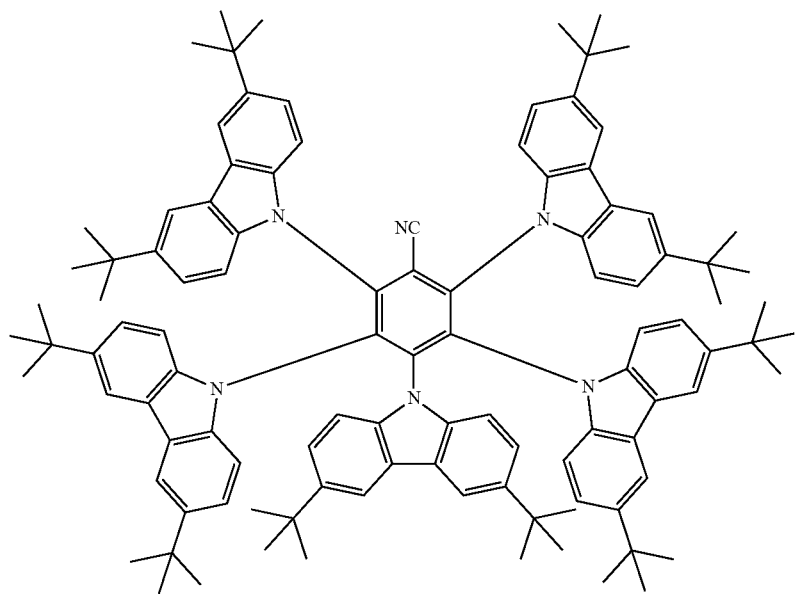
T-82
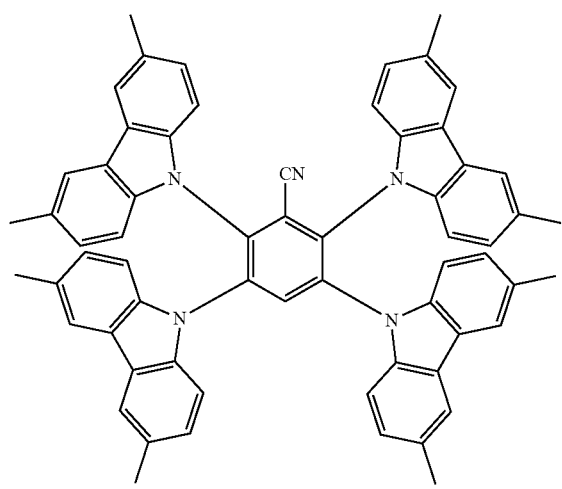

T-83
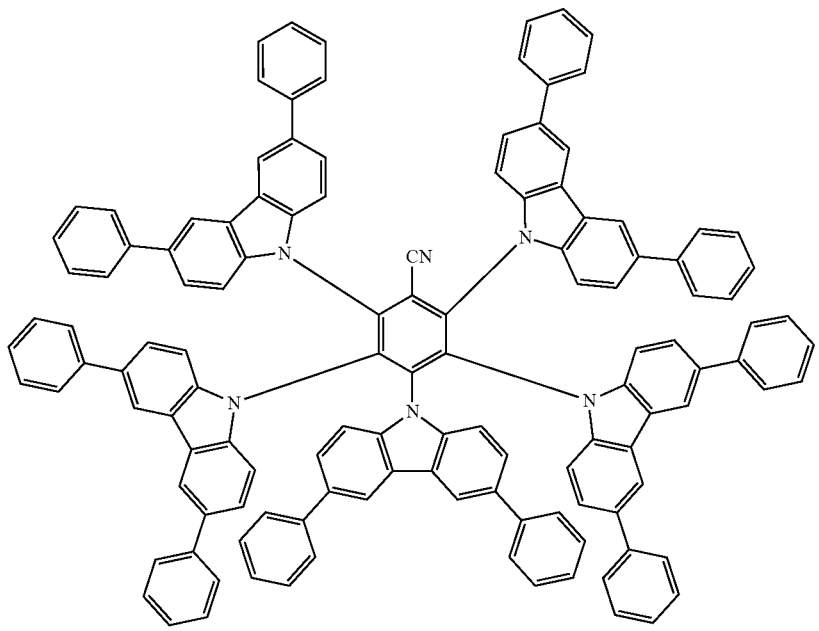
T-85
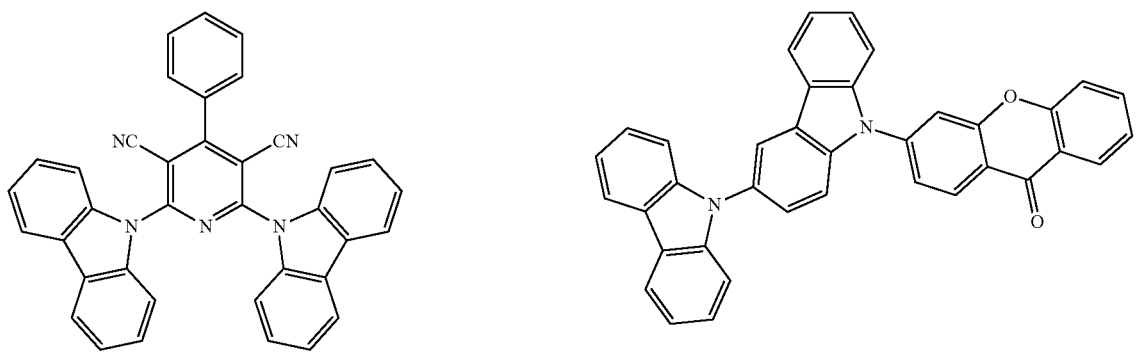
T-86
T-87
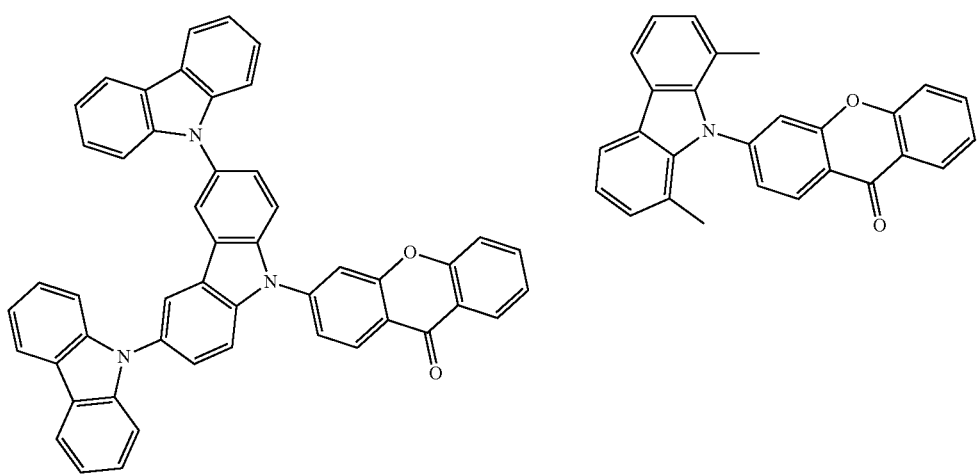

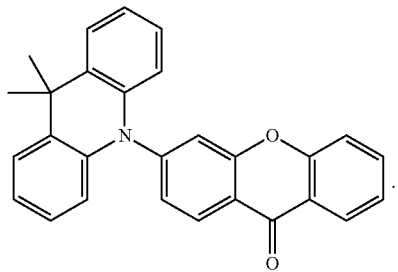

T-88

In addition, the wide bandgap material of the present application is a compound including at least one of carbazolyl, carbolinyl, spirofluorenyl, fluorenyl, silyl, and phosphonooxy.

The present application does not limit the specific structure of the wide bandgap material. Preferably, the wide bandgap material is selected from compounds having one of the following structures:

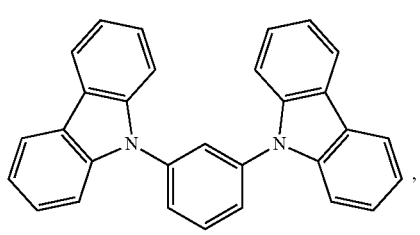
(W-1)

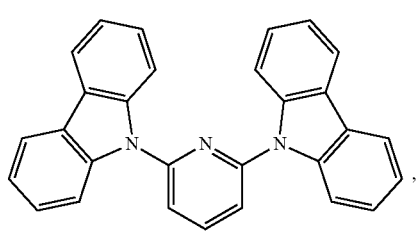
(W-2)

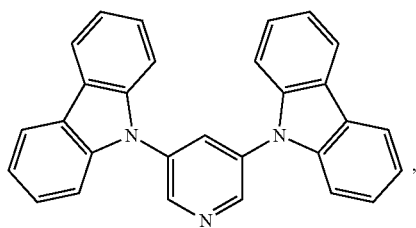
(W-3)

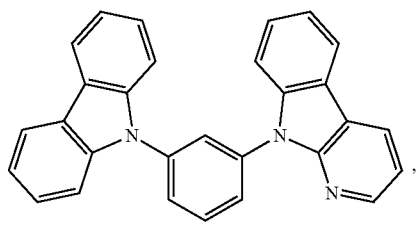
(W-4)

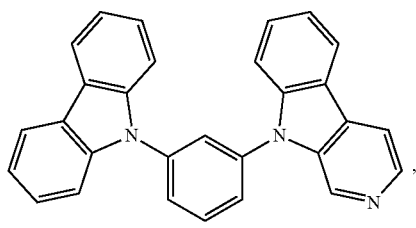
(W-5)

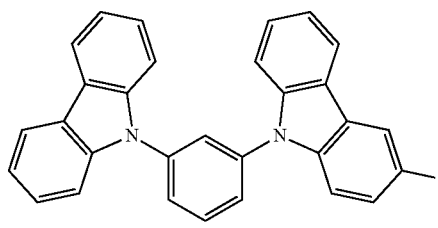
(W-6)

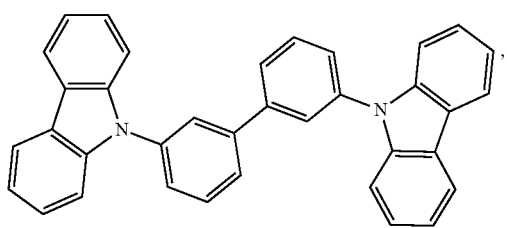
(W-7)

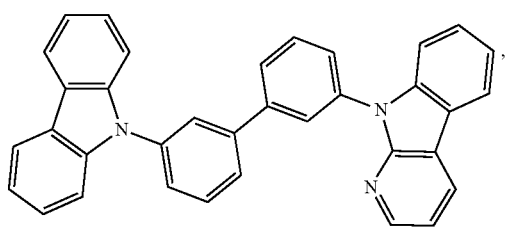
(W-8)

-continued
(W-9)
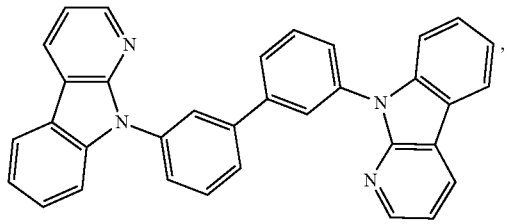
(W-10)
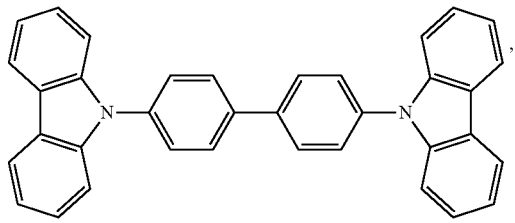
(W-11)
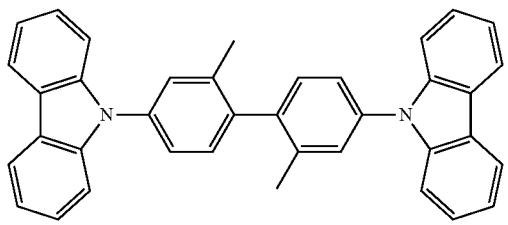
(W-12)
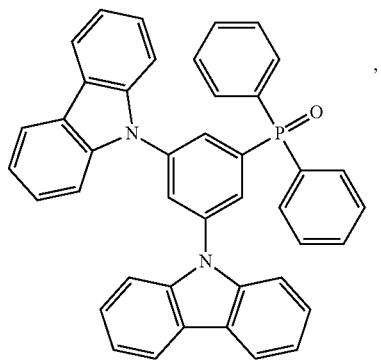
(W-13)
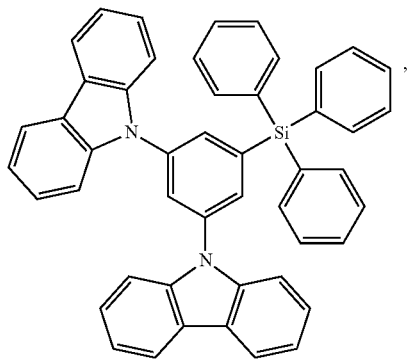
(W-14)
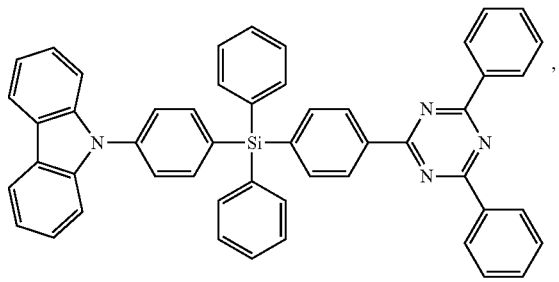
(W-15)
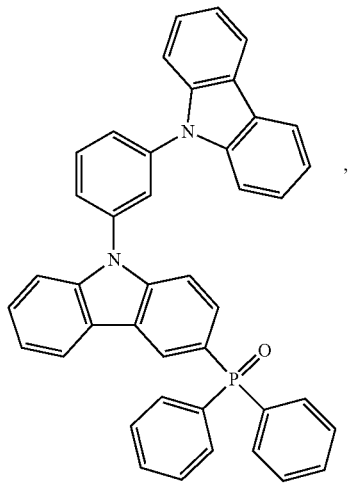
(W-16)
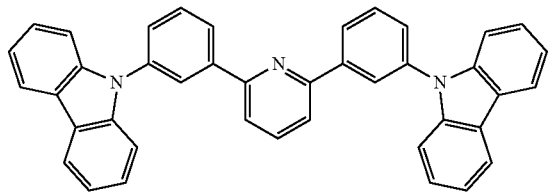

-continued
(W-17) 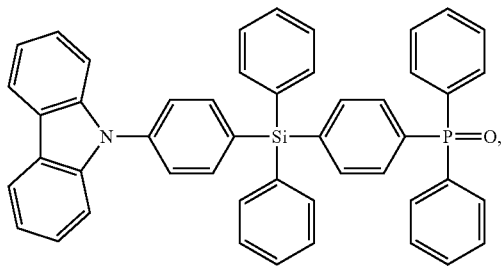
(W-18) 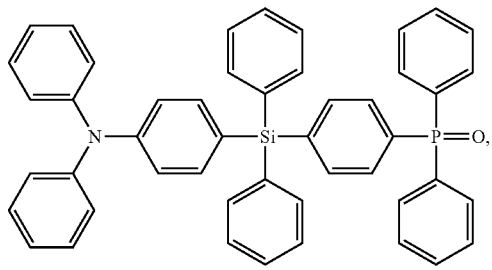
(W-19) 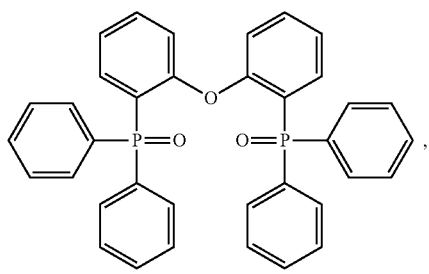
(W-20) 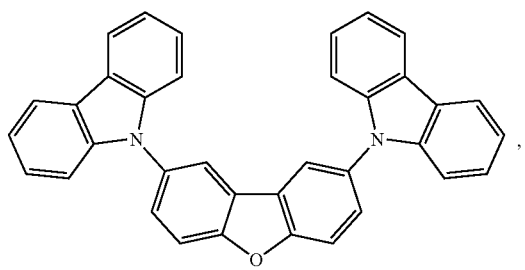
(W-21) 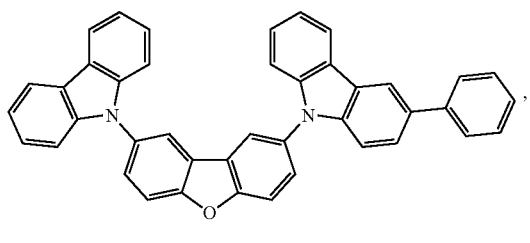
(W-22) 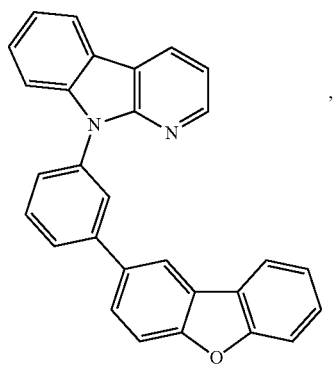
(W-23) 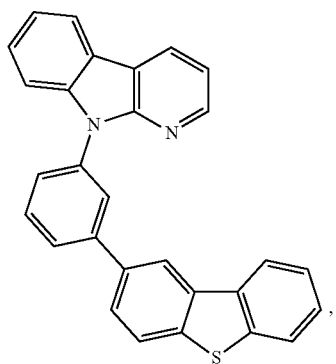
(W-24) 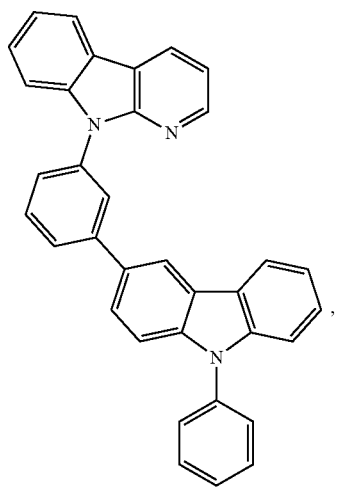

(W-25)
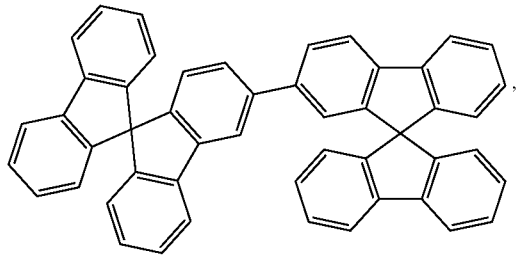
(W-26)
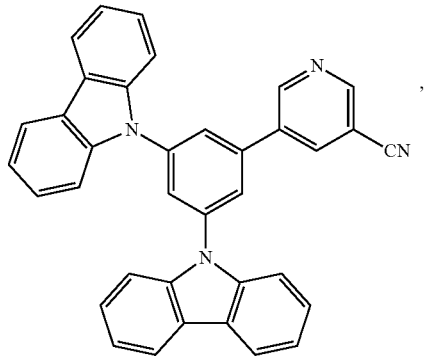
(W-27)
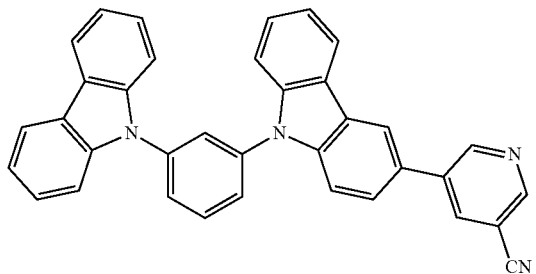
(W-28)
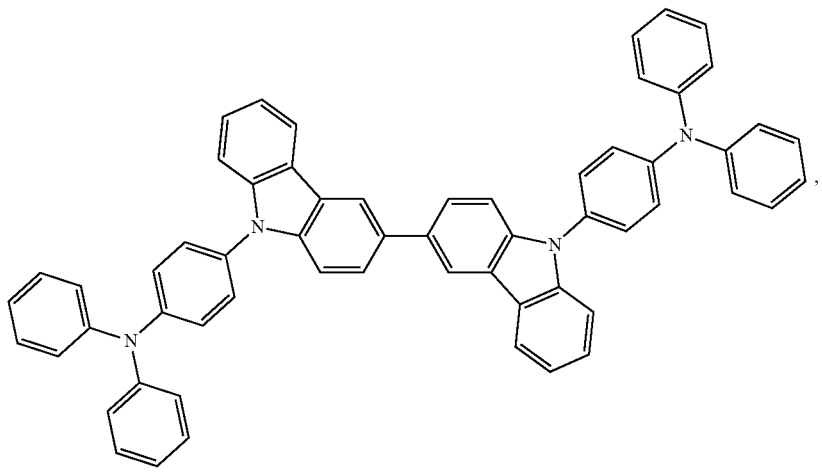
(W-29)
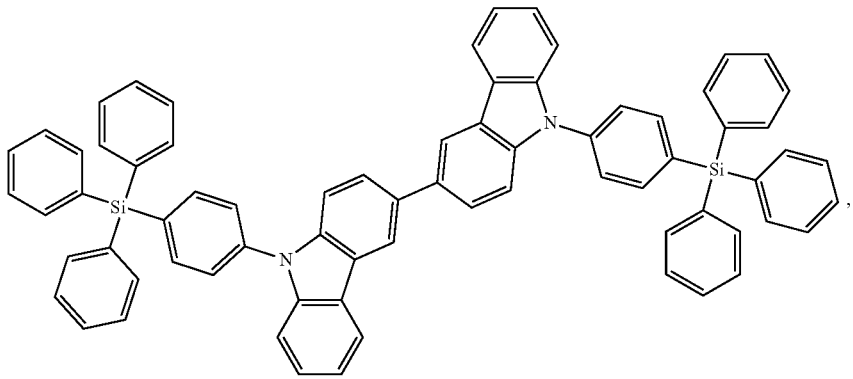

(W-30)
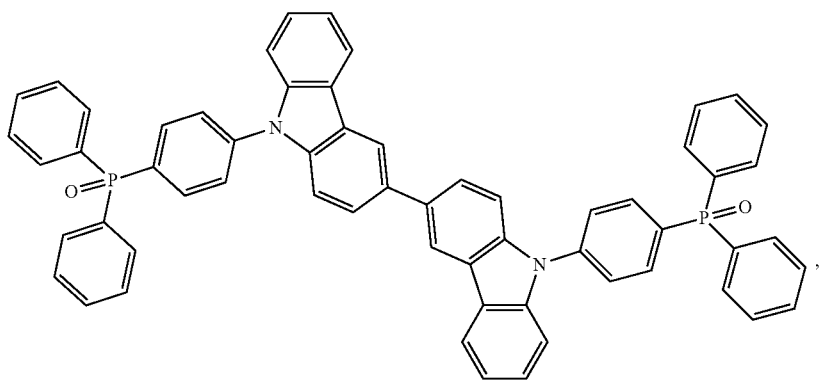
(W-31)
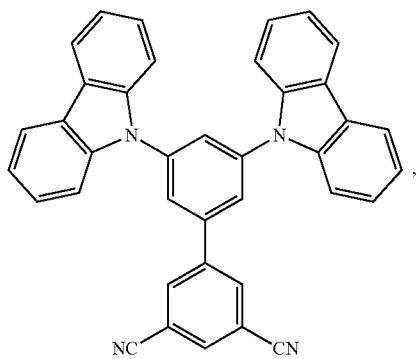
(W-32)
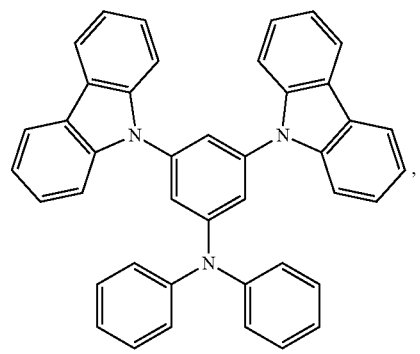
(W-33)
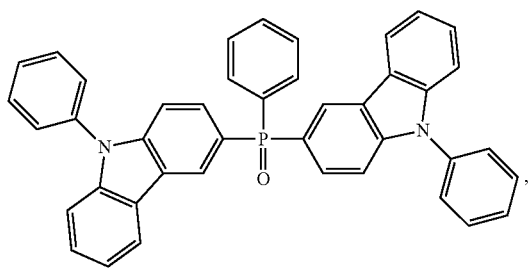
(W-34)
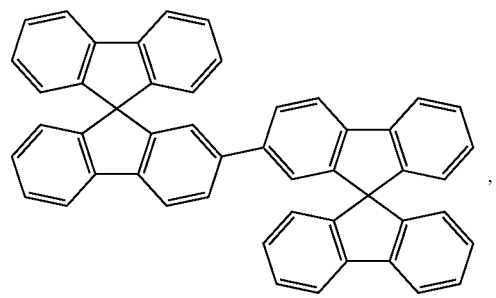
(W-35)
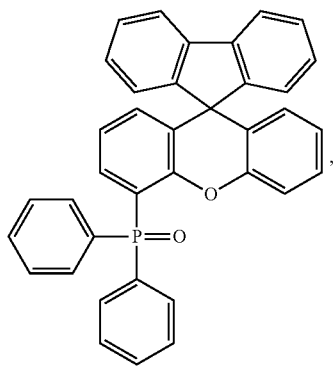
(W-36)
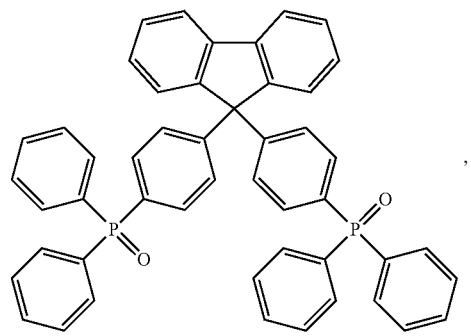

-continued
(W-37)
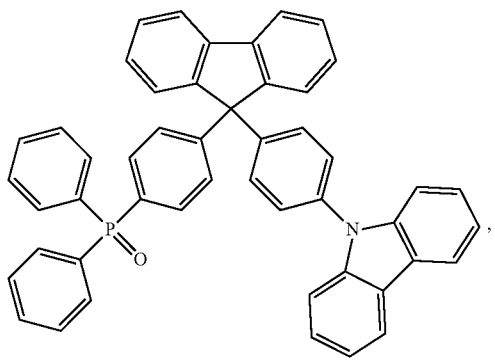
(W-38)
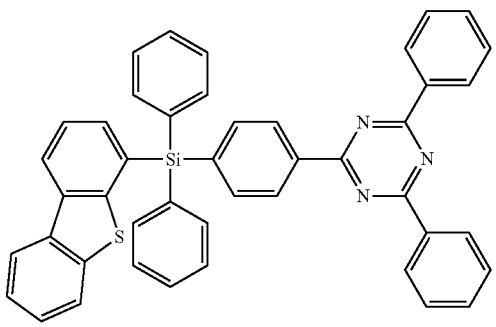
(W-39)
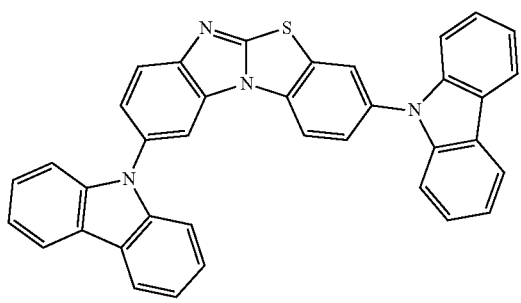
(W-40)
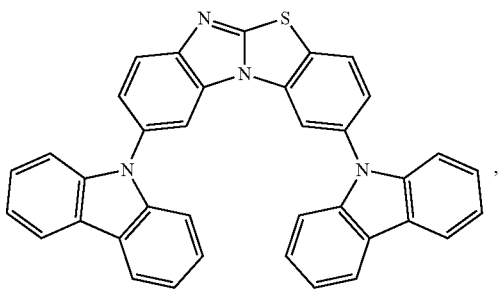
(W-41)
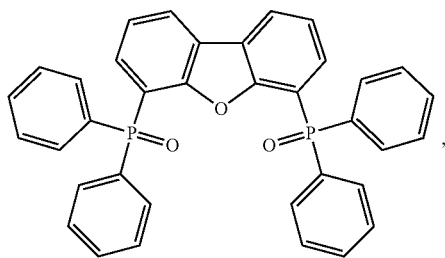
(W-42)
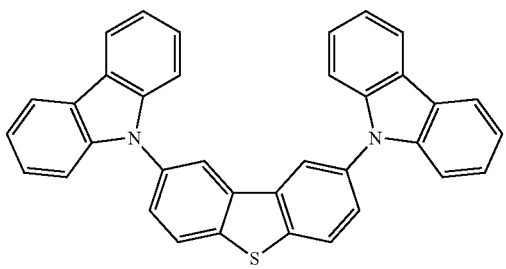
(W-43)
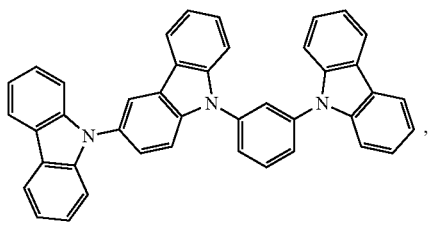
(W-44)
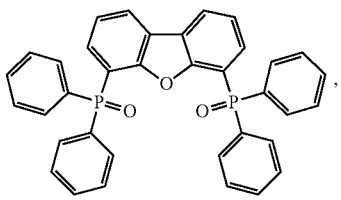
(W-45)
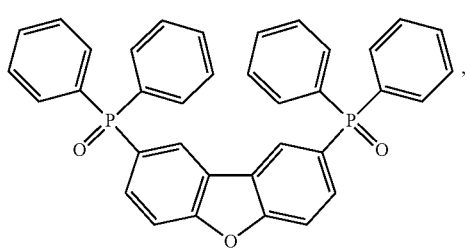
(W-46)
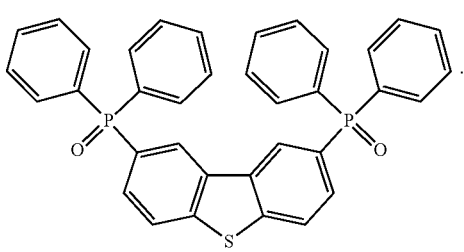

Still referring to FIG. 1, the hole transporting region 3, the electron transporting region 5, and the cathode 6 of the present application will be described. The hole transporting region 3 is located between the anode 2 and the organic light emitting layer 4. The hole transporting region 3 may be a hole transporting layer (HTL) with a single-layer structure, including a single-layer hole transporting layer containing only one compound and a single-layer hole transporting layer containing multiple compounds. The hole transporting region 3 may also have a multilayer structure including at least two layers of a hole injecting layer (HIL), a hole transporting layer (HTL), and an electron blocking layer (EBL).

The material for the hole transporting region 3 (including HIL, HTL, and EBL) may be selected from, but not limited to, phthalocyanine derivatives, such as CuPc, conductive polymers or polymers containing conductive dopants, such as polyphenylene vinylene, polyaniline/dodecylbenzene sulfonic acid (Pani/DBSA), poly (3,4-ethylenedioxythiophene)/poly (4-styrenesulfonate) (PEDOT/PSS), polyaniline/camphorsulfonic acid (Pani/CSA), polyaniline/poly (4-styrenesulfonate) (Pani/PSS), aromatic amine derivative.

The aromatic amine derivative is a compound represented by the following HT-1 to HT-34. If the material of the hole transporting region 3 is an aromatic amine derivative, it may be one or more of the compounds represented by HT-1 to HT-34.

HT-1

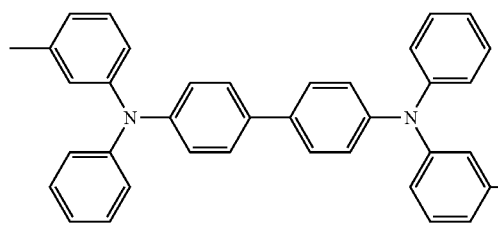

HT-2

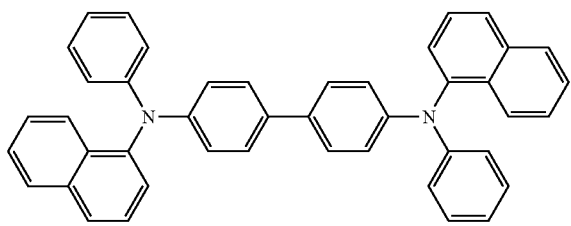

HT-3

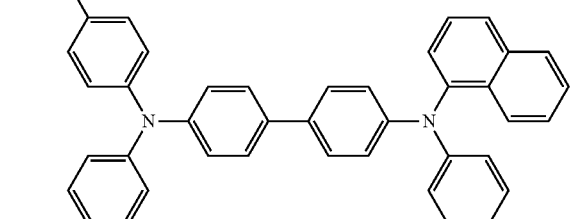

-continued

HT-4

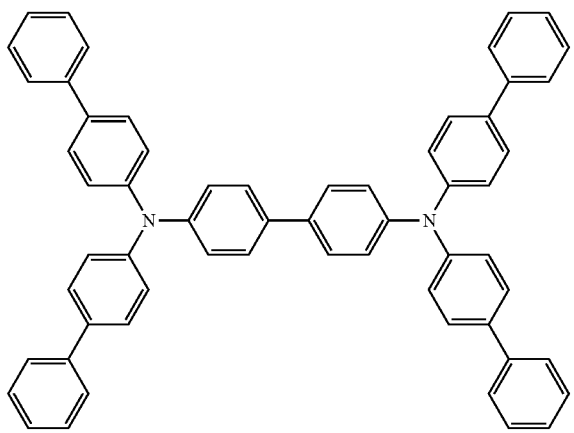

HT-5

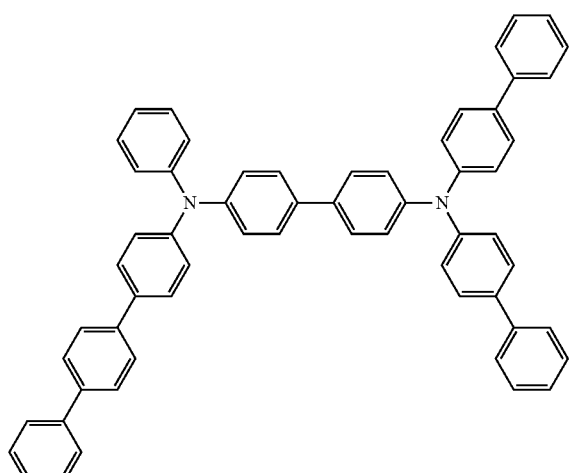

HT-6

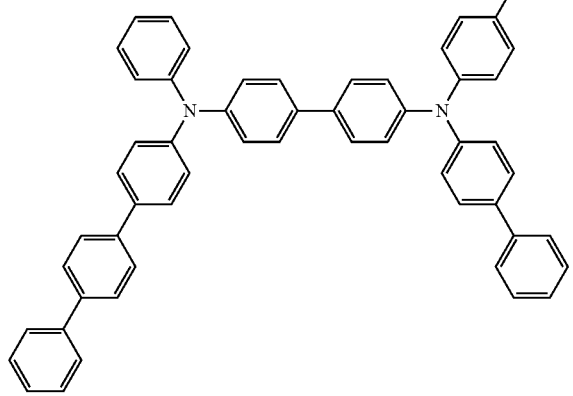

HT-7

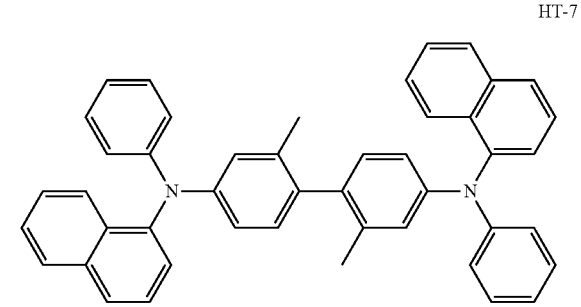

HT-8
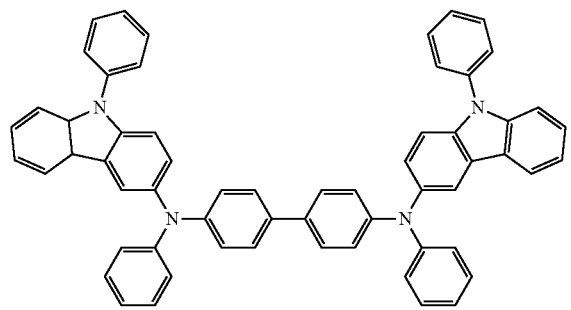
HT-9
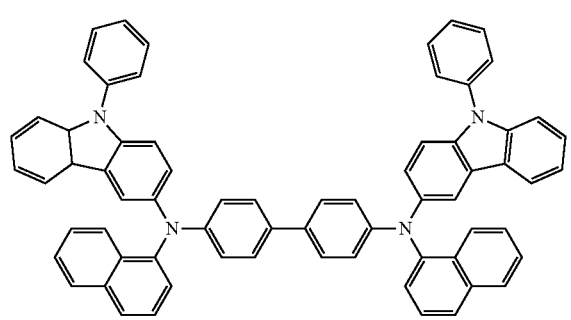
HT-10
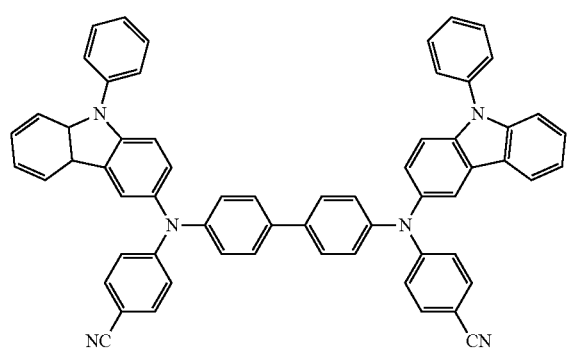
HT-11
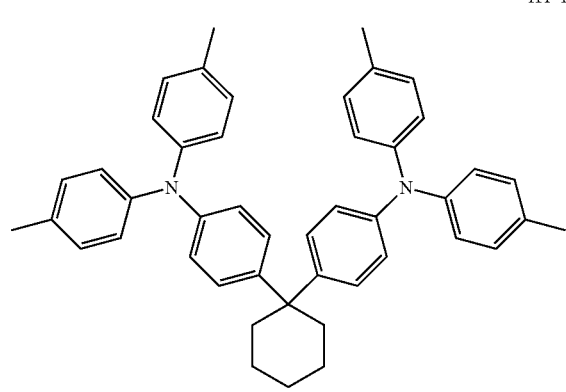
HT-12
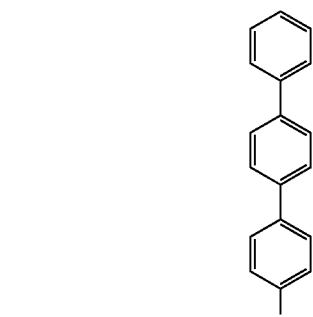
HT-13
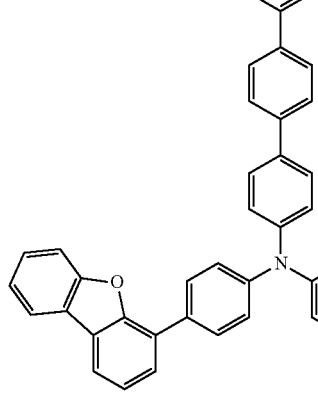
HT-14
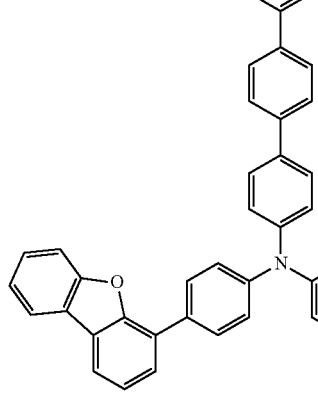

HT-15
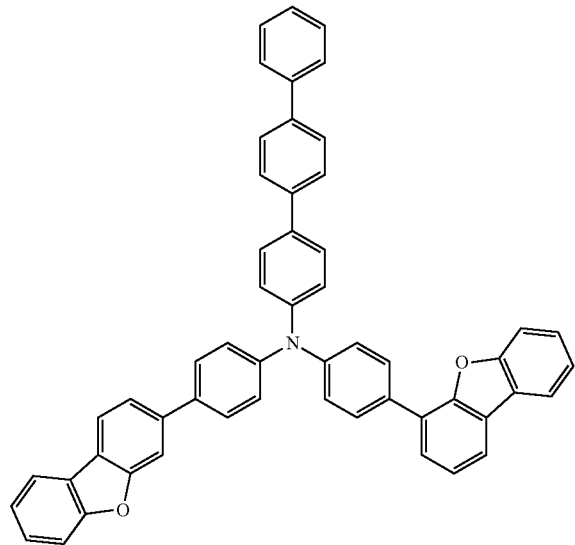
HT-18
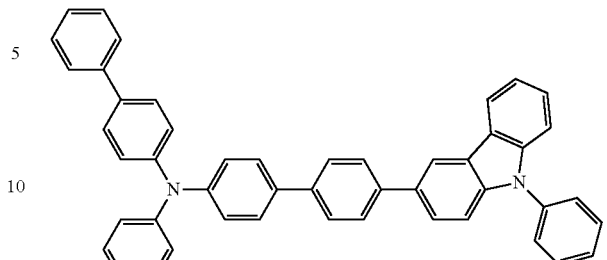
HT-16
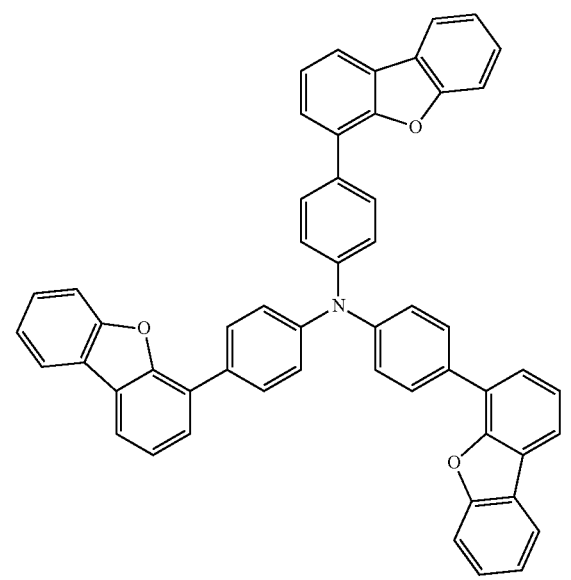
HT-19
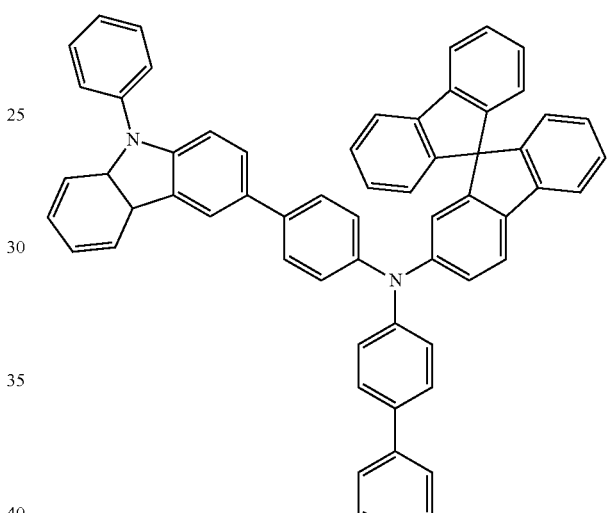
HT-17
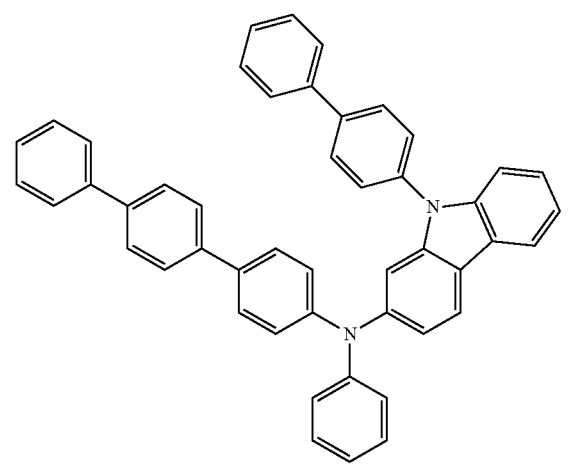
HT-20
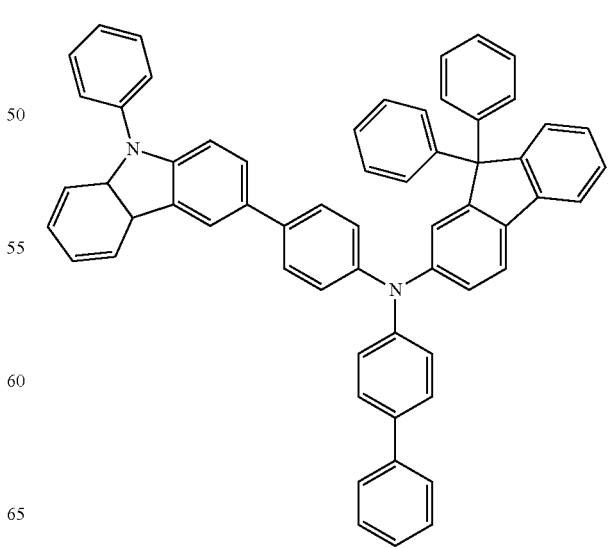

HT-21
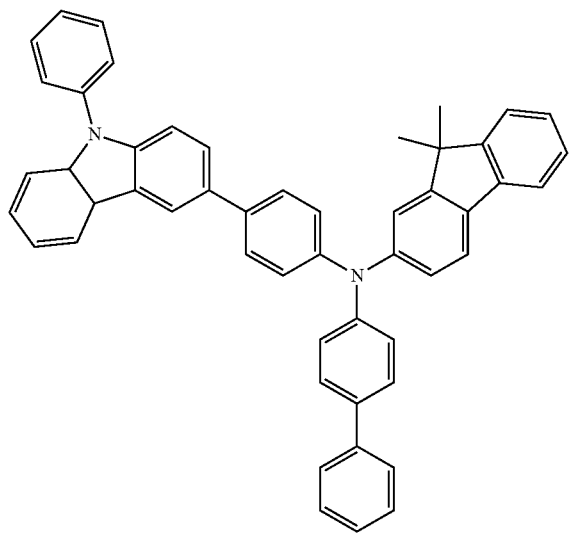
HT-22
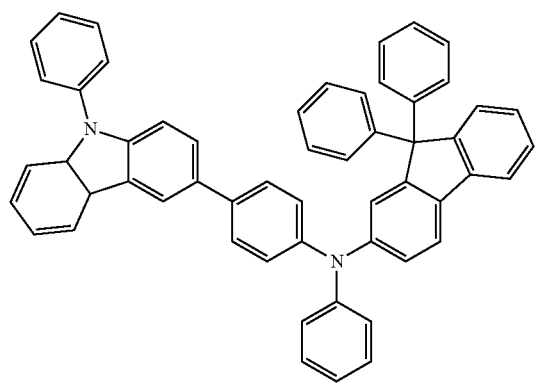
HT-23
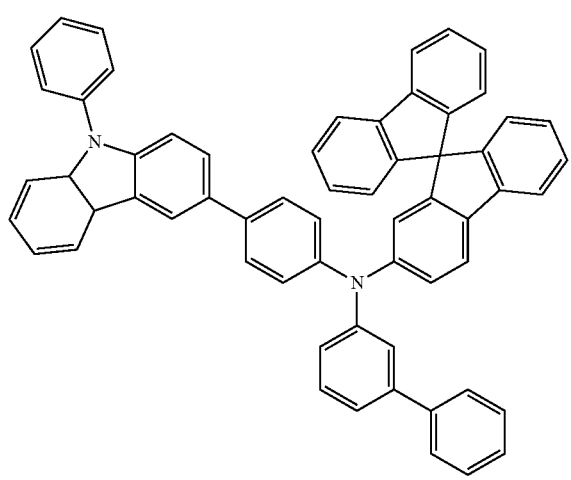
HT-24
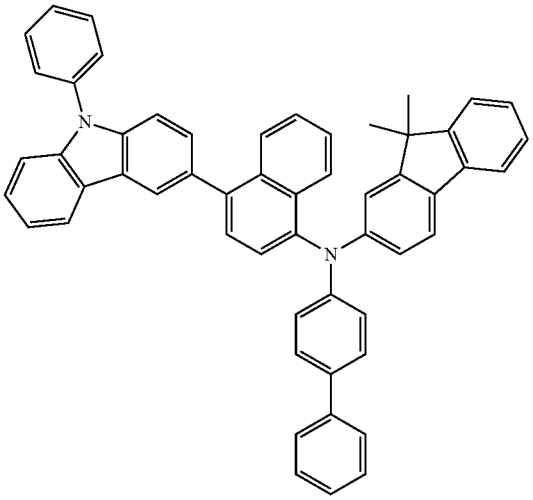
HT-25
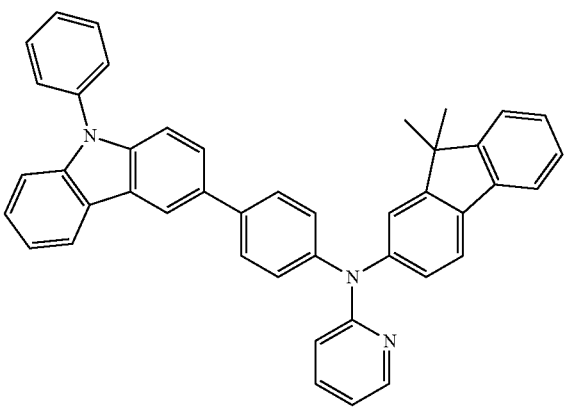
HT-26
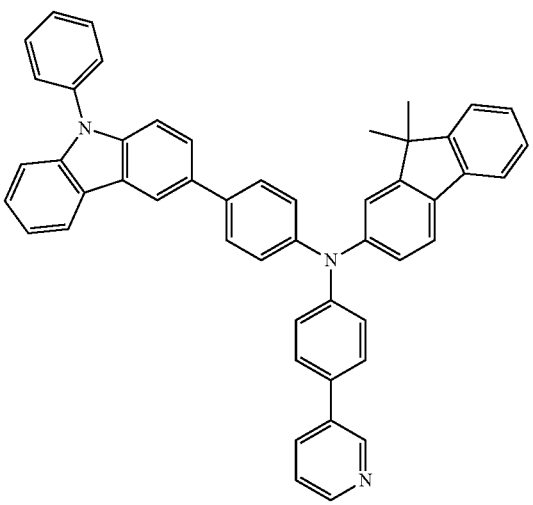

HT-27
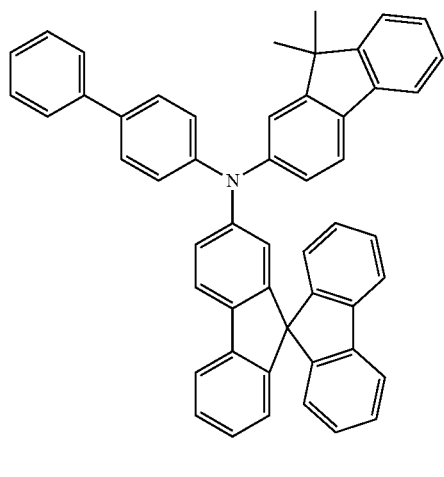
HT-30
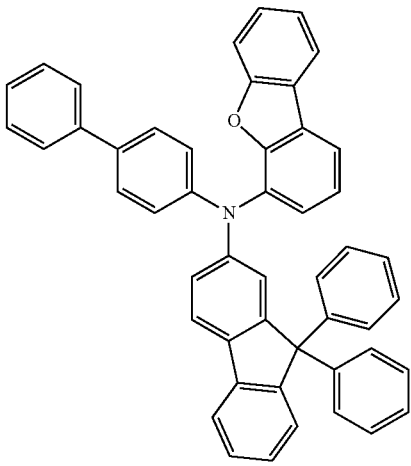
HT-28
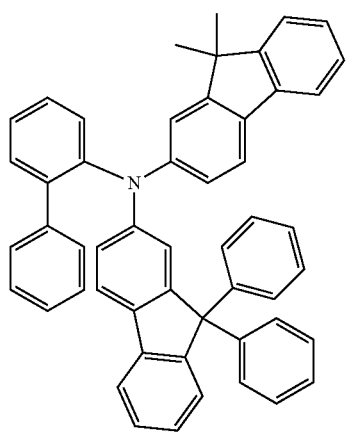
HT-31
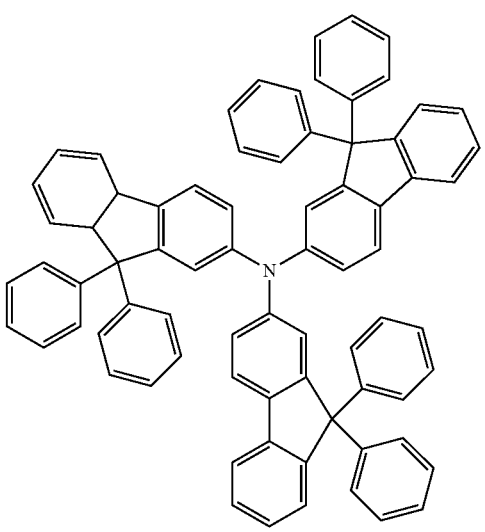
HT-29
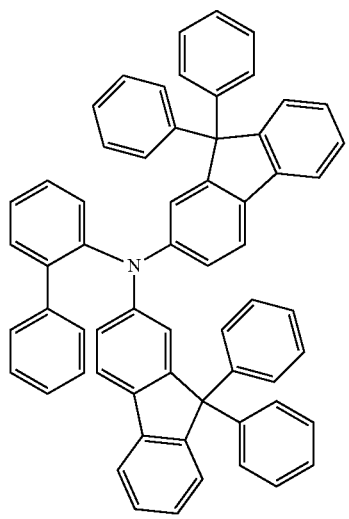
HT-32
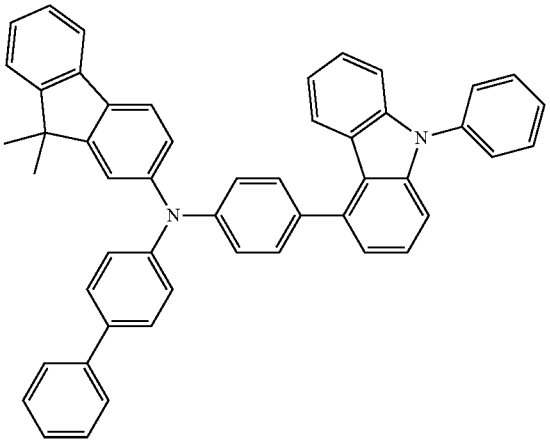

HT-33

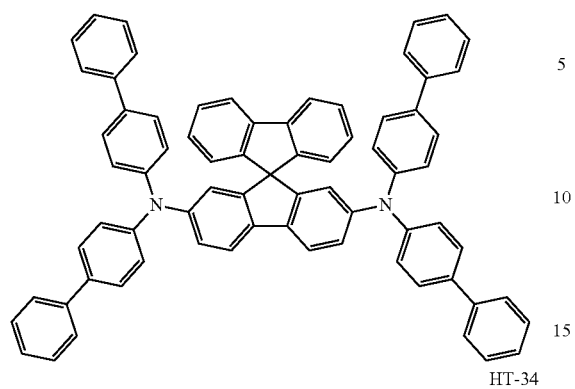

HT-34

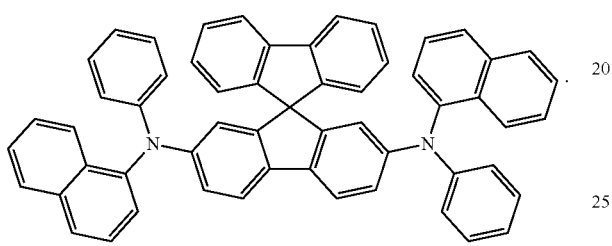

The hole injecting layer is located between the anode 2 and the hole transporting layer. The hole injecting layer may be a single compound material or a combination of a plurality of compounds. For example, the hole injecting layer may use one or more of the above-mentioned compounds HT-1 to HT-34, or one or more of the following compounds HI1-HI3, or one or more of the compounds HT-1 to HT-34 doped with one or more of the following compounds HI1-HI3.

HI-1

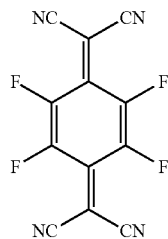

HI-2

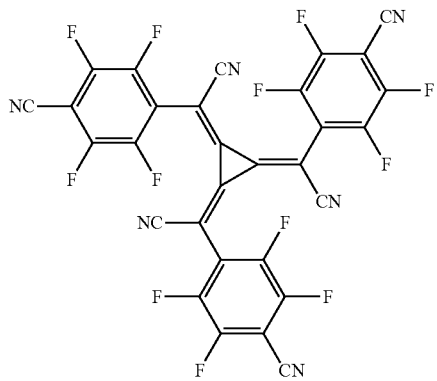

HI-3

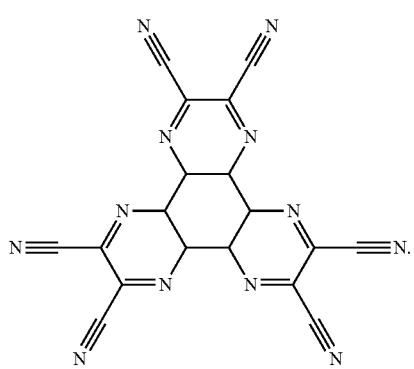

The electron transporting region 5 may be an electron transporting layer (ETL) with a single-layer structure, including a single-layer electron transporting layer containing only one compound and a single-layer electron transporting layer containing multiple compounds. The electron transporting region 5 may also be a multilayer structure including at least two layers of an electron injecting layer (EIL), an electron transporting layer (ETL), and a hole blocking layer (HBL).

In an aspect of the present application, the material of the electron transporting layer may be selected from, but not limited to, one or a combination of more of ET-1 to ET-57 as listed in the following.

ET-1

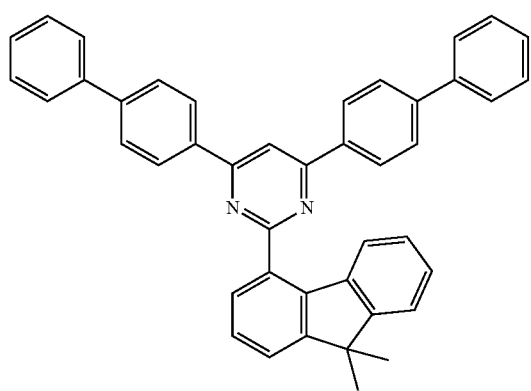

ET-2

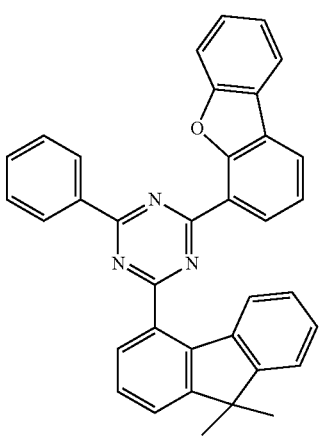

-continued
ET-3
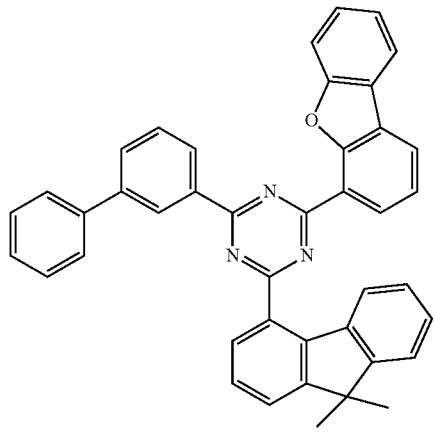
ET-4
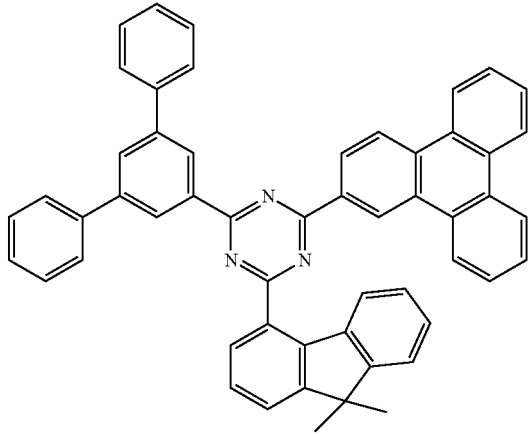
ET-5
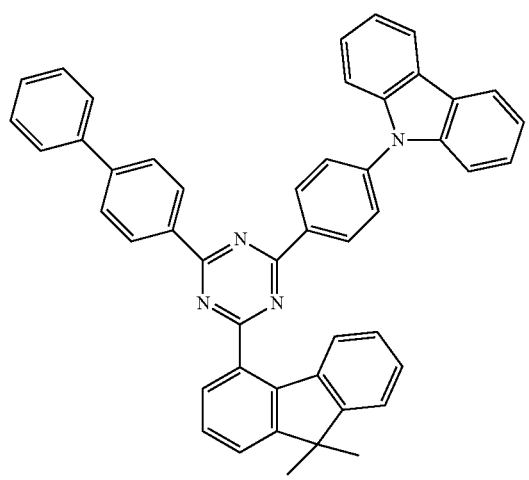
ET-6
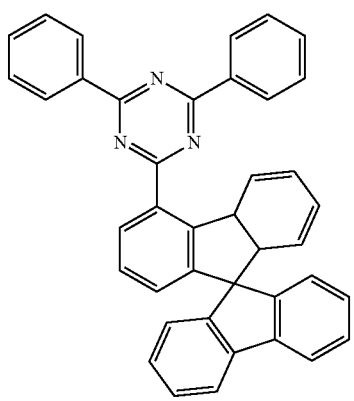
ET-7
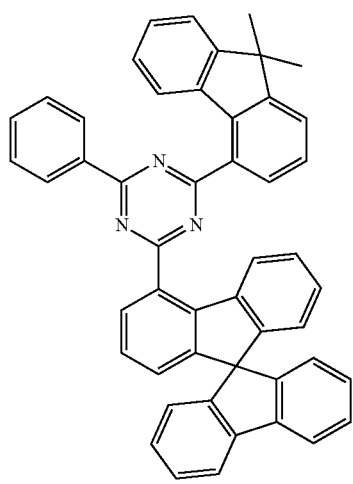
ET-8
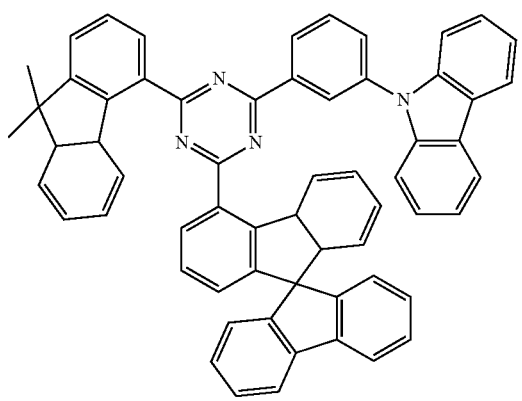

-continued
ET-9
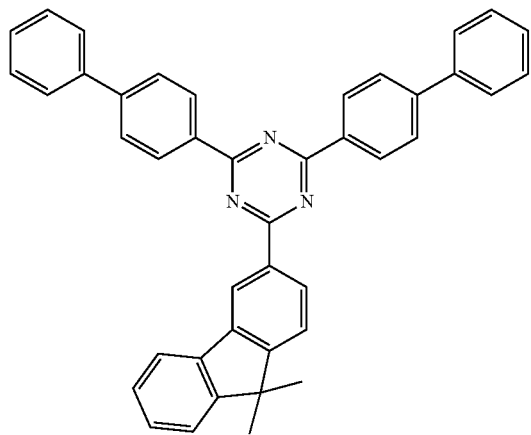
ET-10
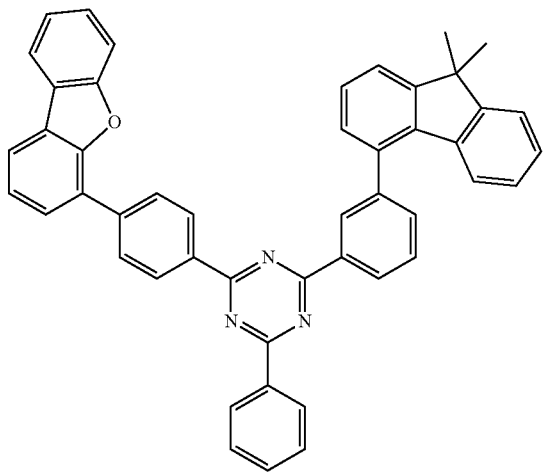
ET-11
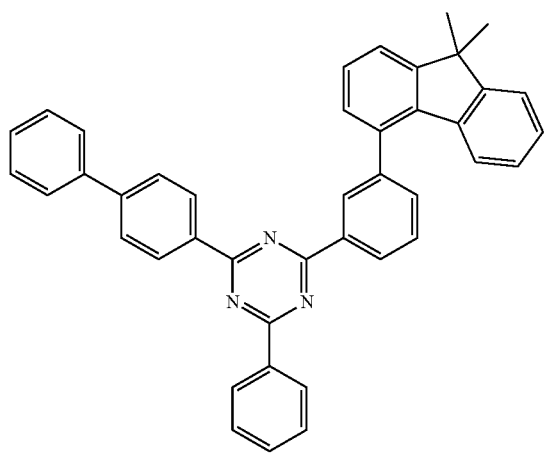
ET-12
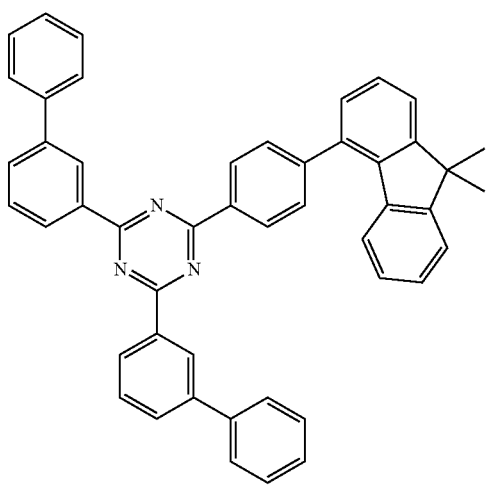
ET-13
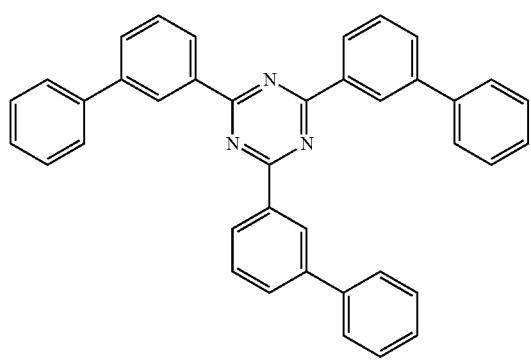
ET-14
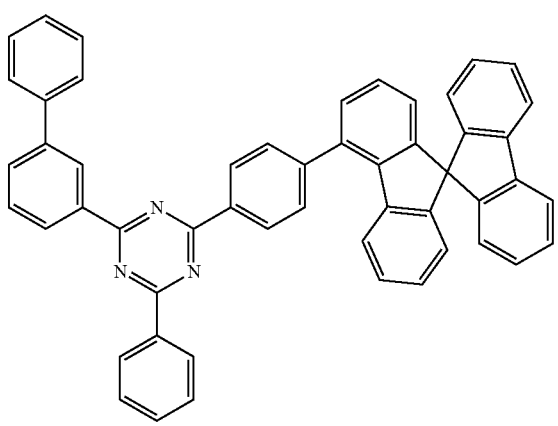

-continued
ET-15
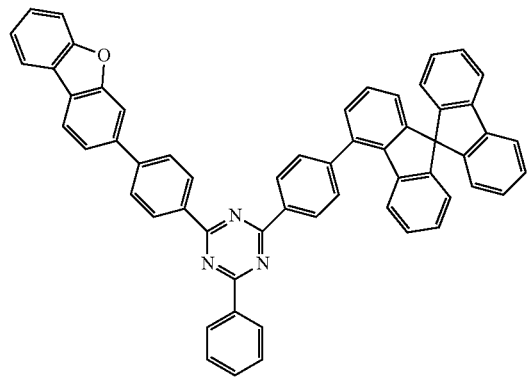
ET-16
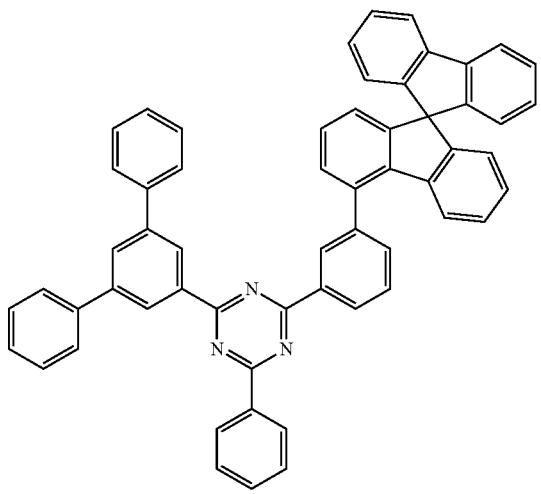
ET-17
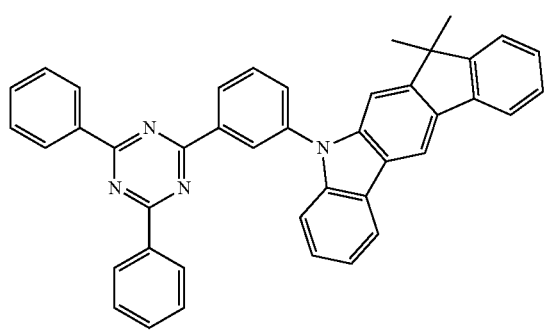
ET-18
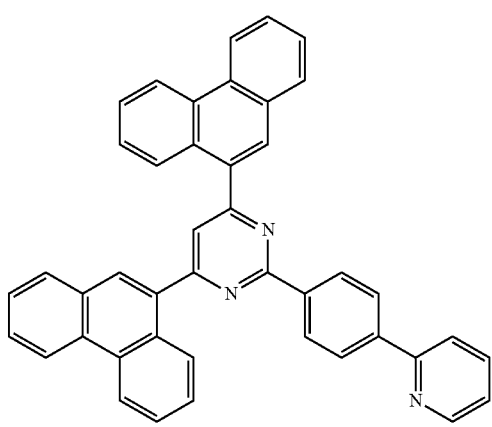
ET-19
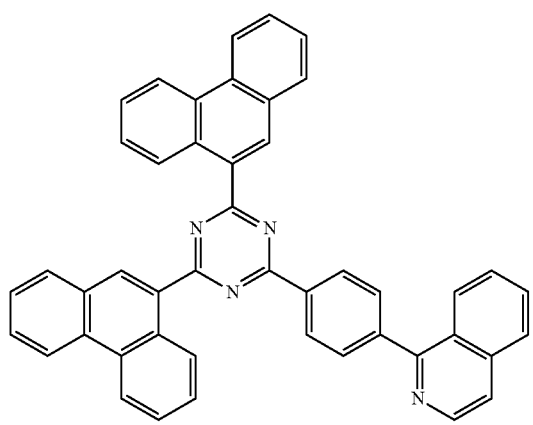
ET-20
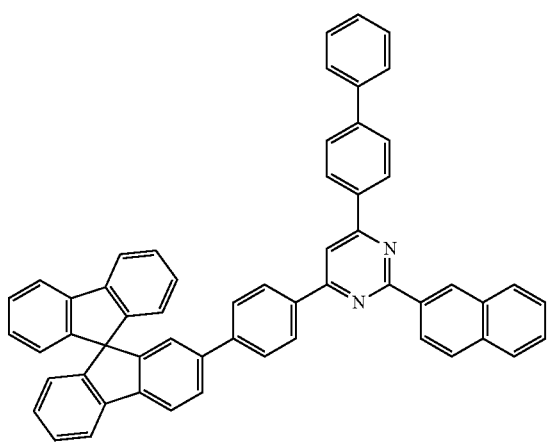

-continued
ET-21
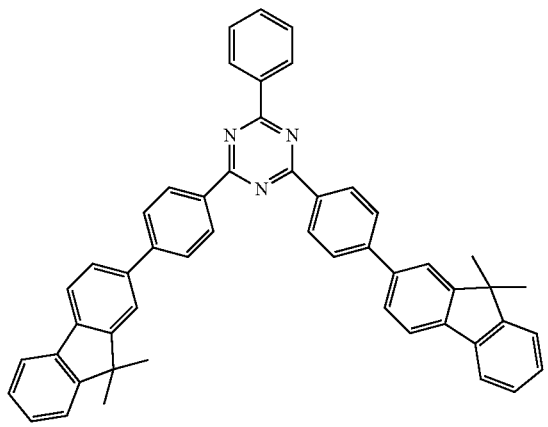
ET-22
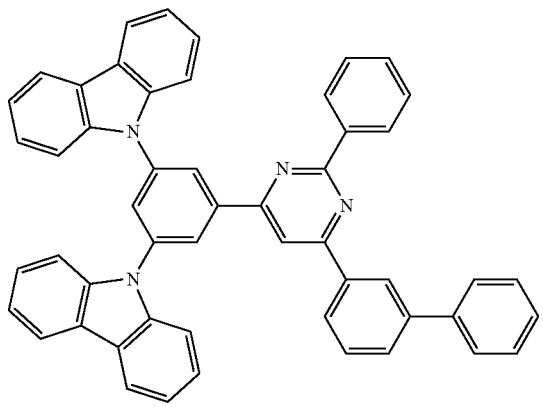
ET-23
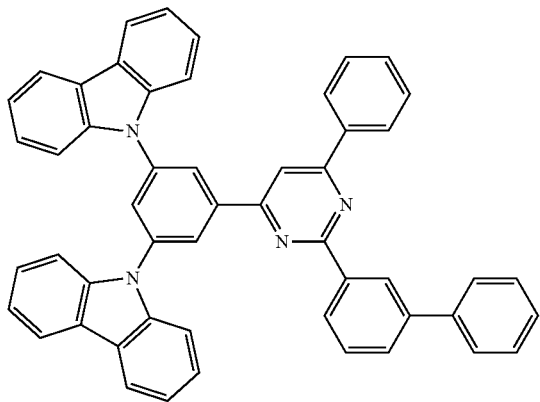
ET-24
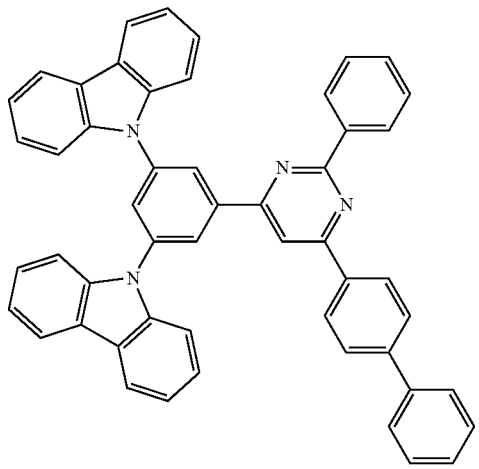
ET-25
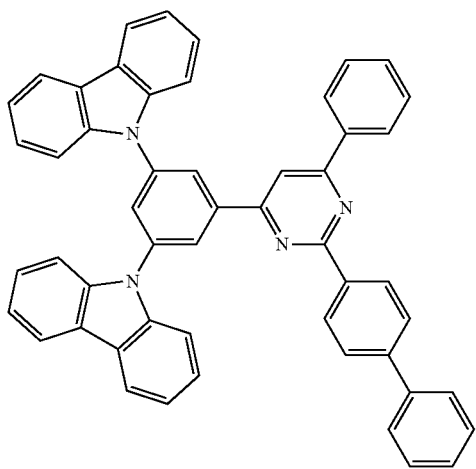
ET-26
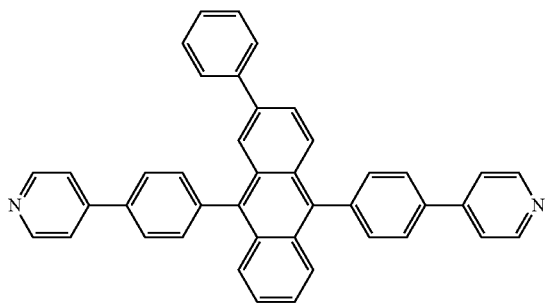

-continued
ET-27
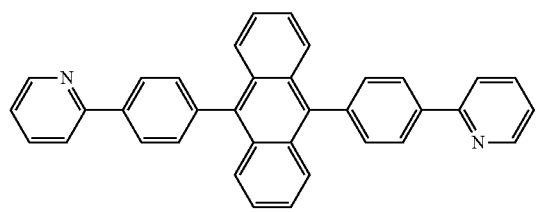
ET-28
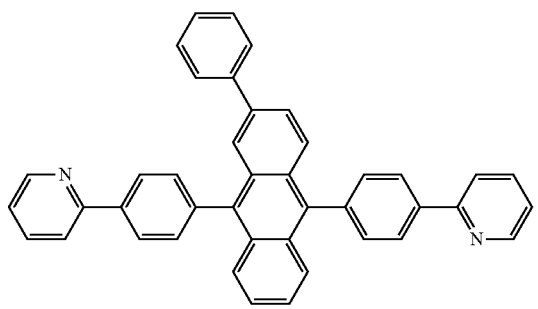
ET-29
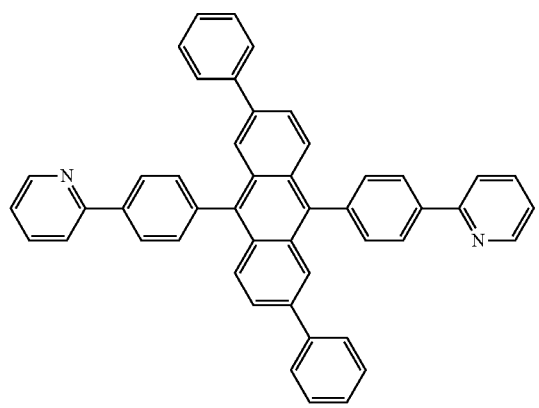
ET-30
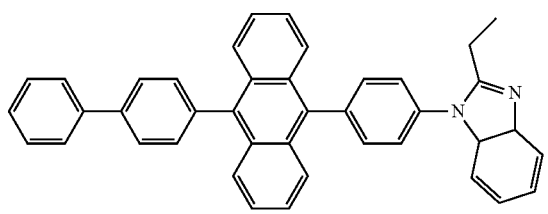
ET-31
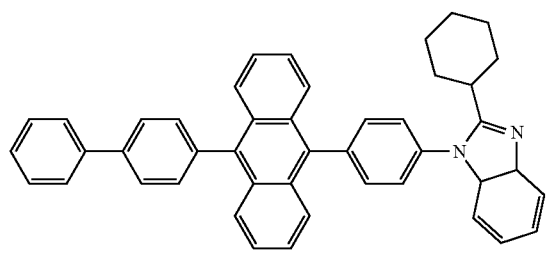
ET-32
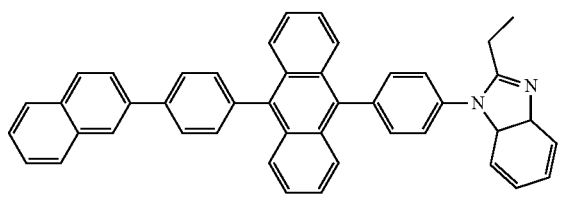
ET-33
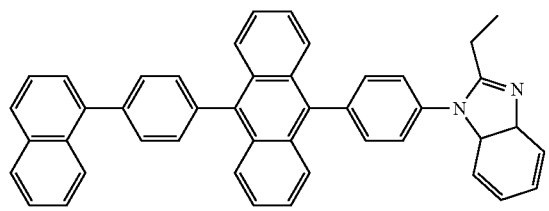
ET-34
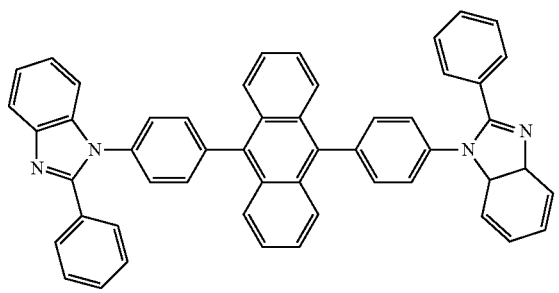

-continued
ET-35
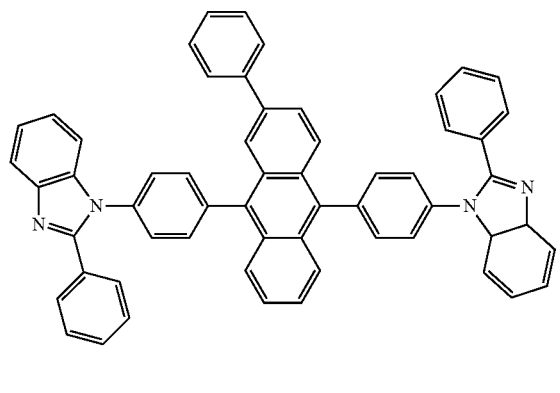
ET-36
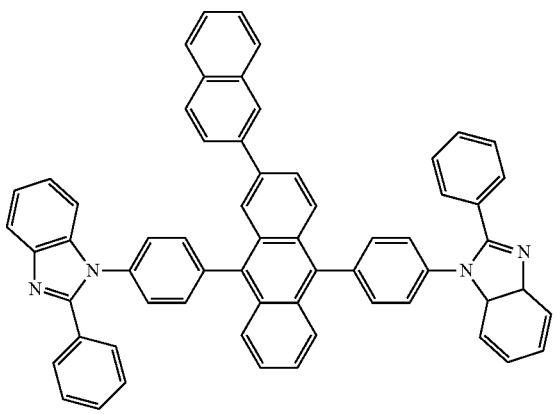
ET-37
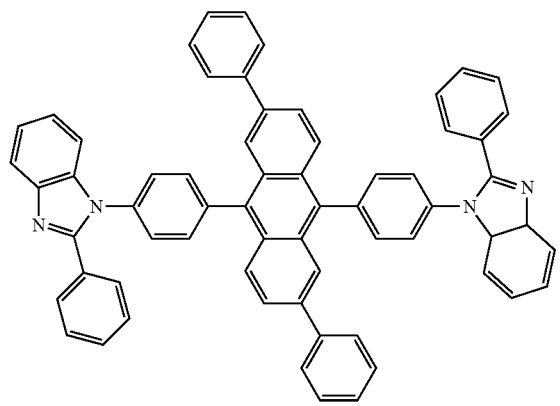
ET-38
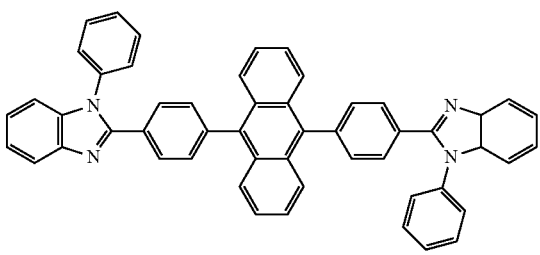
ET-39
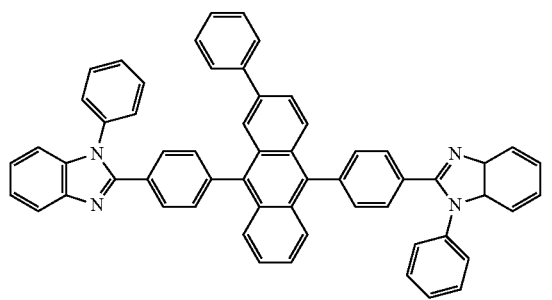
ET-40
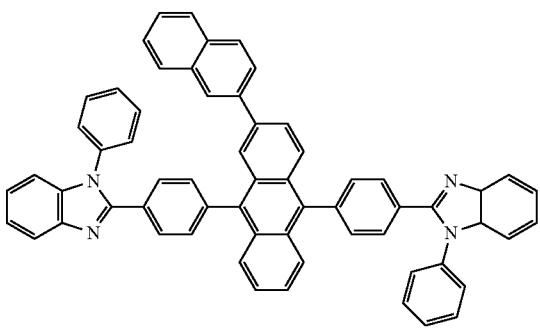

-continued
ET-41
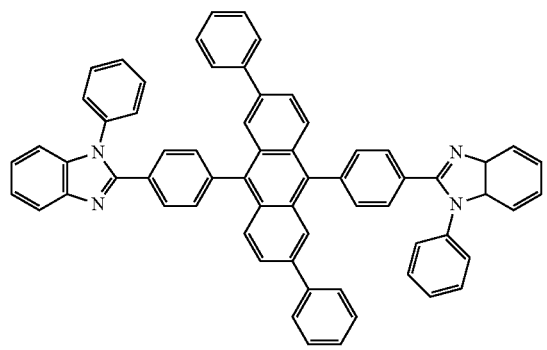
ET-42
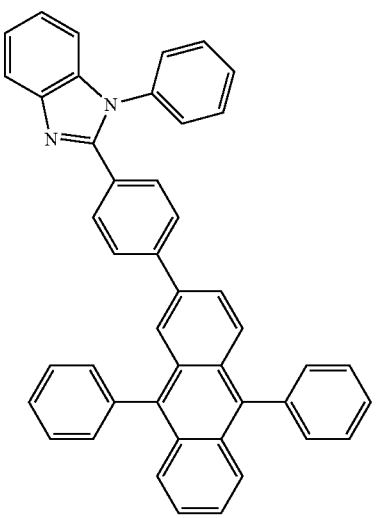
ET-43
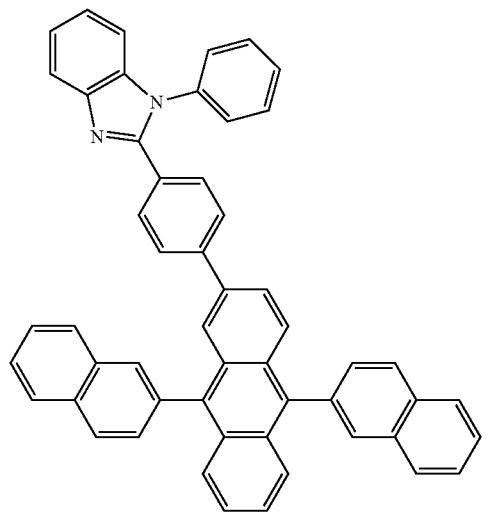
ET-44
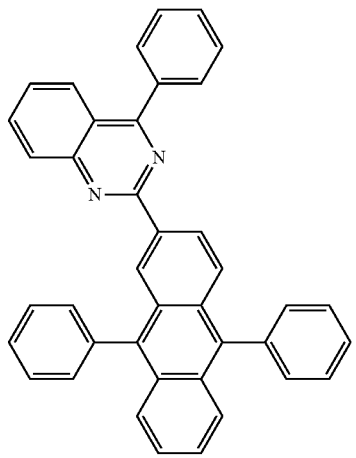
ET-45
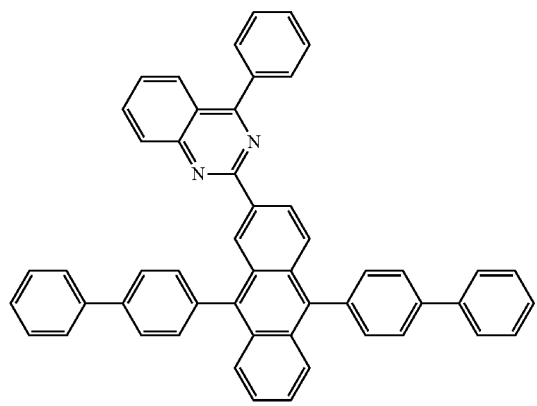
ET-46
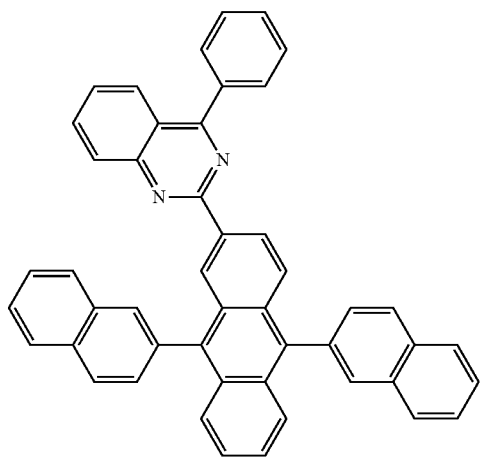

-continued
ET-47
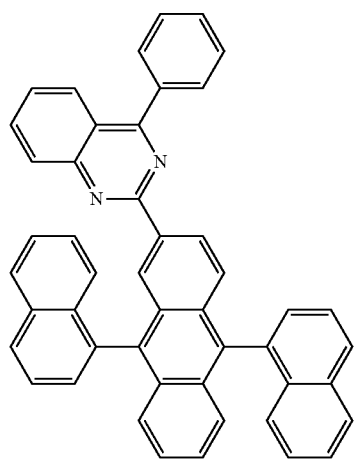
ET-48
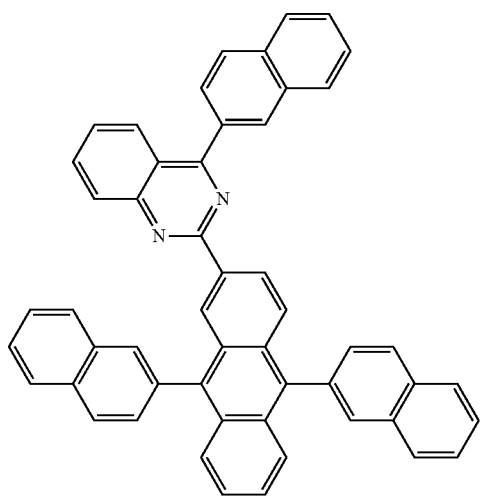
ET-49
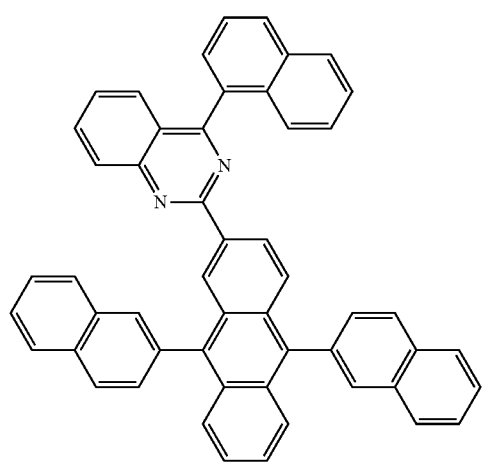
ET-50
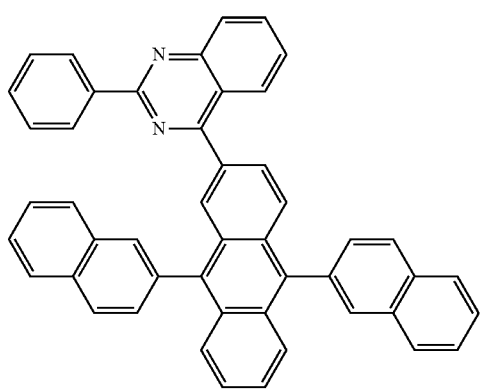
ET-51
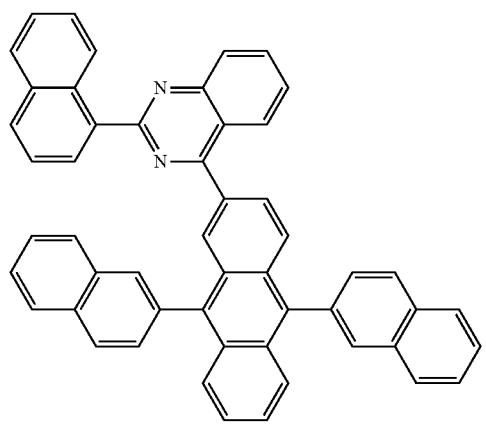
ET-52
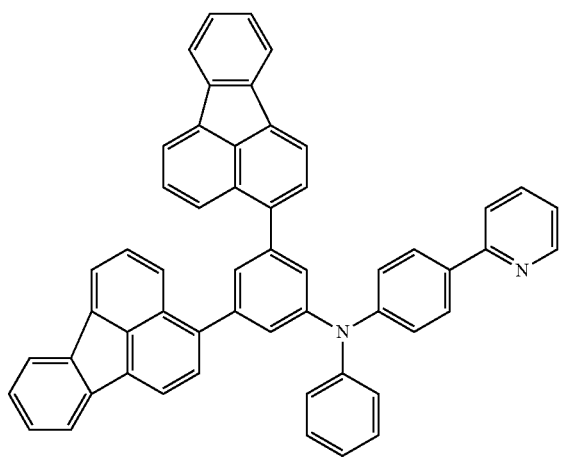

ET-53

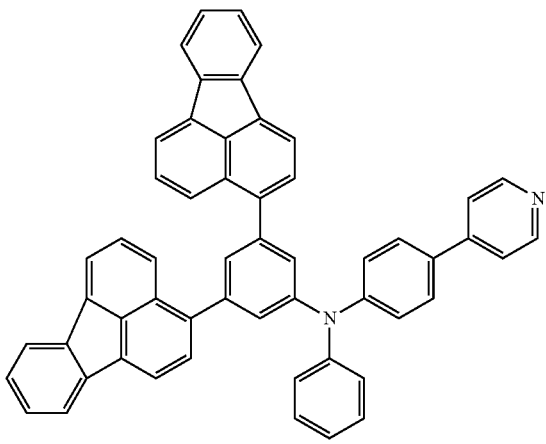

ET-54

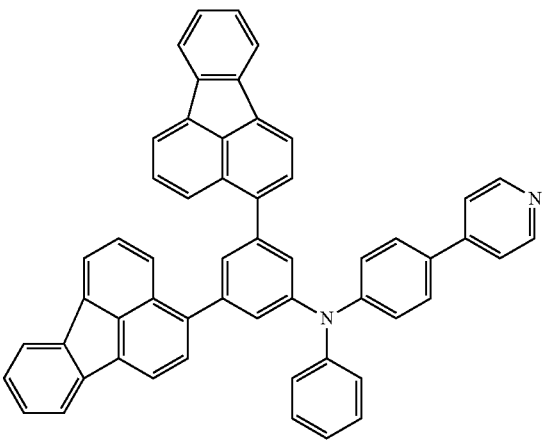

ET-55

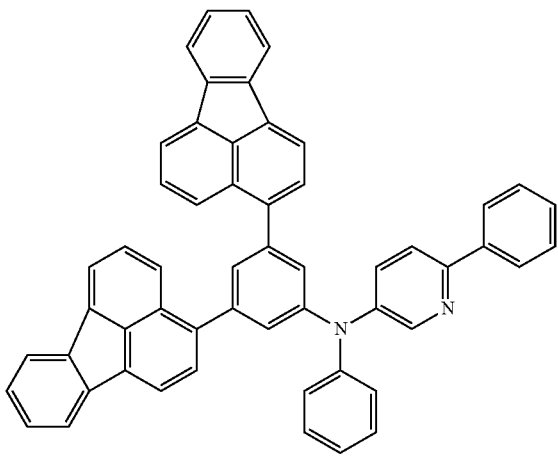

ET-56

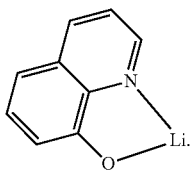

ET-57

The structure of the light emitting device may further include an electron injecting layer located between the electron transporting layer and the cathode 6, and the material of the electron injecting layer includes, but is not limited to, one or a combination of more of listed below.

LiQ, LiF, NaCl, CsF, $Li_2O$, $Cs_2CO_3$, BaO, Na, Li, Ca.

The thicknesses of each of the above-mentioned layers may use the conventional thicknesses of these layers in the art.

The present application also provides a method for preparing the organic electroluminescence device which, as illustrated in FIG. 1, includes a substrate 1, on which an anode 2, a hole transporting region 3, an organic light emitting layer 4, an electron transporting region 5 and a cathode 6 are deposited in sequence and then packaged. When the organic light emitting layer 4 is prepared, the organic light emitting layer 4 is formed by a method of a co-evaporation plating of a wide bandgap material source, a sensitizer material source, and a resonance TADF material source.

Specifically, the method for preparing the organic electroluminescence device of the present application includes:

1. sonicating a glass plate coated with an anode material in a commercial cleaning agent; rinsing in deionized water; ultrasonically degreasing in a mixed solvent of acetone: ethanol; baking in a clean environment to completely remove moisture content; cleaning with UV light and ozone; and bombarding the surface with a low-energy cationic beam;

2. placing the above glass plate with the anode in a vacuum chamber and evacuating until $1\times10^{-5}\sim9\times10^{-3}$ Pa, and performing the vacuum evaporation plating of a hole injecting layer onto the above anode layer film at an evaporation plating rate of 0.1.-0.5 nm/s;

3. performing the vacuum evaporation plating of a hole transporting layer onto the hole injecting layer at an evaporation plating rate of 0.1-0.5 nm/s;

4. performing the vacuum evaporation plating of an organic light emitting layer of the device onto the hole transporting layer, the organic light emitting layer including a host material, a sensitizer material, and a TADF dye. The evaporation plating rates of the host material, the sensitizer material and the dye are adjusted using a multi-source co-evaporation method so that the dye reaches a preset doping ratio;

5. performing the vacuum evaporation plating of an electron transporting layer material of the device onto the organic light emitting layer at an evaporation plating rate of 0.1-0.5 nm/s;

6. performing the vacuum evaporation plating of LiF onto the electron transporting layer as an electron injecting layer at an evaporation plating rate of 0.1-0.5 nm/s; and performing the vacuum evaporation plating of an Al layer as a cathode of the device at an evaporation plating rate of 0.5-1 nm/s.

An embodiment of the present application also provides a display apparatus which includes the organic electroluminescence device provided hereinabove. The display apparatus specifically may be display device, such as an OLED display, etc., and any product or component having a display function and including the display device, such as a television, a digital camera, a mobile phone, and a tablet computer, etc. The display apparatus has the same advantages as the above-mentioned organic electroluminescence device over the prior art, which will not be repeated herein.

Now, the organic electroluminescence device of the present application will be introduced further using specific embodiments.

Embodiment 1

The device structure of the present embodiment is:
ITO/HI-2 (10 nm)/HT-27 (40 nm)/W-7:20 wt % T-37:3 wt % M-3 (30 nm)/ET-53 (30 nm)/LiF (0.5 nm)/Al (150 nm)
where the anode is ITO; the material of the hole injecting layer is HI-2, wherein the overall thickness typically is 5-30 nm, or 10 nm in the present embodiment; the material of the hole transporting layer is HT-27, wherein the overall thickness typically is 5-50 nm, or 40 nm in the present embodiment; the host material of the organic light emitting layer is a wide bandgap material W-7; the sensitizer material is T-37 with a doping concentration of 20 wt %; the dye is a resonance TADF material M-3 with a doping concentration of 3 wt %; the thickness of the organic light emitting layer typically is 1-60 nm, or 30 nm in the present embodiment; the material of the electron transporting layer is ET-53, with typically 5-30 nm in thickness, or 30 nm in the present embodiment; the electron injection layer and the cathode material select LiF (0.5 nm) and metallic aluminum (150 nm).

In addition, the energy level difference $E_g$ between the HOMO energy level and the LUMO energy level of the host material, energy level difference $\Delta E_{ST}$ of the singlet state and triplet state of the sensitizer, and energy level difference $\Delta E_{ST}$ of the singlet state and triplet state of the resonance TADF dye are shown in Table 1.

Embodiment 2

The device structure of the present embodiment is:
ITO/HI-2 (10 nm)/HT-27 (40 nm)/W-7:15 wt % T-37:5 wt % M-8 (30 nm)/ET-53 (30 nm)/LiF (0.5 nm)/Al (150 nm)

Embodiment 3

The device structure of the present embodiment is:
ITO/HI-2 (10 nm)/HT-27 (40 nm)/W-7:8 wt % T-37:1 wt % M-10/ET-53 (30 nm)/LiF (0.5 nm)/Al (150 nm)

Embodiment 4

The device structure of the present embodiment is:
ITO/HI-2 (10 nm)/HT-27 (40 nm)/W-10:40 wt % T-16:3 wt % M-24/ET-53 (30 nm)/LiF (0 0.5 nm)/Al (150 nm)

Embodiment 5

The device structure of the present embodiment is:
ITO/HI-2 (10 nm)/HT-27 (40 nm)/W-10:25 wt % T-16:0.5 wt % M-28/ET-53 (30 nm)/LiF (0.5 nm)/Al (150 nm)

Embodiment 6

The device structure of the present embodiment is:
ITO/HI-2 (10 nm)/HT-27 (40 nm)/W-10:50 wt % T-16:5 wt % M-44/ET-53 (30 nm)/LiF (0 0.5 nm)/Al (150 nm)

Embodiment 7

The device structure of the present embodiment is:
ITO/HI-2 (10 nm)/HT-27 (40 nm)/W-45:15 wt % T-9:15 wt % M-54/ET-53 (30 nm)/LiF (0 0.5 nm)/Al (150 nm)

Embodiment 8

The device structure of the present embodiment is:
ITO/HI-2 (10 nm)/HT-27 (40 nm)/W-45:20 wt % T-9:3 wt % M-56/ET-53 (30 nm)/LiF (0. 5 nm)/Al (150 nm)

Embodiment 9

The device structure of the present embodiment is:
ITO/HI-2 (10 nm)/HT-27 (40 nm)/W-45:22 wt % T-9:5 wt % M-58/ET-53 (30 nm)/LiF (0. 5 nm)/Al (150 nm)

Embodiment 10

The device structure of the present embodiment is:
ITO/HI-2 (10 nm)/HT-27 (40 nm)/W-12:8 wt % T-17:7 wt % M-16/ET-53 (30 nm)/LiF (0. 5 nm)/Al (150 nm)

Embodiment 11

The device structure of the present embodiment is:
ITO/HI-2 (10 nm)/HT-27 (40 nm)/W-13:10 wt % T-25:13 wt % M-20/ET-53 (30 nm)/LiF (0.5 nm)/Al (150 nm)

Embodiment 12

The device structure of the present embodiment is:
ITO/HI-2 (10 nm)/HT-27 (40 nm)/W-15:15 wt % T-26:15 wt % M-28/ET-53 (30 nm)/LiF (0.5 nm)/Al (150 nm)

Embodiment 13

The device structure of the present embodiment is:
ITO/HI-2 (10 nm)/HT-27 (40 nm)/W-17:20 wt % T-28:8 wt % M-54/ET-53 (30 nm)/LiF (0.5 nm)/Al (150 nm)

Embodiment 14

The device structure of the present embodiment is:
ITO/HI-2 (10 nm)/HT-27 (40 nm)/W-34:25 wt % T-32:9 wt % M-56/ET-53 (30 nm)/LiF (0 0.5 nm)/Al (150 nm)

Embodiment 15

The device structure of the present embodiment is:
ITO/HI-2 (10 nm)/HT-27 (40 nm)/W-39:30 wt % T-69:10 wt % M-66/ET-53 (30 nm)/LiF (0.5 nm)/Al (150 nm)

Embodiment 16

The device structure of the present embodiment is:
ITO/HI-2 (10 nm)/HT-27 (40 nm)/W-43:35 wt % T-81:6 wt % M-71/ET-53 (30 nm)/LiF (0 0.5 nm)/Al (150 nm)

Comparative Example 1

The device structure of the present Comparative Example is:
ITO/HI-2 (10 nm)/HT-27 (40 nm)/W-45:0.5 wt % T-9:5 wt % M-71/ET-53 (30 nm)/LiF (0. 5 nm)/Al (150 nm)

Comparative Example 2

The device structure of the present Comparative Example is:
ITO/HI-2 (10 nm)/HT-27 (40 nm)/W-45:70 wt % T-9:5 wt % M-71/ET-53 (30 nm)/LiF (0. 5 nm)/Al (150 nm)

Comparative Example 3

The device structure of the present Comparative Example is:
ITO/HI-2 (10 nm)/HT-27 (40 nm)/W-45:15 wt % T-9:30 wt % M-71/ET-53 (30 nm)/LiF (0 0.5 nm)/Al (150 nm)

Comparative Example 4

The device structure of the present Comparative Example is:
ITO/HI-2 (10 nm)/HT-27 (40 nm)/W-7:15 wt % T-37/ET-53 (30 nm)/LiF (0.5 nm)/Al (15 0 nm)

Comparative Example 5

The device structure of the present Comparative Example is:
ITO/HI-2 (10 nm)/HT-27 (40 nm)/W-7:15 wt % M-8/ET-53 (30 nm)/LiF (0.5 nm)/Al (150 nm)

Comparative Example 6

The device structure of the present Comparative Example is:
ITO/HI-2 (10 nm)/HT-27 (40 nm)/W-10:15 wt % T-16/ET-53 (30 nm)/LiF (0.5 nm)/Al (1 50 nm)

Comparative Example 7

The device structure of the present Comparative Example is:
ITO/HI-2 (10 nm)/HT-27 (40 nm)/W-10:15 wt % M-28/ET-53 (30 nm)/LiF (0.5 nm)/Al (1 50 nm)

Comparative Example 8

The device structure of the present Comparative Example is:
ITO/HI-2 (10 nm)/HT-27 (40 nm)/W-45:15 wt % T-9/ET-53 (30 nm)/LiF (0.5 nm)/Al (15 0 nm)

Comparative Example 9

The device structure of the present Comparative Example is:
ITO/HI-2 (10 nm)/HT-27 (40 nm)/W-45:15 wt % M-58/ET-53 (30 nm)/LiF (0.5 nm)/Al (1 50 nm)

TABLE 1

|  | $E_g$ of the host material | $\Delta E_{ST}$ of the sensitizer | $\Delta E_{ST}$ of the resonance TADF |
|---|---|---|---|
| Embodiment 1 | 4.1 eV | 0.01 eV | 0.09 eV |
| Embodiment 2 | 4.1 eV | 0.01 eV | 0.11 eV |
| Embodiment 3 | 4.1 eV | 0.01 eV | 0.18 eV |
| Embodiment 4 | 3.6 eV | 0.26 eV | 0.16 eV |
| Embodiment 5 | 3.6 eV | 0.26 eV | 0.19 eV |
| Embodiment 6 | 3.6 eV | 0.26 eV | 0.21 eV |
| Embodiment 7 | 4.0 eV | 0.15 eV | 0.21 eV |
| Embodiment 8 | 4.0 eV | 0.15 eV | 0.20 eV |
| Embodiment 9 | 4.0 eV | 0.15 eV | 0.20 eV |
| Embodiment 10 | 3.8 eV | 0.18 eV | 0.22 eV |
| Embodiment 11 | 4.0 eV | 0.11 eV | 0.11 eV |
| Embodiment 12 | 1 3.7 eV | 0.20 eV | 0.19 eV |
| Embodiment 13 | 3.9 eV | 0.17 eV | 0.21 eV |
| Embodiment 14 | 4.2 eV | 0.10 eV | 0.20 eV |
| Embodiment 15 | 4.1 eV | 0.20 eV | 0.14 eV |
| Embodiment 16 | 3.5 eV | 0.15 eV | 0.12 eV |
| Comparative Example 1 | 4.0 eV | 0.15 eV | 0.12 eV |
| Comparative Example 2 | 4.0 eV | 0.15 eV | 0.12 eV |
| Comparative Example 3 | 4.0 eV | 0.15 eV | 0.12 eV |

Test Examples

1. The following performance tests are performed on the organic electroluminescence device prepared by the above process (Embodiments 1-16, and Comparative Examples 1-9): the prepared and obtained the characteristic, such as current, voltage, brightness, light emitting spectrum, current efficiency and external quantum efficiency, etc., of the device are tested synchronously using a PR 655 spectral scanning luminance meter and a Keithley K 2400 digital source meter system, and the service life is tested using an MC-6000.

2. The service life of LT90 is tested as follows: setting different test brightness levels to derive a brightness-service life decay curve for the organic electroluminescence device, so as to obtain the value of the service life of the device at the required decay brightness. That is, setting the test brightness level to 5000 cd/m2, maintaining a constant current, and measuring the time for the brightness of the organic electroluminescence device to drop to 4500 cd/m2 in hours.

The above specific test results are shown in Table 2.

TABLE 2

| | Host material | Sensitizer and doping concentration | Dye and doping concentration | Max external quantum efficiency/ 100% | External quantum efficiency/ 100% at 5000 cd/m² | Efficiency roll-off | Half-peak width | LT90[2]/ h |
|---|---|---|---|---|---|---|---|---|
| Embodiment 1 | W-7 | 20 wt % T-37 | 3 wt % M-3 | 22.2 | 20.7 | 6.8% | 35 | 32 |
| Embodiment 2 | W-7 | 15 wt % T-37 | 5 wt % M-8 | 21.8 | 19.5 | 10.6% | 35 | 35 |
| Embodiment 3 | W-7 | 8 wt % T-37 | 1 wt % M-10 | 18.9 | 16.8 | 11.1% | 36 | 38 |
| Embodiment 4 | W-10 | 40 wt % T-16 | 3 wt % M-24 | 20.2 | 19.5 | 3.5% | 30 | 42 |
| Embodiment 5 | W-10 | 25 wt % T-16 | 0.5 wt % M-28 | 19.4 | 18.0 | 7.2% | 38 | 50 |
| Embodiment 6 | W-10 | 50 wt % T-16 | 5 wt % M-44 | 23.2 | 20.1 | 13.4% | 42 | 65 |
| Embodiment 7 | W-45 | 15 wt % T-9 | 15 wt % M-54 | 19.9 | 18.2 | 8.5% | 40 | 45 |
| Embodiment 8 | W-45 | 20 wt % T-9 | 3 wt % M-56 | 22.8 | 19.7 | 13.6% | 35 | 43 |
| Embodiment 9 | W-45 | 22 wt % T-9 | 5 wt % M-58 | 18.5 | 17.2 | 7.0% | 36 | 38 |
| Embodiment 10 | W-12 | 8 wt % T-17 | 7 wt % M-16 | 19.3 | 17.2 | 11.1% | 36 | 35 |
| Embodiment 11 | W-13 | 10 wt % T-25 | 13 wt % M-20 | 19.6 | 17.7 | 9.8% | 38 | 42 |
| Embodiment 12 | W-15 | 15 wt % T-26 | 15 wt % M-28 | 19 | 17.0 | 10.3% | 39 | 44 |
| Embodiment 13 | W-17 | 20 wt % T-28 | 8 wt % M-54 | 20.3 | 18.5 | 8.9% | 39 | 50 |
| Embodiment 14 | W-34 | 25 wt % T-32 | 9 wt % M-56 | 21.4 | 19.4 | 9.2% | 38 | 52 |
| Embodiment 15 | W-39 | 30 wt % T-69 | 10 wt % M-66 | 19.8 | 17.6 | 11.3% | 38 | 48 |
| Embodiment 16 | W-43 | 35 wt % T-81 | 6 wt % M-71 | 18.7 | 16.4 | 12.1% | 36 | 45 |
| Comparative Example 1 | W-45 | 0.5 wt % T-9 | 5 wt % M-71 | 18.7 | 15.3 | 17.9% | 35 | 20 |
| Comparative Example 2 | W-45 | 70 wt % T-9 | 5 wt % M-71 | 19.2 | 16.5 | 14.1% | 36 | 18 |
| Comparative Example 3 | W-45 | 15 wt % T-9 | 30 wt % M-71 | 18.1 | 14.2 | 21.5% | 36 | 20 |
| Comparative Example 4 | W-7 | / | 15 wt % T-37 | 17.5 | 13.4 | 23.4% | 80 | 0.05 |
| Comparative Example 5 | W-7 | / | 15 wt % M-8 | 18.6 | 13.5 | 27.4% | 35 | 10 |
| Comparative Example 6 | W-10 | / | 15 wt % T-16 | 20.1 | 16.3 | 18.9% | 78 | 0.2 |
| Comparative Example 7 | W-10 | / | 15 wt % M-28 | 21.2 | 15.6 | 26.4% | 38 | 5.5 |
| Comparative Example 8 | W-45 | / | 15 wt % T-9 | 20.1 | 12.5 | 37.8% | 66 | 0.5 |
| Comparative Example 9 | W-45 | / | 15 wt % M-58 | 19.7 | 13.1 | 33.5% | 36 | 12 |

As can be known from Table 2:

1. compared with Comparative Examples 1-9, the technical solution provided in the present application, i.e., when the organic light emitting layer is a wide bandgap material as a host material, traditional TADF as a sensitizer, and resonance TADF as a dye, the organic electroluminescence device has a low efficiency roll-off at high brightness, a narrow half-peak width and good color purity. Meanwhile, the device has a longer service life, providing overall characteristics that significantly outperform those of the Comparative Examples 1-9;

2. in the Comparative Examples 4/6/8 where a wide bandgap host is sensitized by an ordinary TADF dye to emit light, the efficiency roll-off is severe at high brightness, the half-peak width is wide, the color purity is poor, and the service life is short. In Comparative Examples 5/7/9 where a wide bandgap host is sensitized by a resonance TADF dye to emit light, the efficiency roll-off is severe at high brightness and the service life is short, but the half-peak width is narrower. Therefore, when resonance TADF dye is used to emit light, the spectrum can be effectively narrowed;

3. according to the comparison between the Embodiments 1-16 and Comparative Examples 1-3, it can be known that, in the present application, a percentage of the sensitizer material in the organic light emitting layer is 1 wt %-60 wt %, a percentage of the wide bandgap material in the organic light emitting layer is 20 wt %-98.9 wt %, and a percentage of the resonance thermally activated delayed fluorescent material in the organic light emitting layer is 0.1 wt %-20 wt %. The device has superior performance in roll-off, service life, and peak width.

The foregoing embodiments are merely intended for describing, rather than limiting, the technical solutions of the present application. Although the present application has been described in detail with reference to the foregoing embodiments, those of ordinary skill in the art should understand that they may still make modifications to the technical solutions described in the foregoing embodiments, or make equivalent replacements to some or all technical features therein. However, such modifications or replacements do not make the essence of corresponding technical solutions depart from the scope of the technical solutions in the embodiments of the present application.

The invention claimed is:

1. An organic electroluminescence device, comprising: an organic light emitting layer, wherein the organic light emitting layer comprises a host material, a sensitizer material, and a resonance thermally activated delayed fluorescent material;
the host material is a wide bandgap material;
the sensitizer material is a thermally activated delayed fluorescent material; and
a singlet state energy level for the wide bandgap material is greater than a singlet state energy level for the sensitizer material, and a triplet state energy level for the wide bandgap material is greater than a triplet state energy level for the sensitizer material; and a singlet state energy level for the sensitizer material is greater than a singlet state energy level for the resonance thermally activated delayed fluorescent material, and a triplet state energy level for the sensitizer material is greater than a triplet state energy level for the resonance thermally activated delayed fluorescent material.

2. The organic electroluminescence device according to claim 1, wherein the resonance thermally activated delayed fluorescent material has a structure represented by Formula [1]:

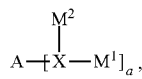

Formula [1]

wherein X is independently selected from one of B, P, P=O, P=S, $SiR_1$; $R_1$ is selected from hydrogen, substituted or unsubstituted $C_1$-$C_{36}$ alkyl, substituted or unsubstituted $C_6$-$C_{30}$ aryl, substituted or unsubstituted $C_3$-$C_{30}$ heteroaryl;
A is selected from substituted or unsubstituted $C_6$-$C_{30}$ aryl, substituted or unsubstituted $C_3$-$C_{30}$ heteroaryl, substituted or unsubstituted $C_6$-$C_{30}$ arylamino;
$M^1$ and $M^2$ are each independently selected from H, substituted or unsubstituted $C_1$-$C_{36}$ alkyl, substituted or unsubstituted $C_6$-$C_{30}$ aryl, substituted or unsubstituted $C_3$-$C_{30}$ heteroaryl;
at least three of adjacent X, A, $M^1$ and $M^2$ are joined into a ring that comprises X;
a is an integer from 1 to 12;
when a substituent is presented in the above group, the substituent is individually and independently selected from one or more of halogen, cyano, $C_1$-$C_{10}$ alkyl, $C_2$-$C_6$ alkenyl, $C_1$-$C_6$ alkoxy or thioalkoxy, $C_6$-$C_{30}$ aryl and $C_3$-$C_{30}$ heteroaryl.

3. The organic electroluminescence device according to claim 2, wherein three of adjacent X, A, $M^1$ and $M^2$ are joined into a hexatomic ring comprising two heteroatoms; and
the heteroatoms are selected from two of B, P, Si, O, S, N, and Se.

4. The organic electroluminescence device according to claim 3, wherein the resonance thermally activated delayed fluorescent material has a molecular mass of 200-2000.

5. The organic electroluminescence device according to claim 4, wherein a is an integer from 1 to 6.

6. The organic electroluminescence device according to claim 3, wherein the resonance thermally activated delayed fluorescent material is a compound having one of the following general formulas:

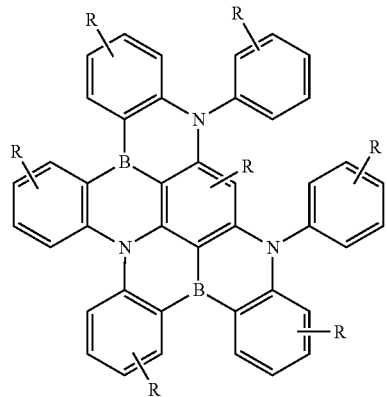

F-1

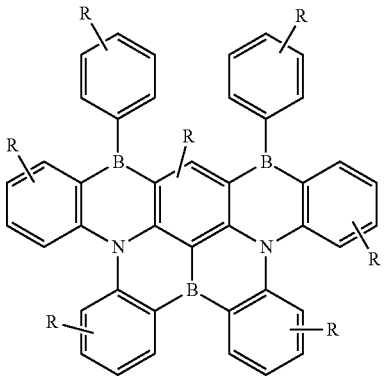

F-2

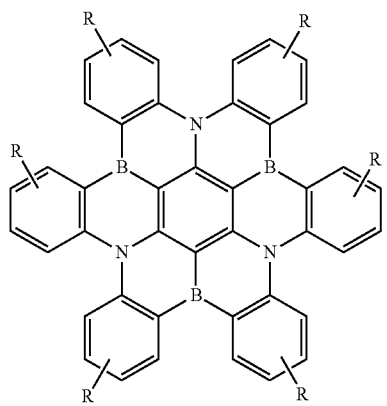

F-3

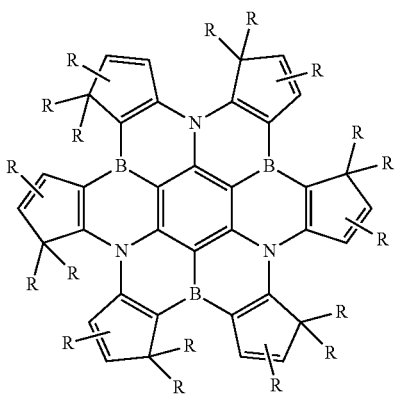

F-4

-continued
F-5
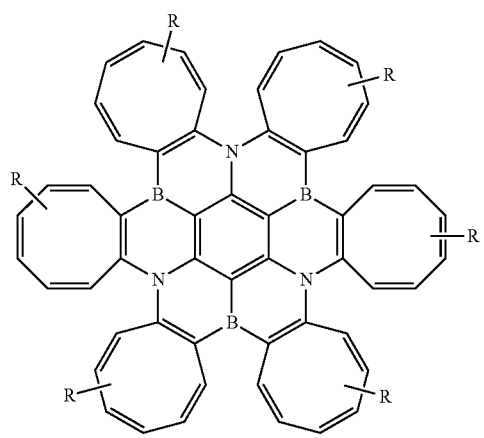
F-6
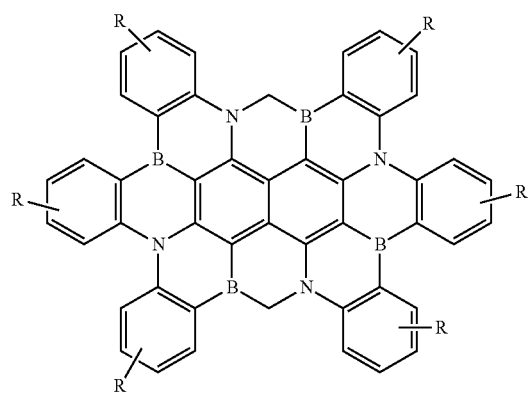
F-7
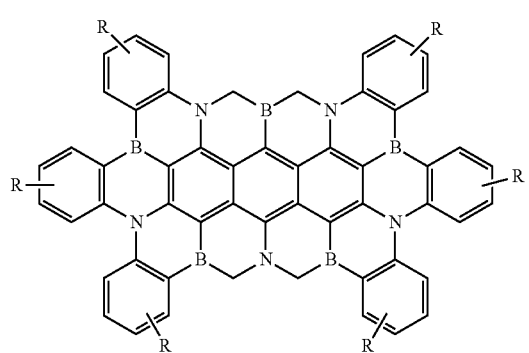
F-8
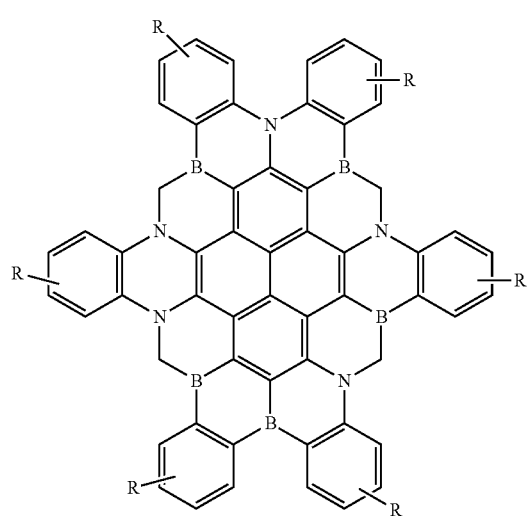
F-9
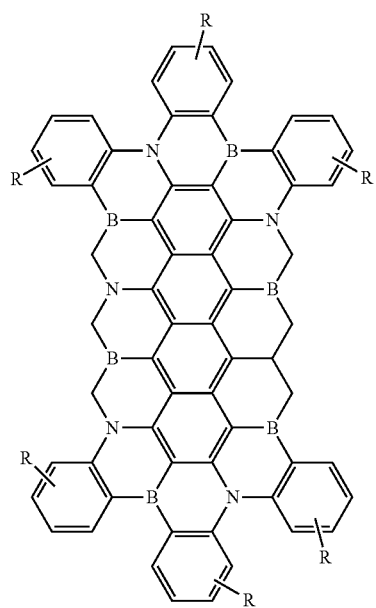
F-10
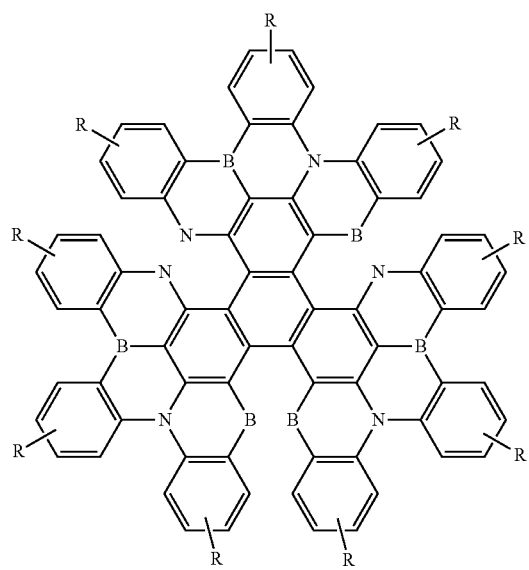

-continued
F-11
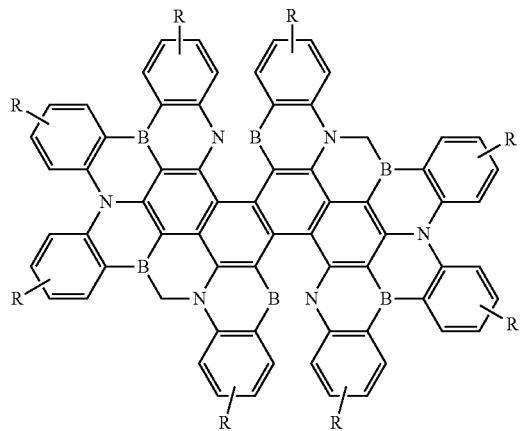
F-12
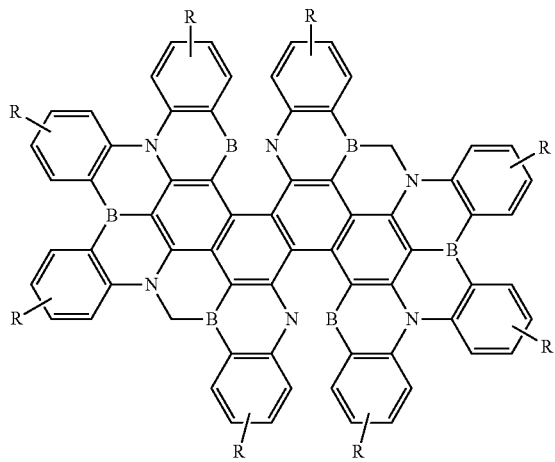
F-13
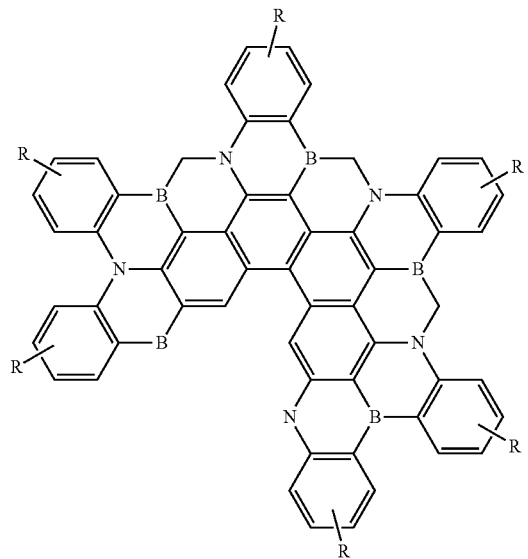
F-14
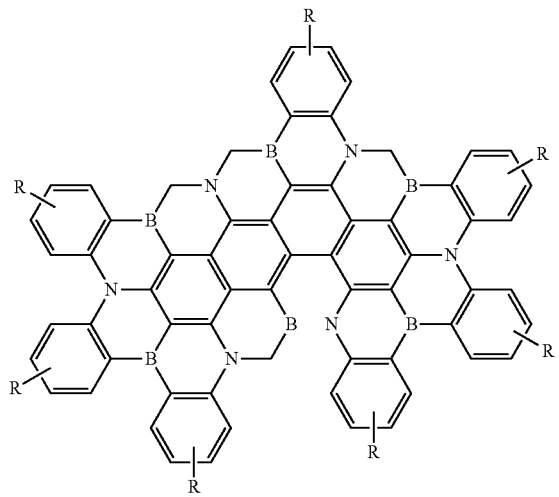
F-15
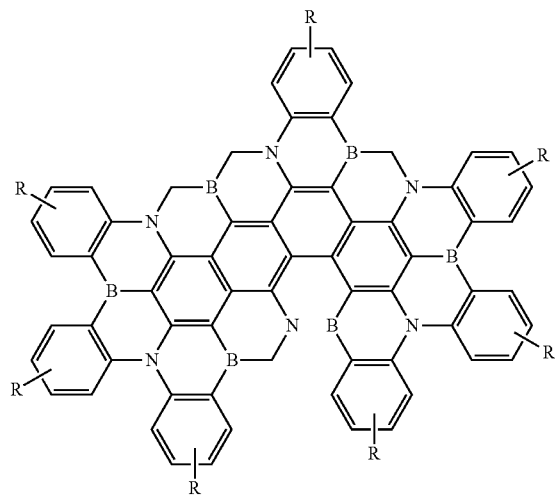
F-16
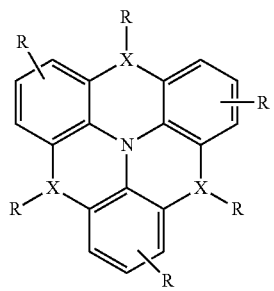

-continued
F-17
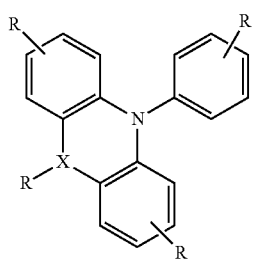
F-18
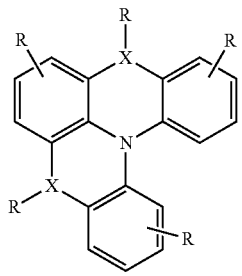
F-19
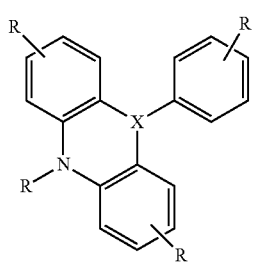
F-20
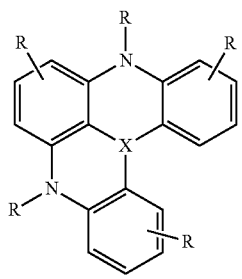
F-21
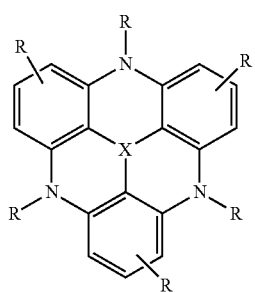
F-22
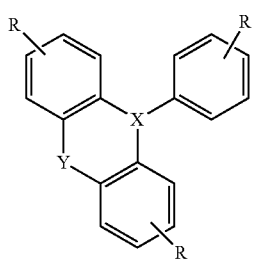
F-23
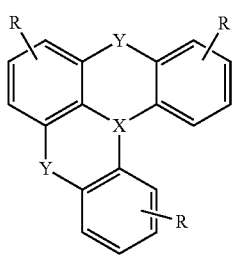
F-24
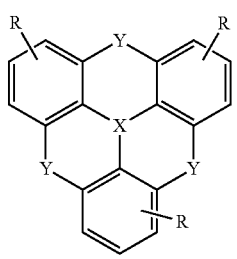
F-25
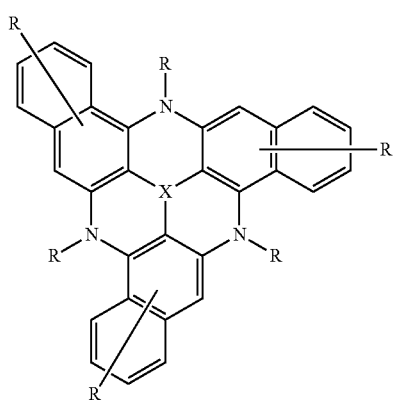
F-26
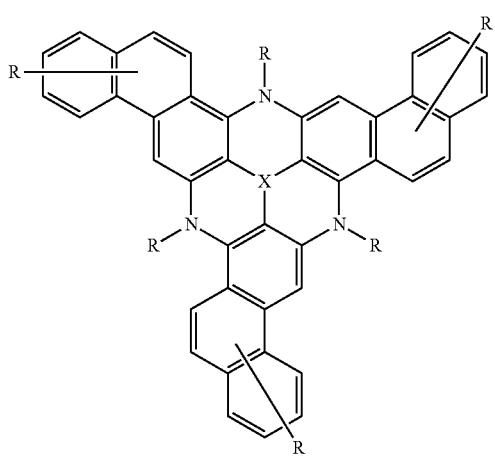

-continued

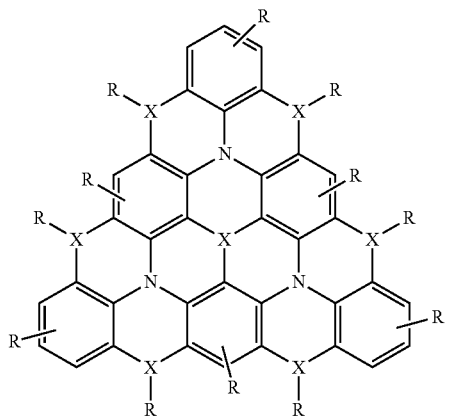
F-27

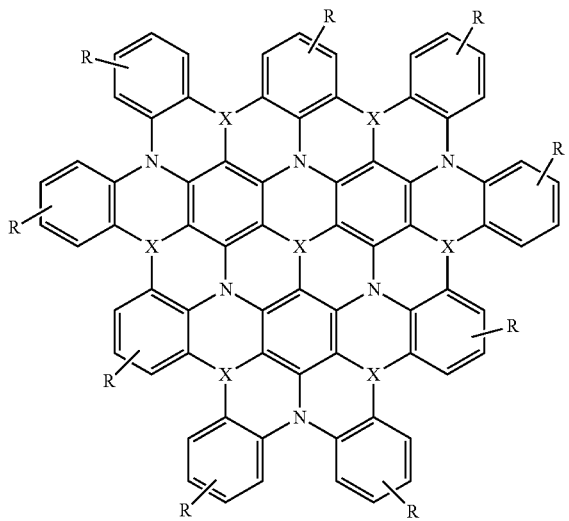
F-28

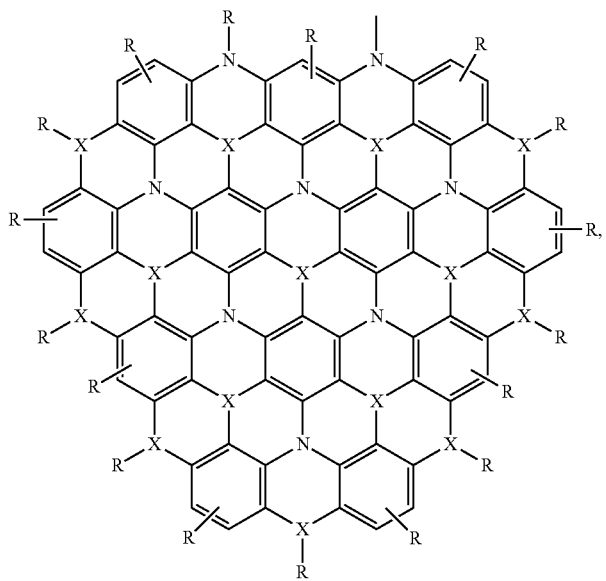
F-29 where R is individually and independently selected from one or more of hydrogen, halogen, cyano, $C_1$-$C_{10}$ alkyl, $C_2$-$C_6$ alkenyl, $C_1$-$C_6$ alkoxy or thioalkoxy, $C_6$-$C_{30}$ aryl and $C_3$-$C_{30}$ heteroaryl; and
Y is independently selected from O, S, and Se.

7. The organic electroluminescence device according to claim 6, wherein the resonance thermally activated delayed fluorescent material is a compound having one of the following structures:

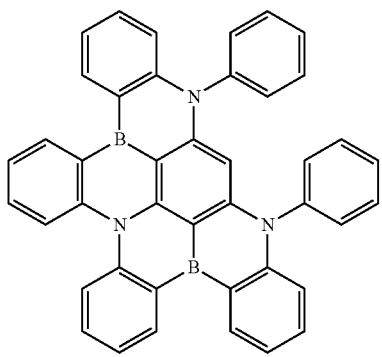
M-1

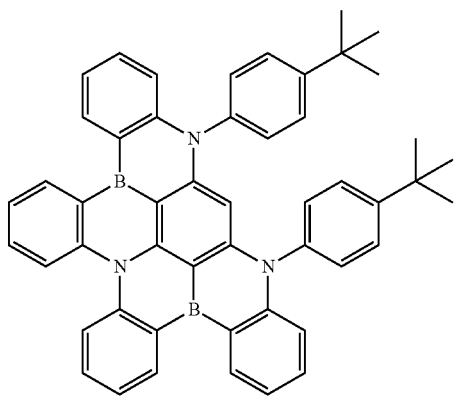
M-2

-continued
M-3
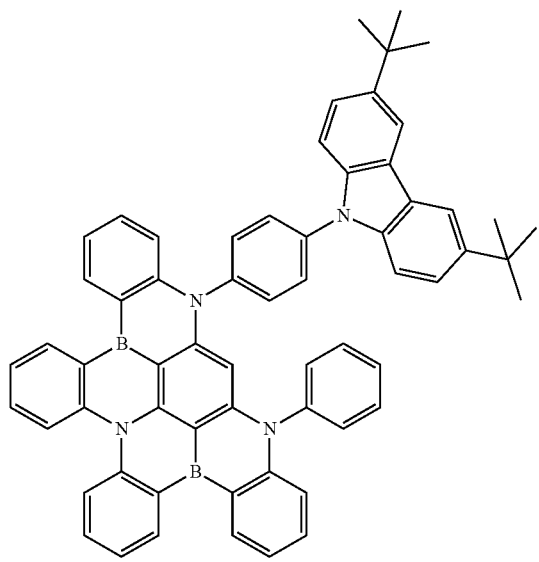
M-4
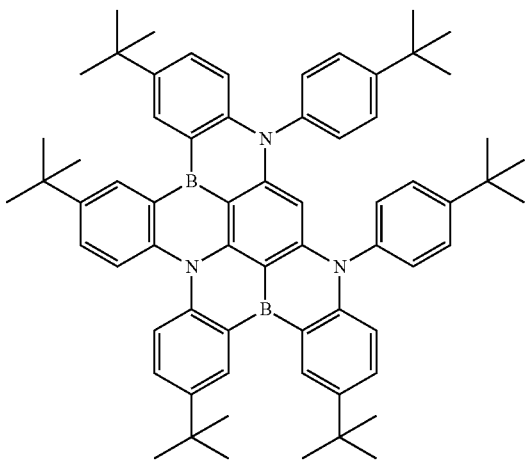
M-5
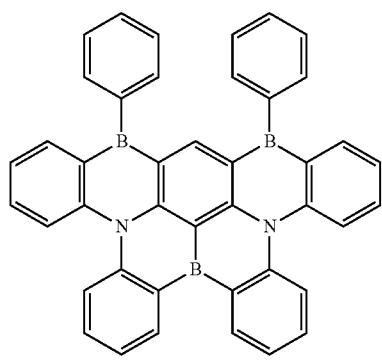
M-6
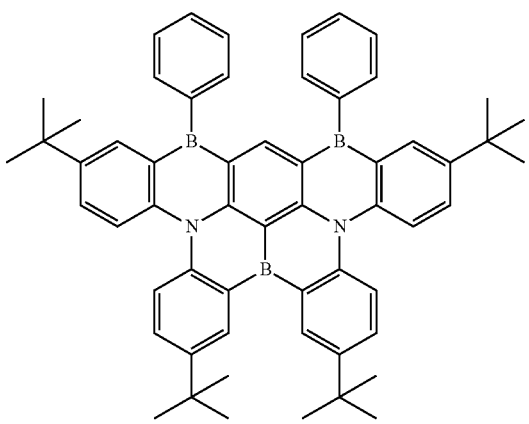
M-7
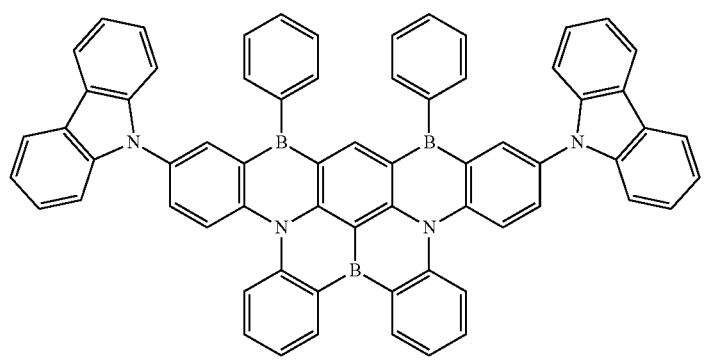

M-8
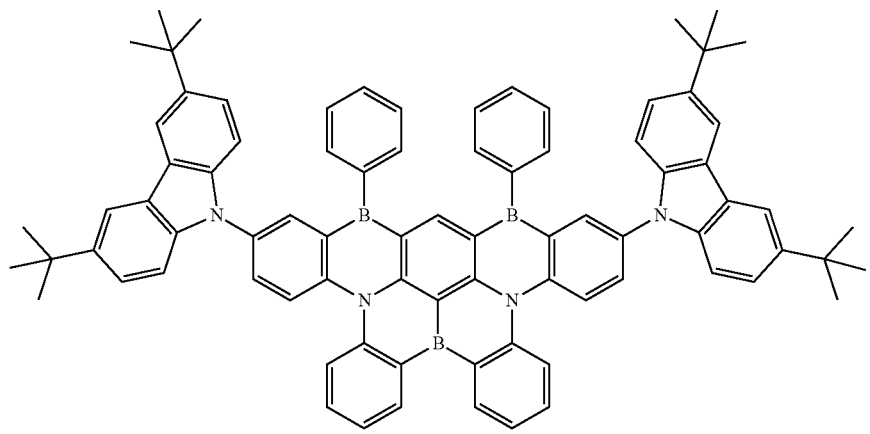
M-9
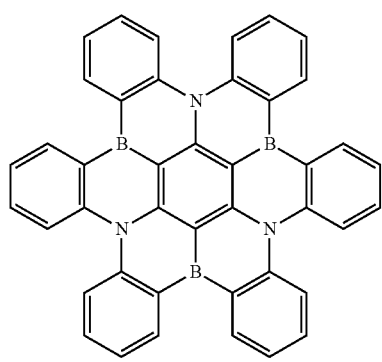
M-10
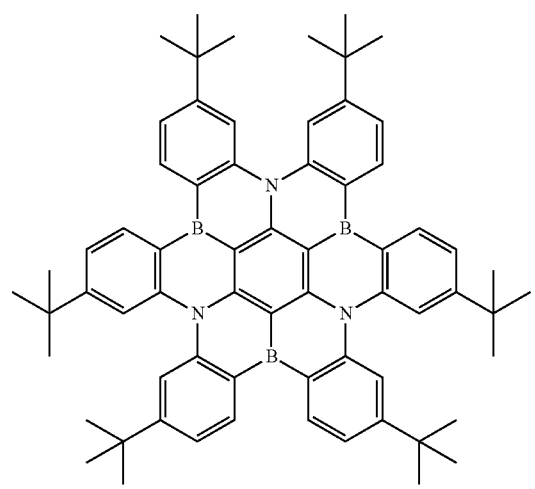
M-11
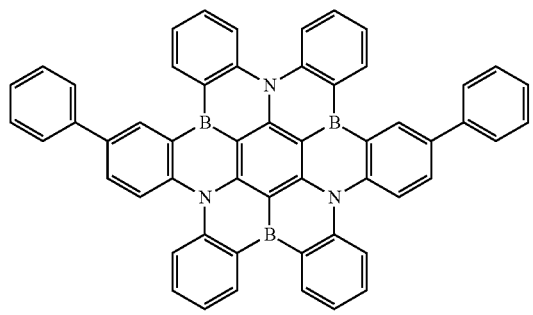
M-12
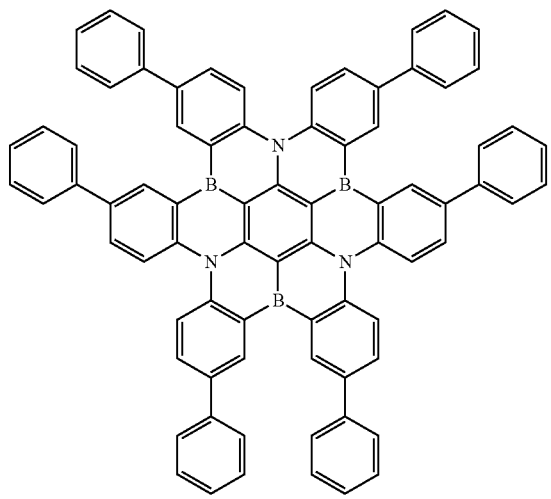

-continued
M-13
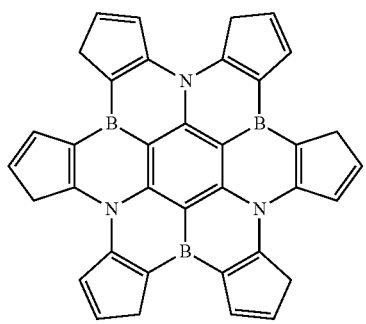
M-14
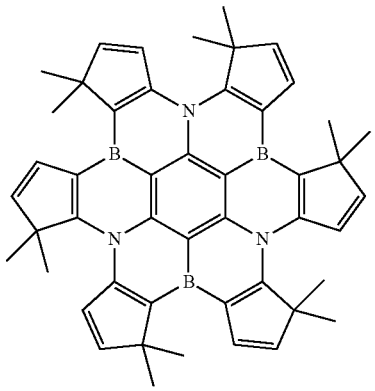
M-15
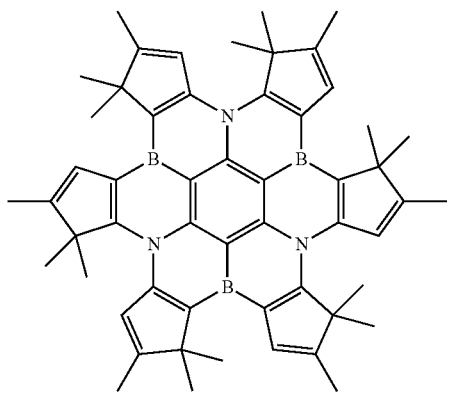
M-16
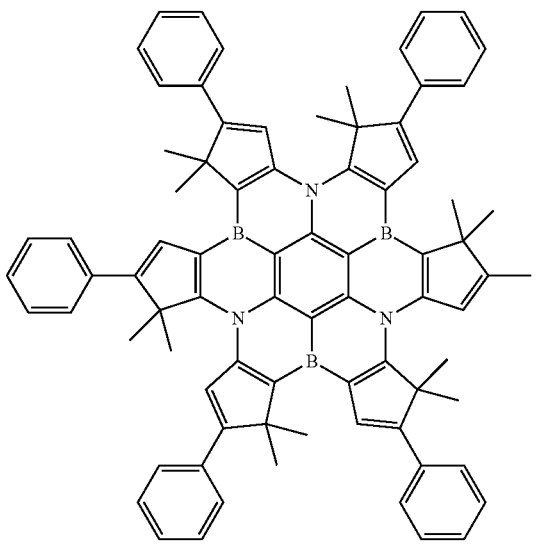
M-17
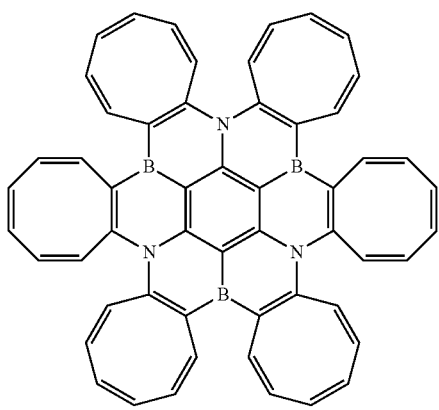
M-18
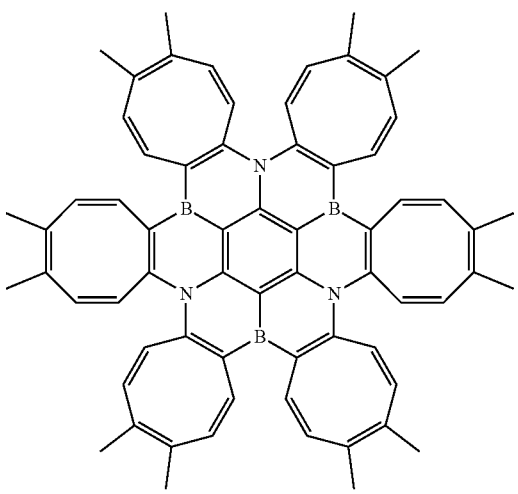

-continued
M-19
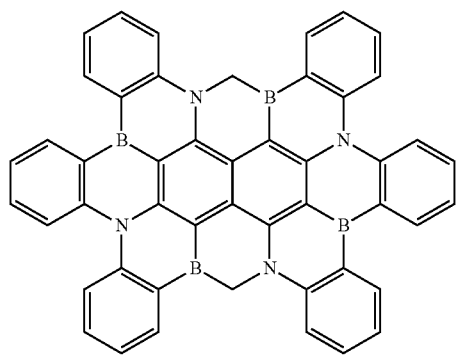
M-20
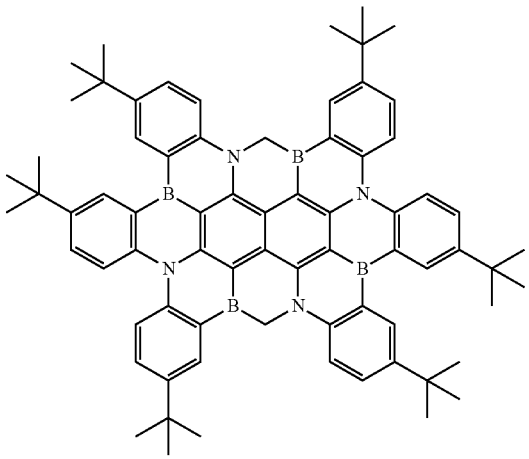
M-21
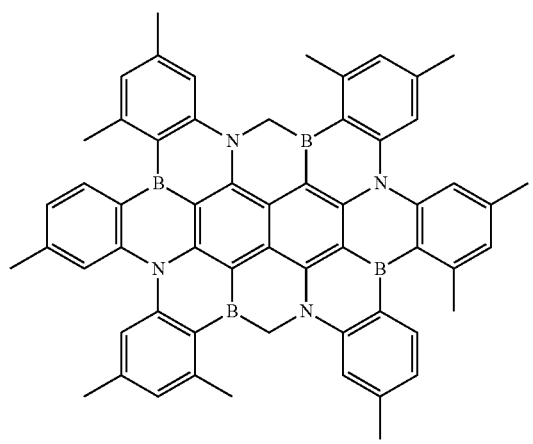
M-22
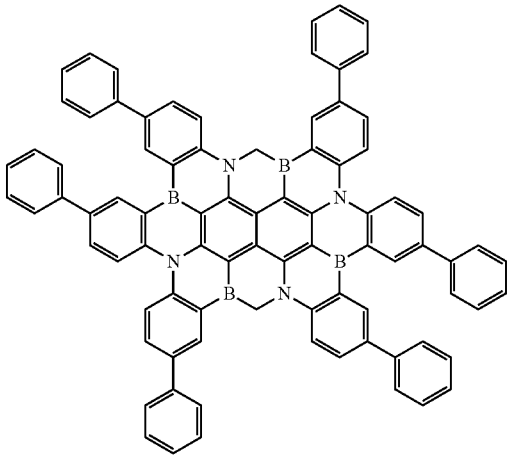
M-23
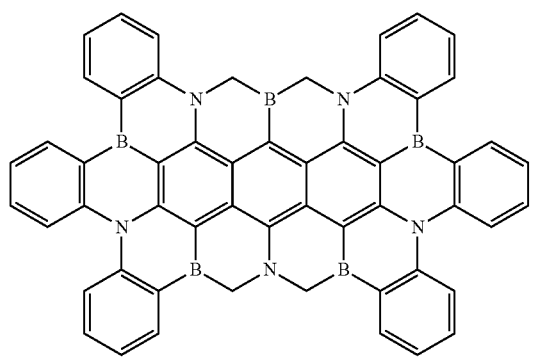
M-24
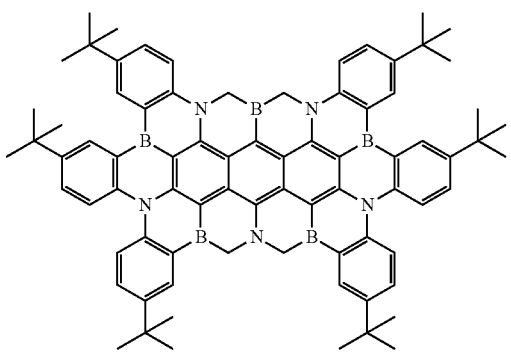

-continued
M-25
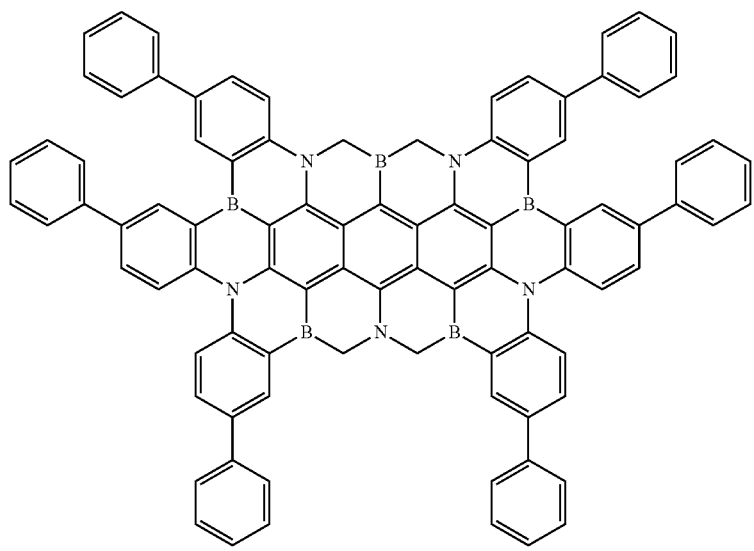
M-26
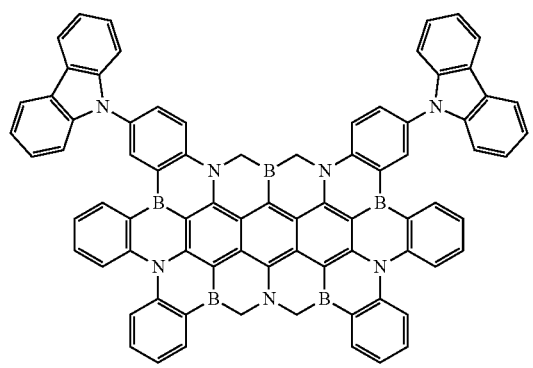
M-27
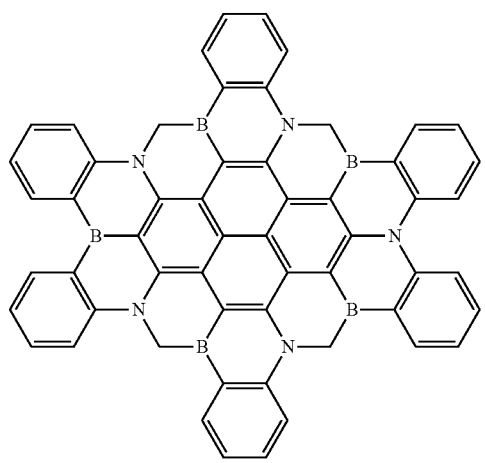
M-28
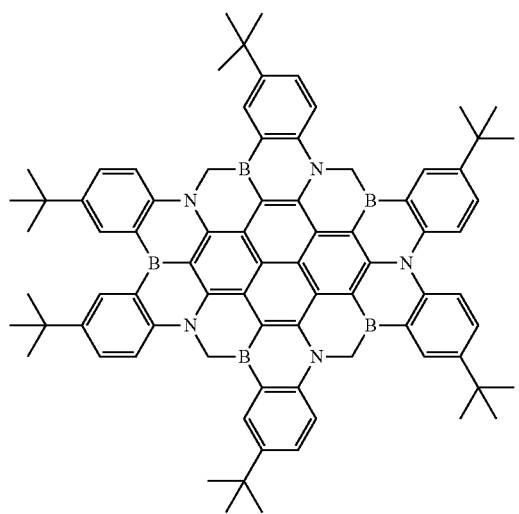
M-29
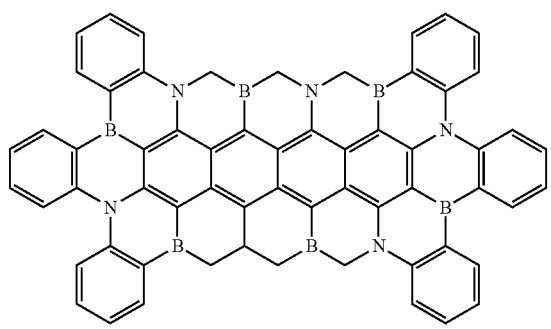

M-30
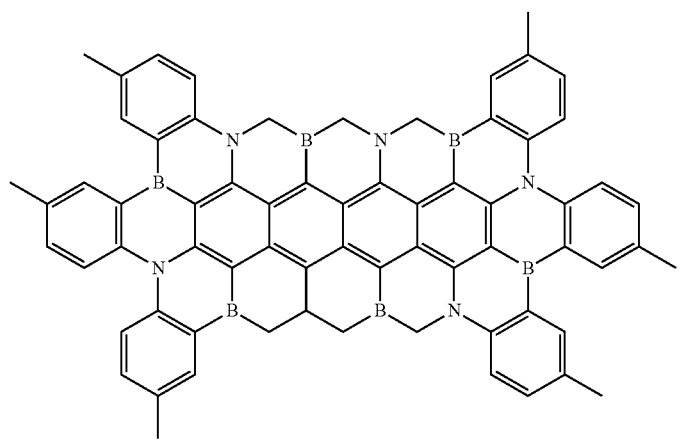
M-31
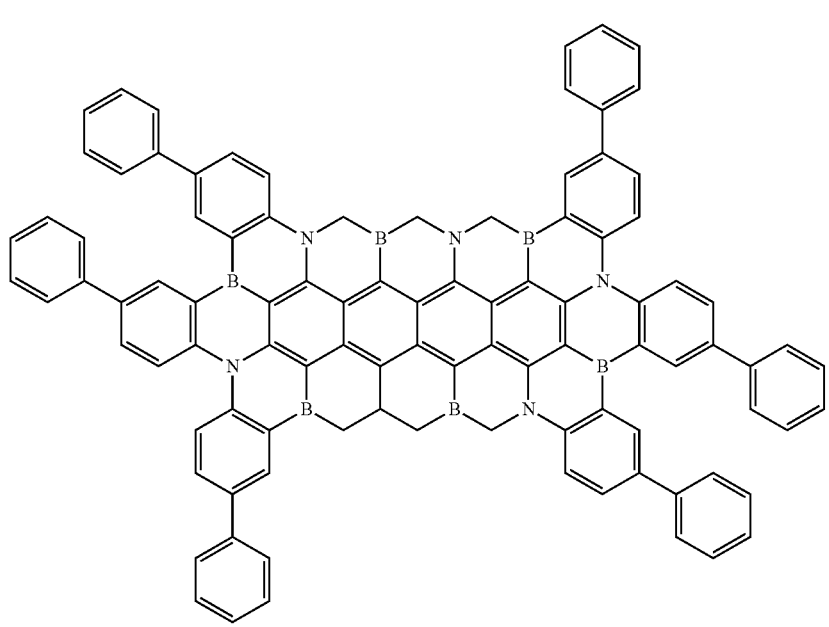
M-32
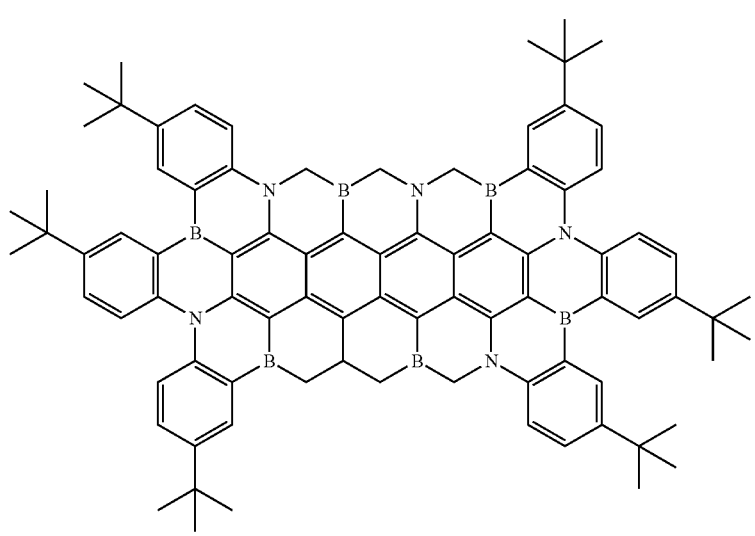

-continued
M-33
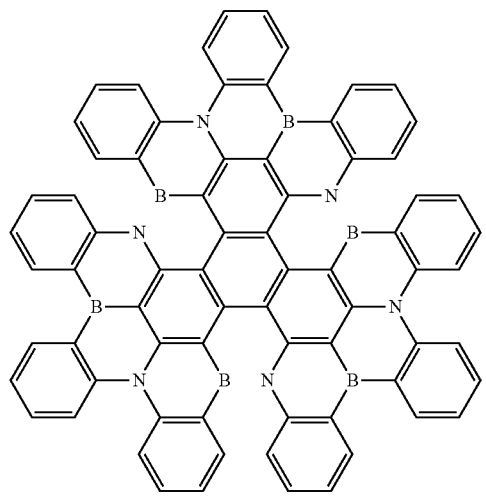
M-34
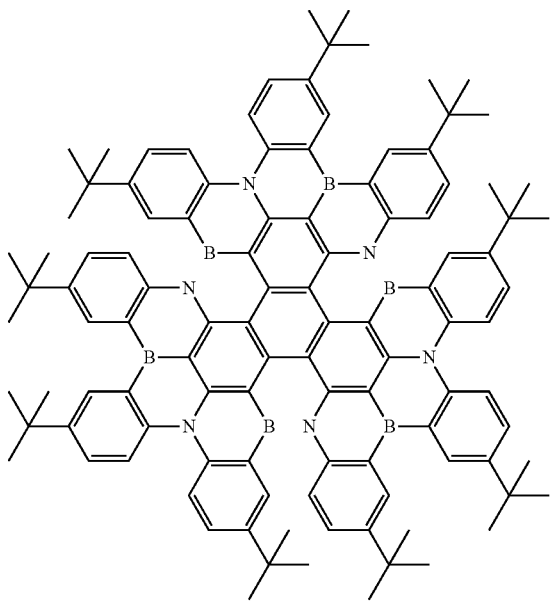
M-35
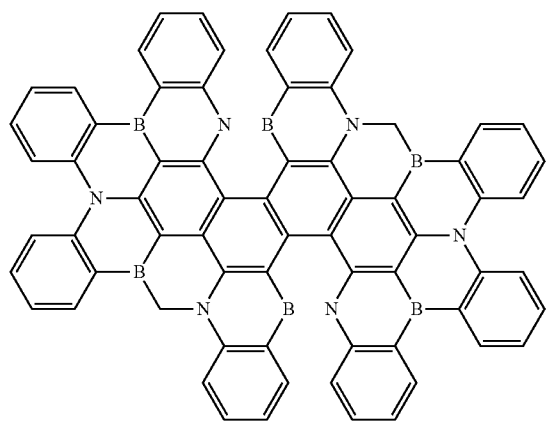
M-36
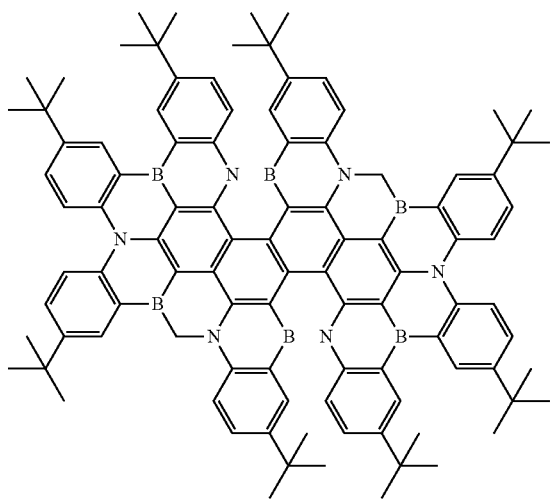
M-37
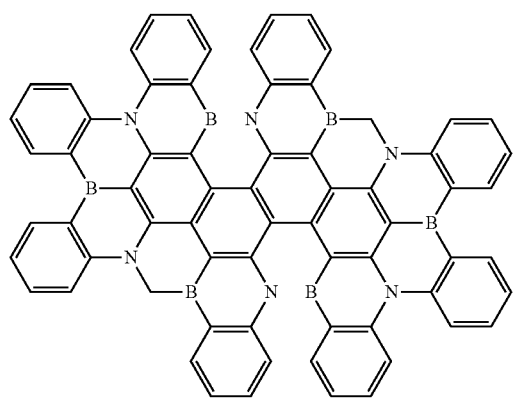
M-38
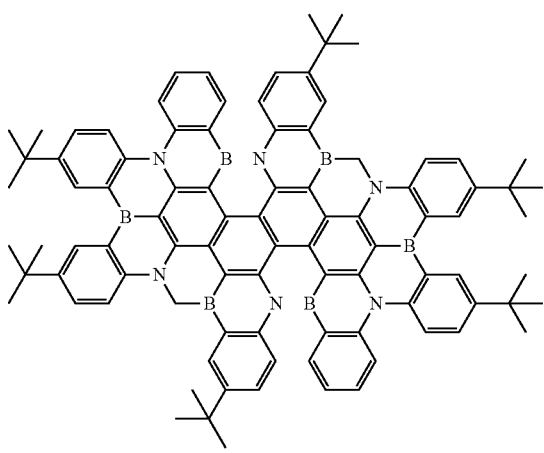

-continued
M-39
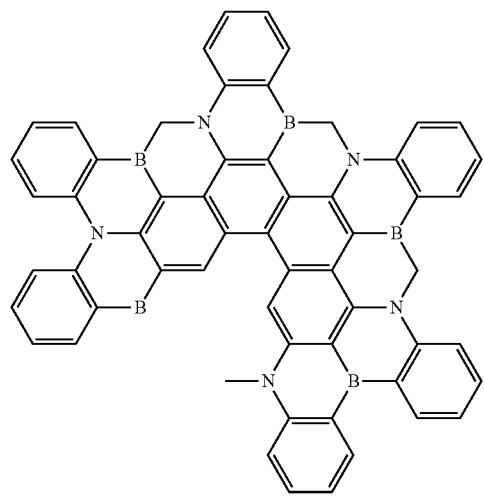
M-40
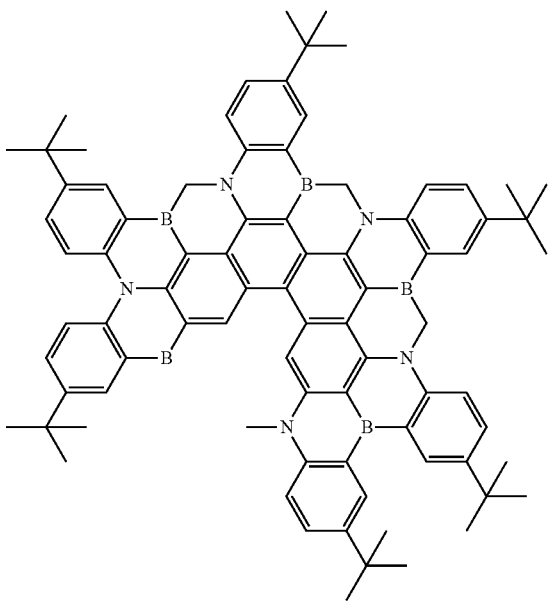
M-41
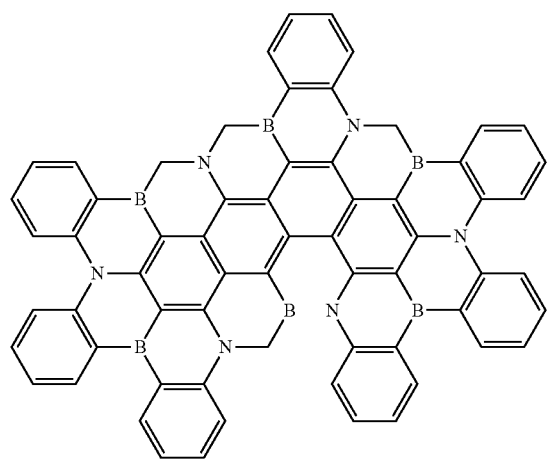
M-42
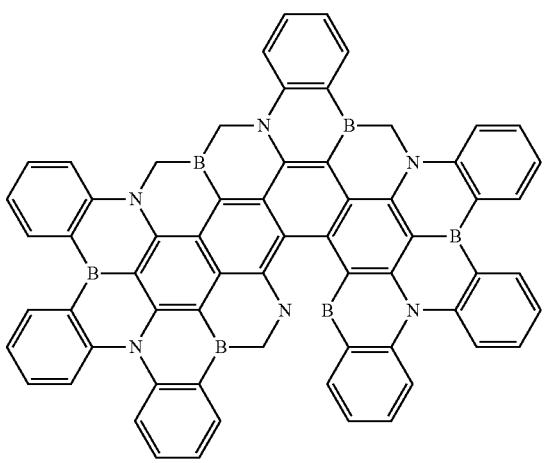
M-43
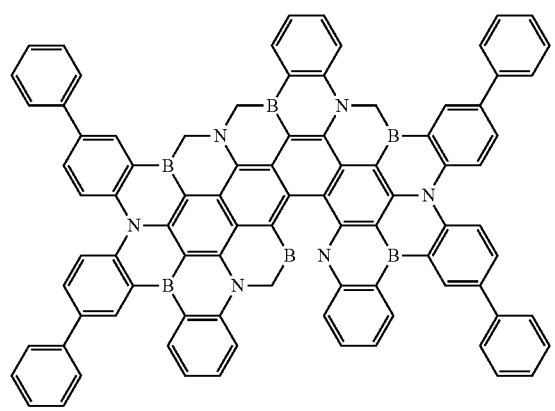
M-44
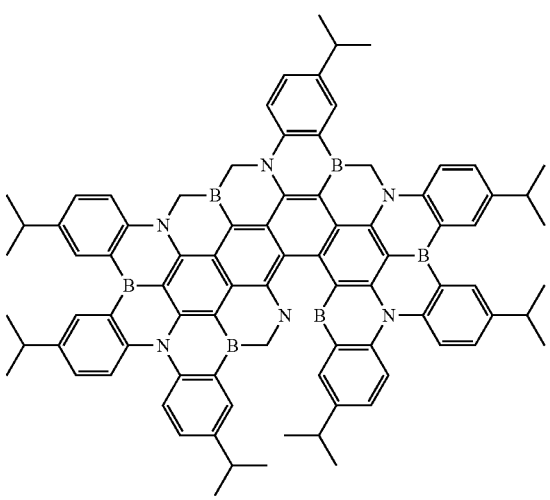

-continued
M-45
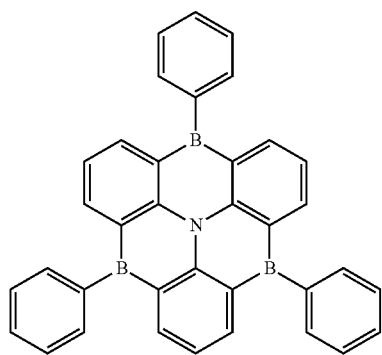
M-46
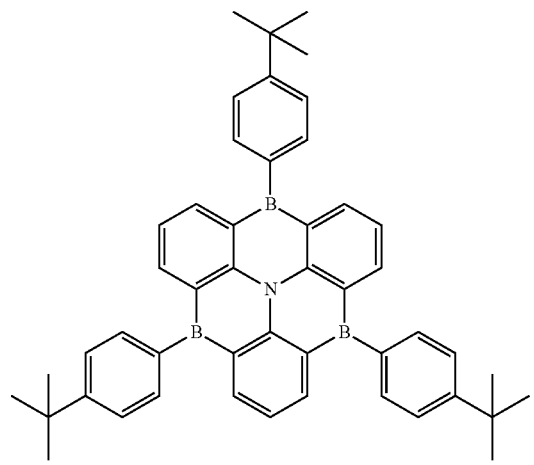
M-47
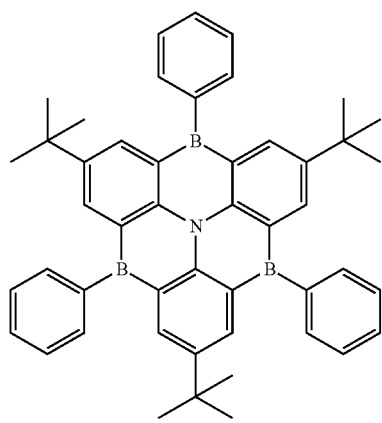
M-48
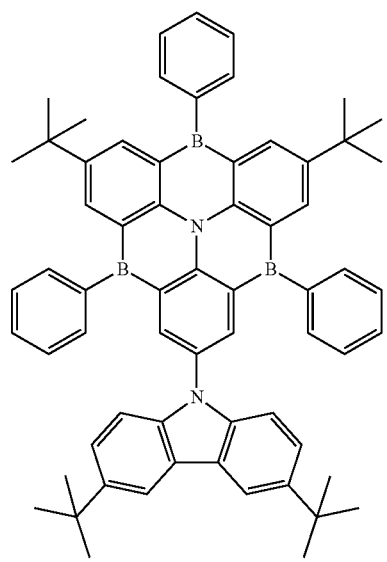
M-49
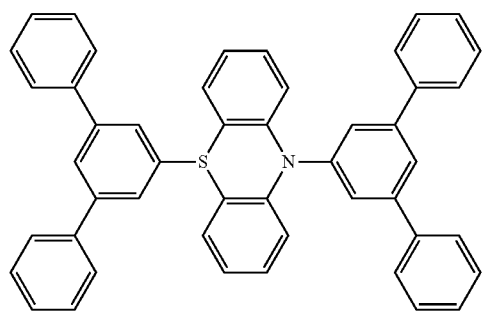
M-50
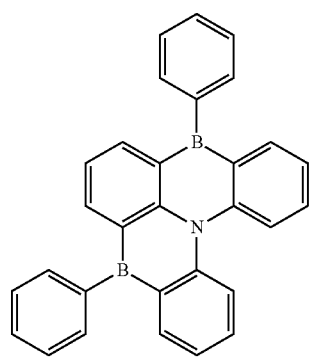

-continued
M-51
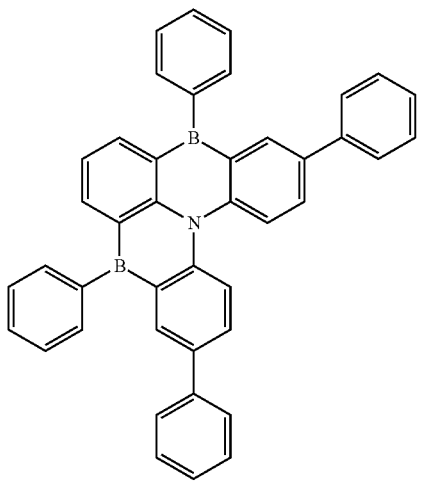
M-52
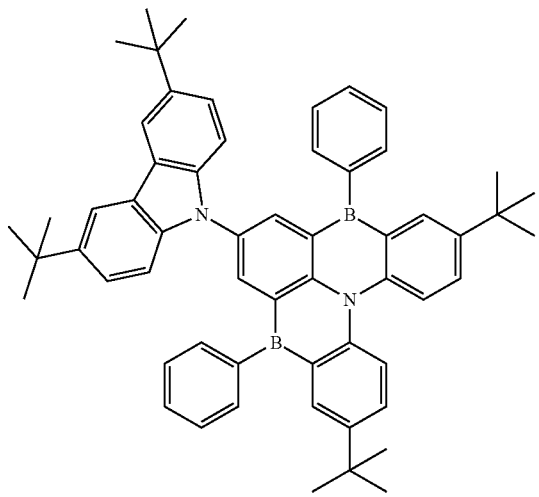
M-53
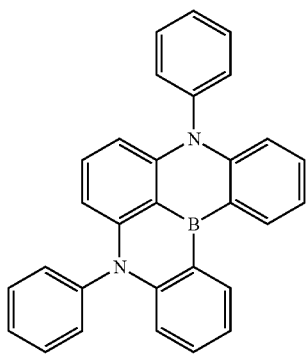
M-54
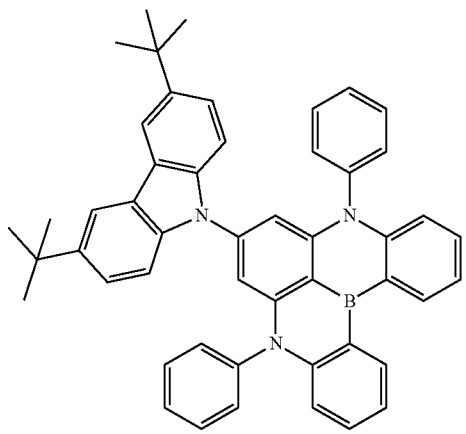
M-55
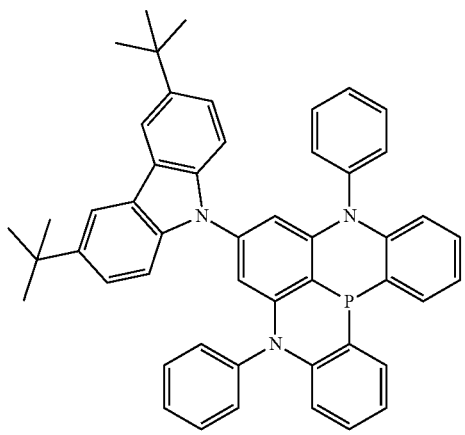
M-56
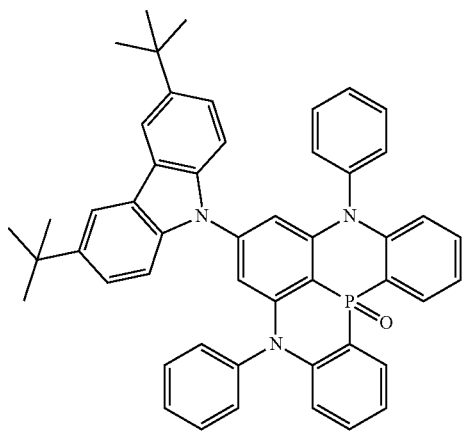

-continued
M-57
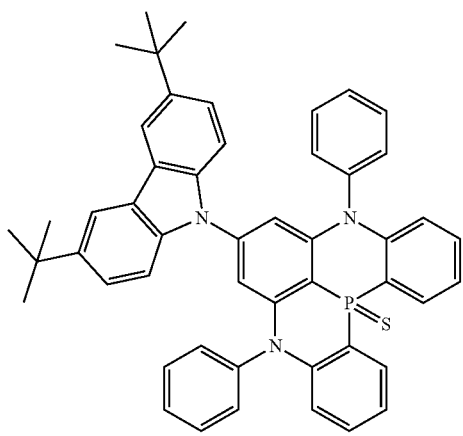
M-58
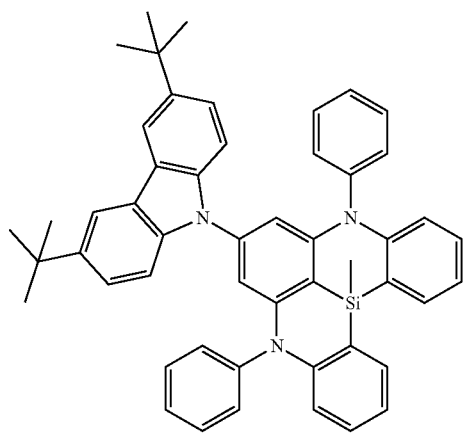
M-59
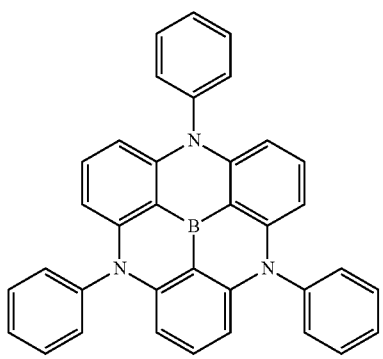
M-60
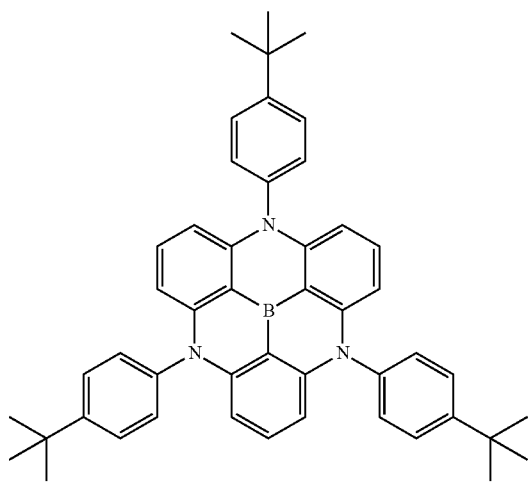
M-61
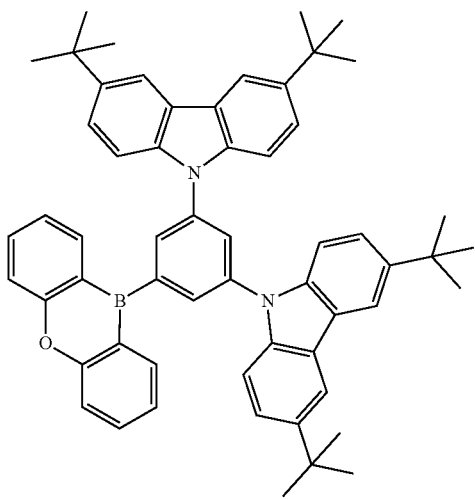
M-62
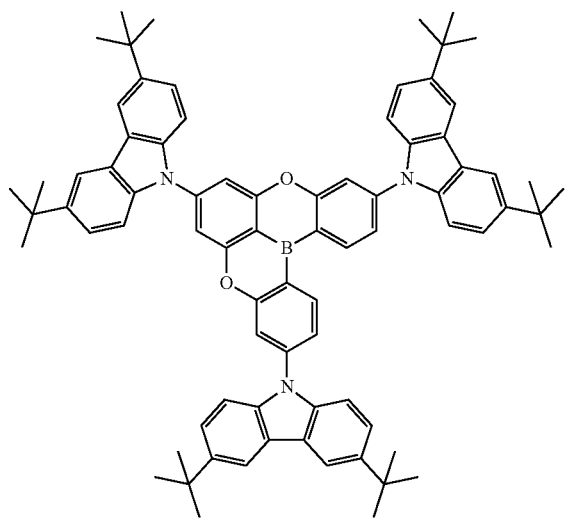

-continued
M-63
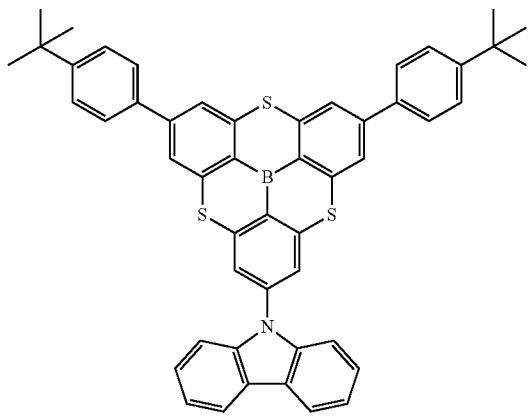
M-64
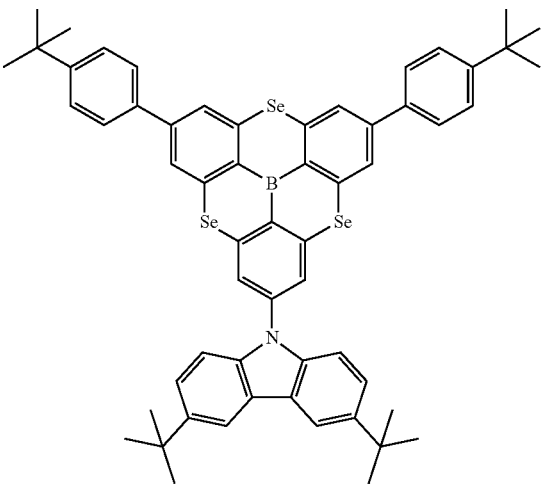
M-65
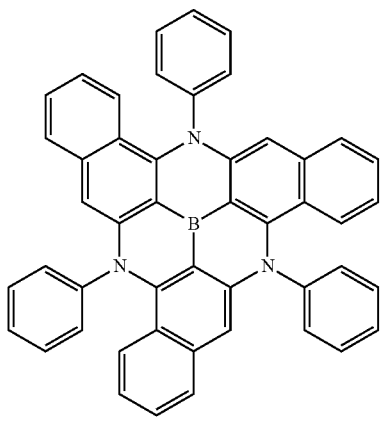
M-66
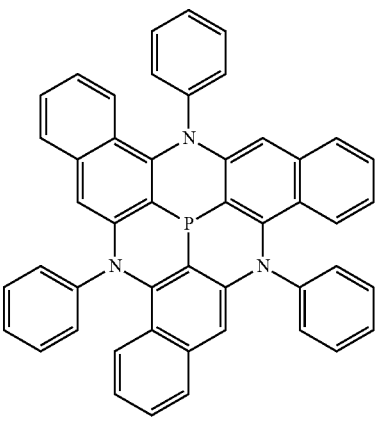
M-67
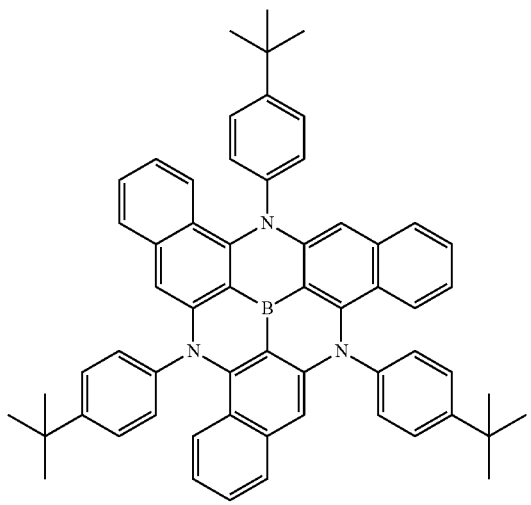
M-68
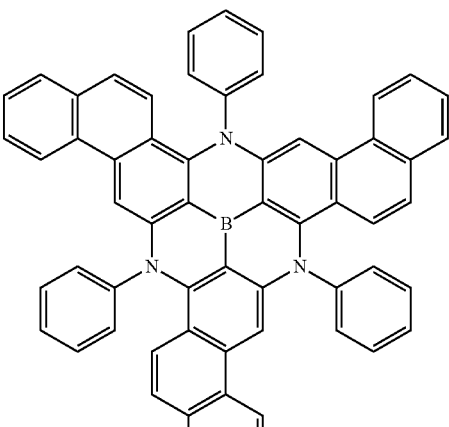

-continued

M-69
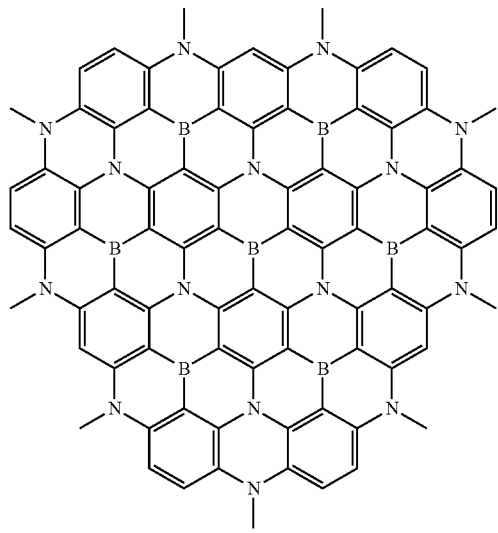

M-70
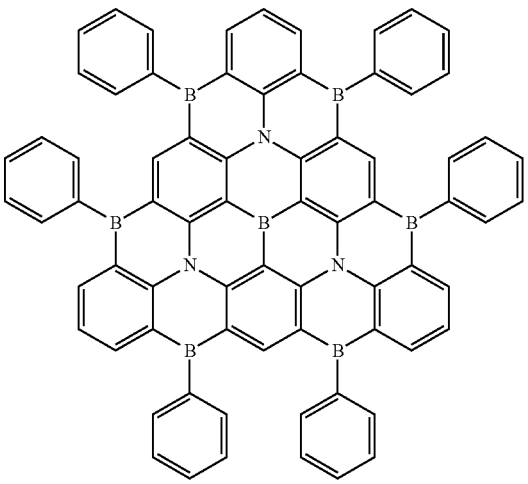

M-71
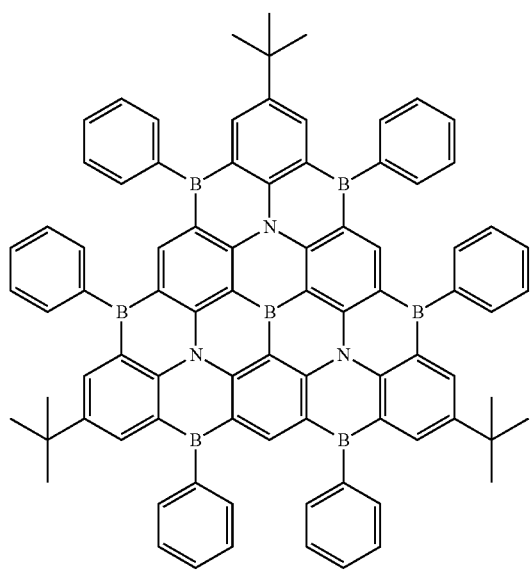

M-72
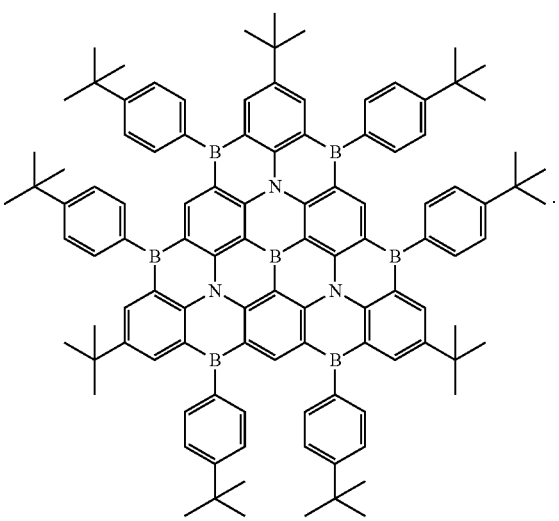

8. The organic electroluminescence device according to claim 1, wherein the thermally activated delayed fluorescent material is a compound comprising an electron donating group and an electron accepting group.

9. The organic electroluminescence device according to claim 8, wherein the electron donating group comprises at least one of carbazolyl, phenothiazinyl, phenoxazinyl, indolocarbazolyl, diphenylamino, triphenylamino, acridinyl, and phenazinyl.

10. The organic electroluminescence device according to claim 9, wherein the electron donating group is selected from at least one of the following groups:

D1
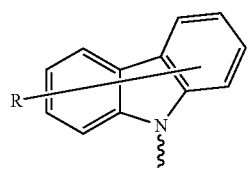

-continued

D2
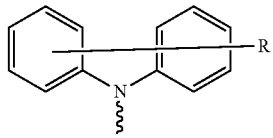

D3
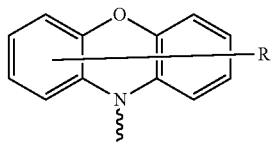

D4
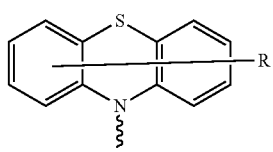

-continued
D5 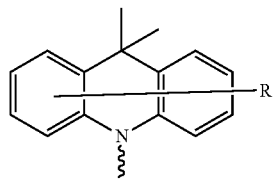
D6 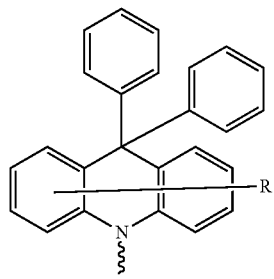
D7 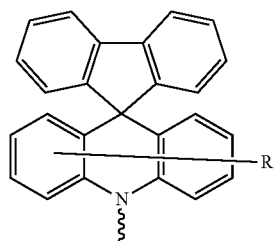
D8 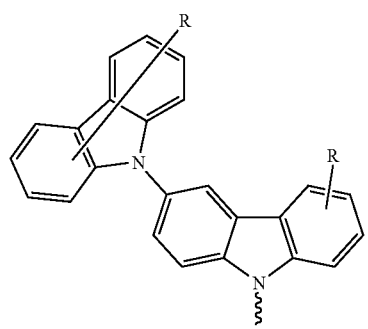
D9 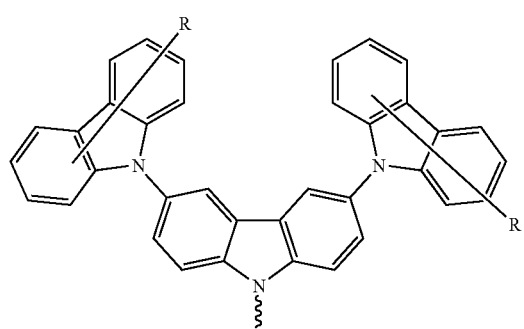
-continued
D10 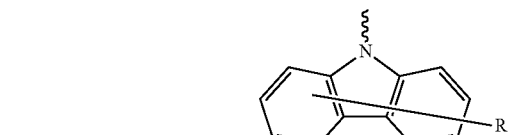
D11 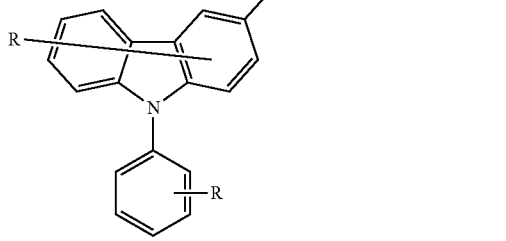
D12 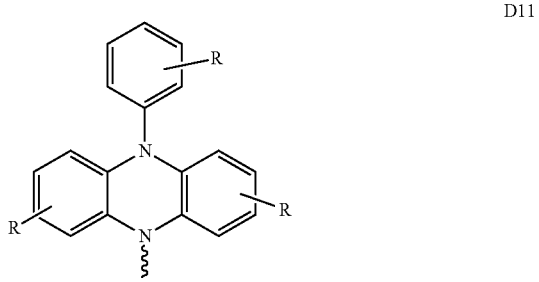
D13 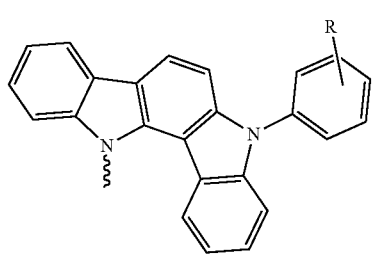
D14 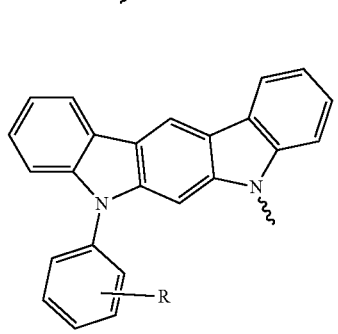

-continued

D15
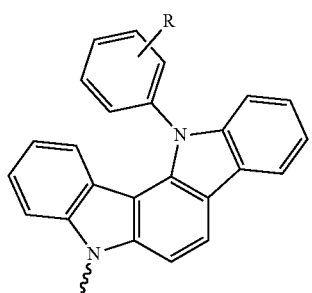

D16
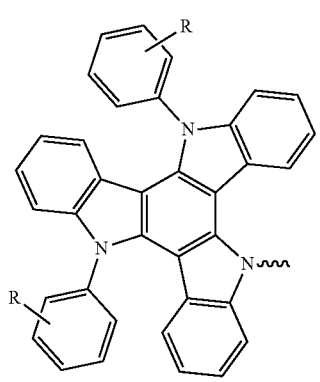

D17
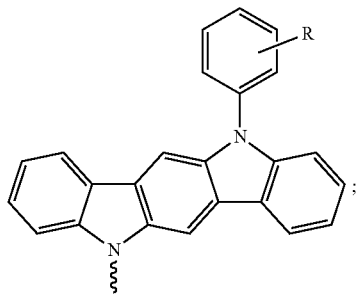

where R is individually and independently selected from one or more of hydrogen, halogen, cyano, $C_1$-$C_{10}$ alkyl, $C_2$-$C_6$ alkenyl, $C_1$-$C_6$ alkoxy or thioalkoxy, $C_6$-$C_{30}$ aryl and $C_3$-$C_{30}$ heteroaryl.

11. The organic electroluminescence device according to claim 8, wherein the electron accepting group comprises at least one of triazinyl, pyrimidinyl, sulfone, thiazolyl, oxazolyl, oxadiazolyl, thiadiazolyl, triazolyl, boron, pyrazinyl, carbonyl, cyano, and pyridyl.

12. The organic electroluminescence device according to claim 11, wherein the electron accepting group is selected from at least one of the following groups:

A1
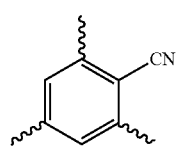

-continued

A2
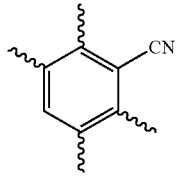

A3
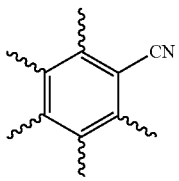

A4
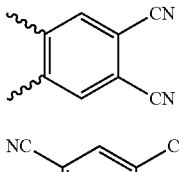

A5
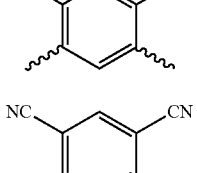

A6
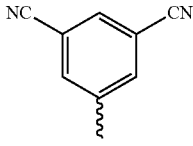

A7
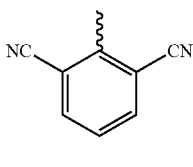

A8
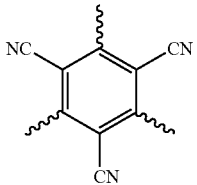

A9
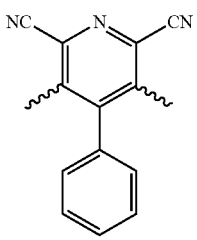

A10
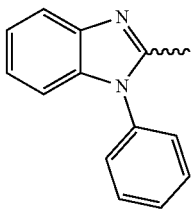

A11 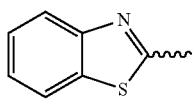

A12 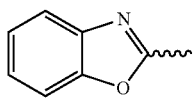

A13 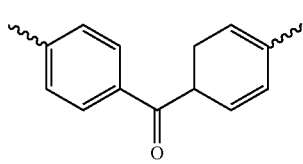

A14 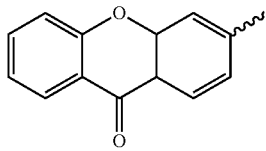

A15 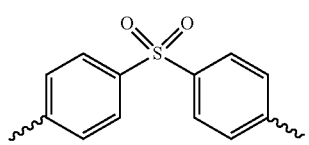

A16 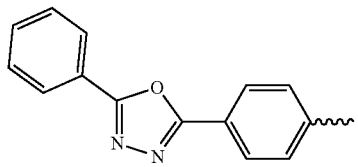

A17 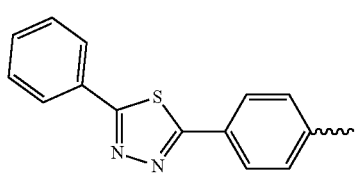

A18 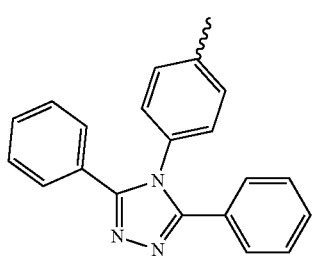

A19 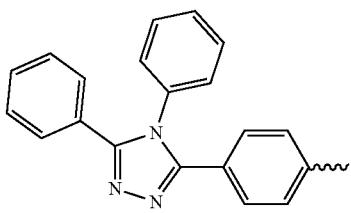

A20 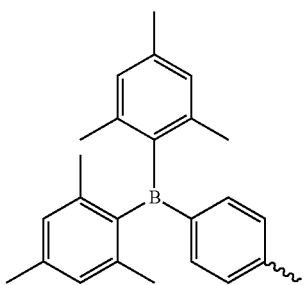

A21 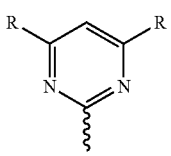

A22

A23 where R is individually and independently selected from one or more of hydrogen, halogen, cyano, $C_1$-$C_{10}$ alkyl, $C_2$-$C_6$ alkenyl, $C_1$-$C_6$ alkoxy or thioalkoxy, $C_6$-$C_{30}$ aryl and $C_3$-$C_{30}$ heteroaryl.

13. The organic electroluminescence device according to claim 8, wherein energy level difference of a singlet state and a triplet state of the thermally activated delayed fluorescent material is ≤0.3 eV.

14. The organic electroluminescence device according to claim 8, wherein the thermally activated delayed fluorescent material is a compound having one of the following structures:

T-1
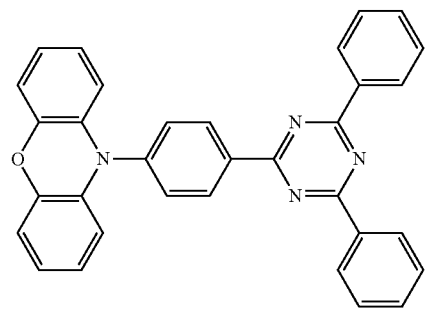
T-2
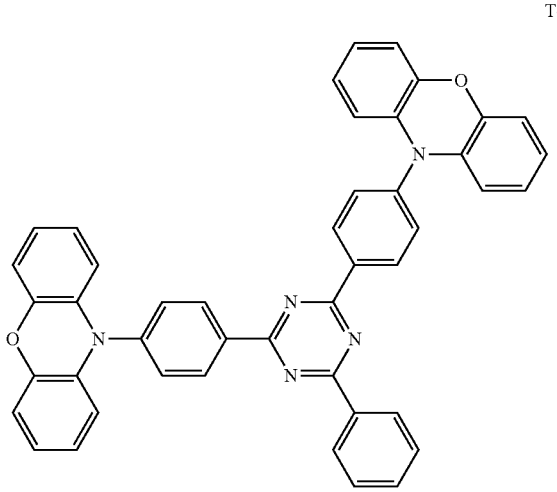
T-3
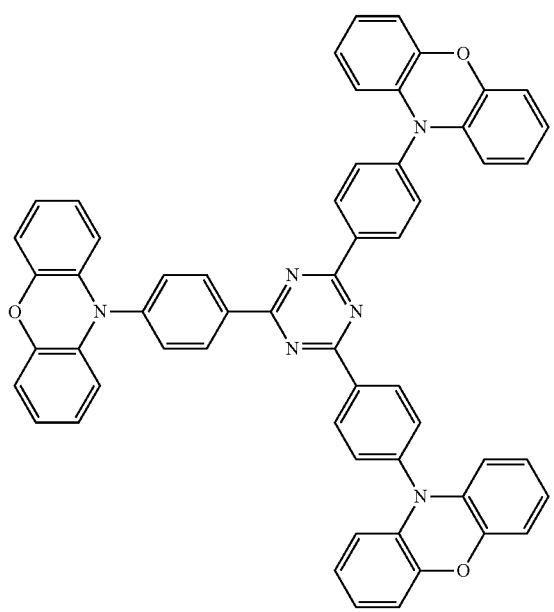
T-4
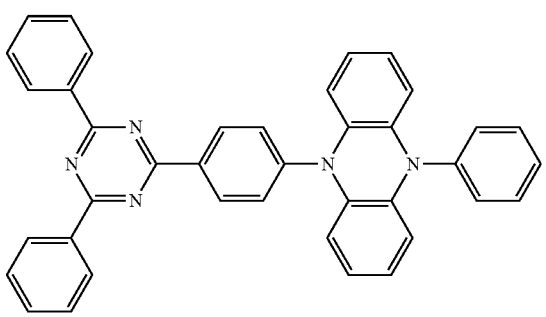
T-5
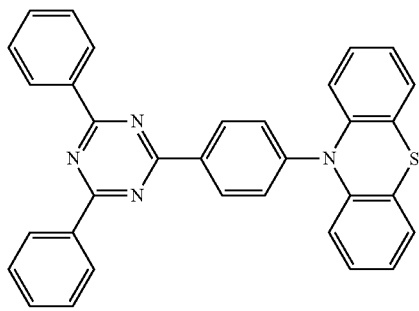
T-6
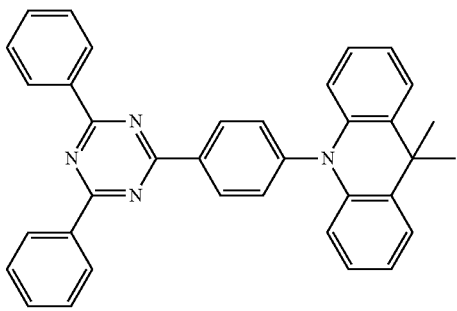

-continued
T-7
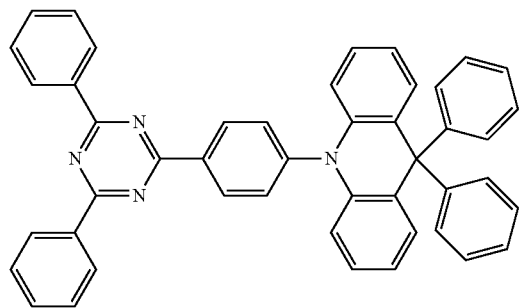
T-8
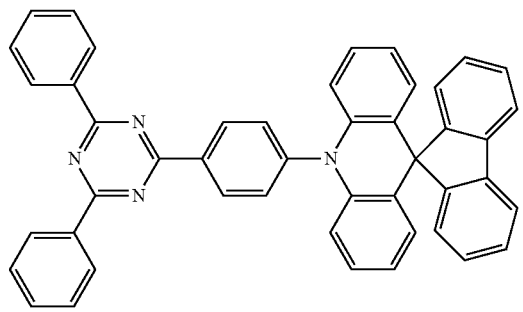
T-9
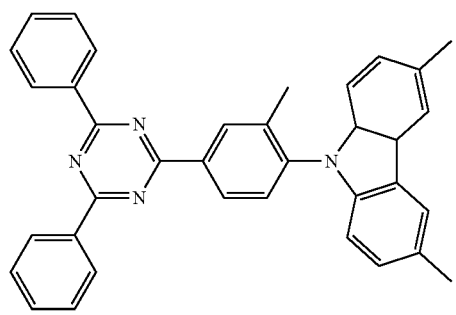
T-10
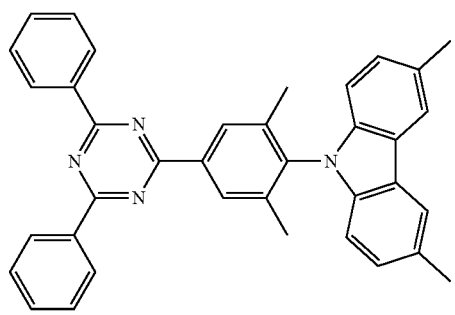
T-11
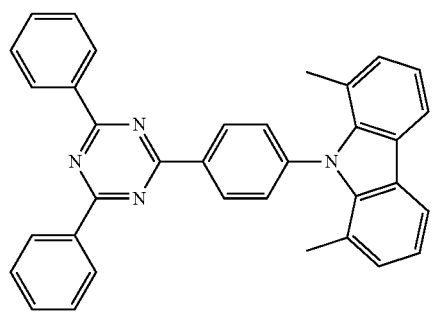
T-12
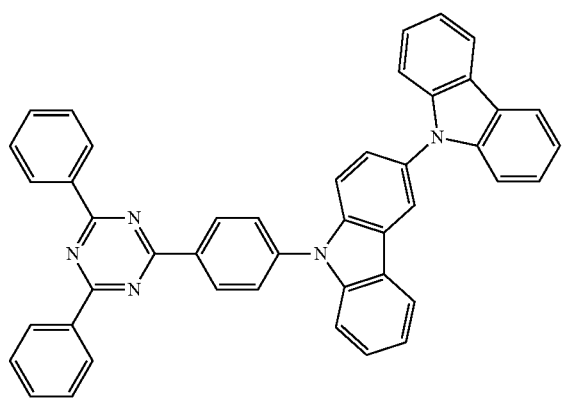
T-13
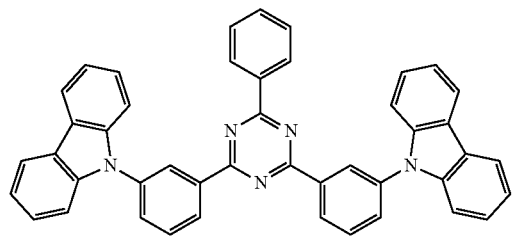
T-14
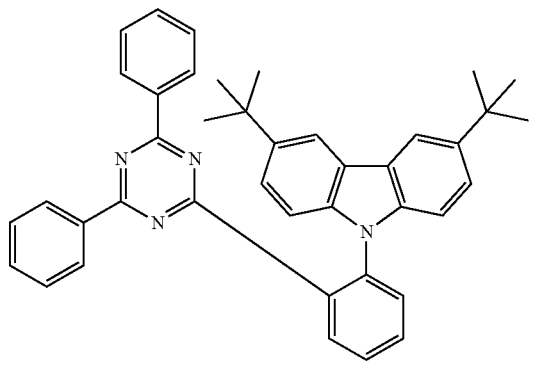

-continued
T-15
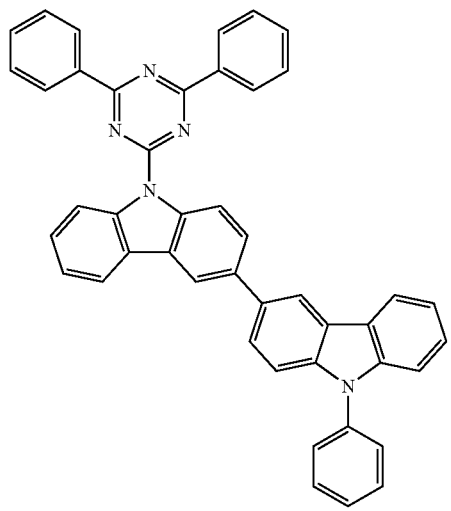
T-16
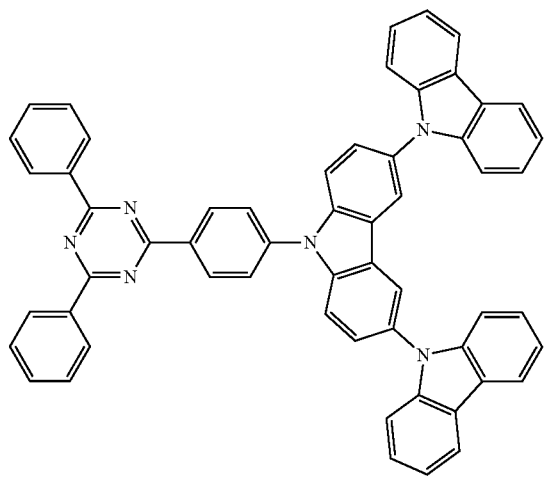
T-17
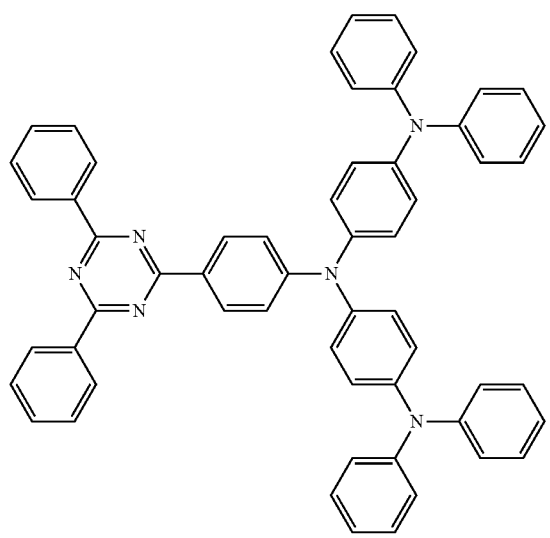
T-18
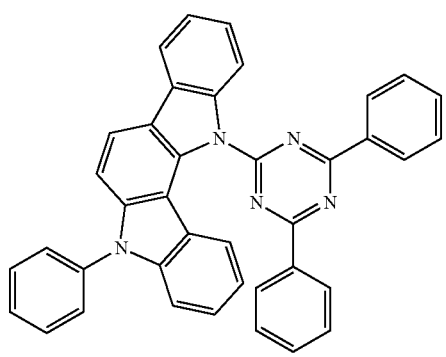
T-19
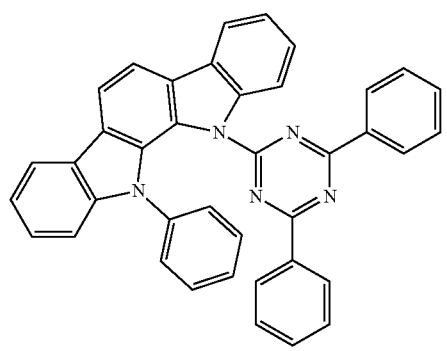
T-20
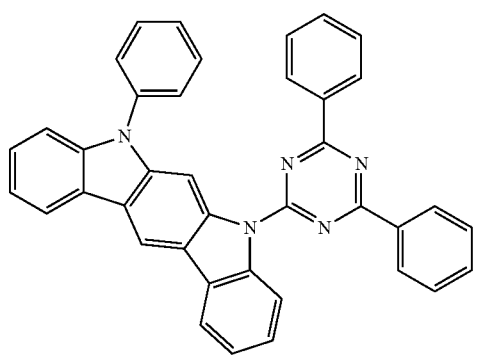

-continued
T-21
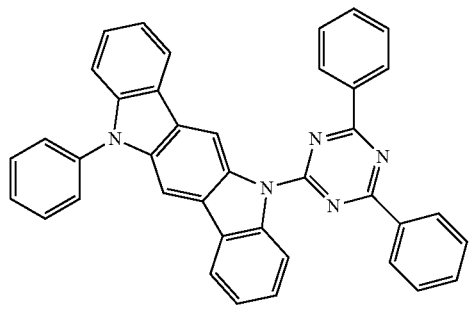
T-22
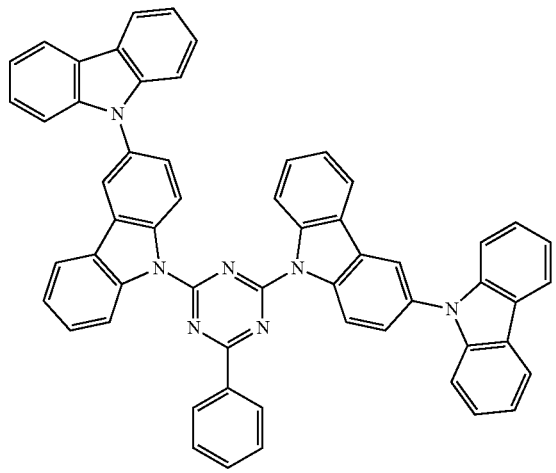
T-23
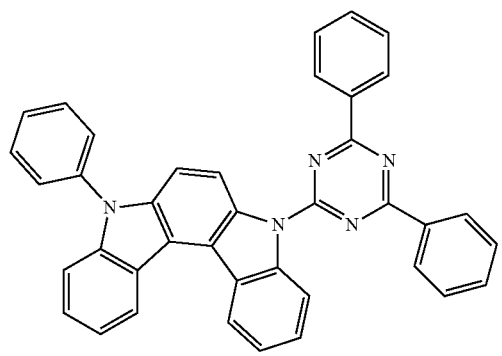
T-24
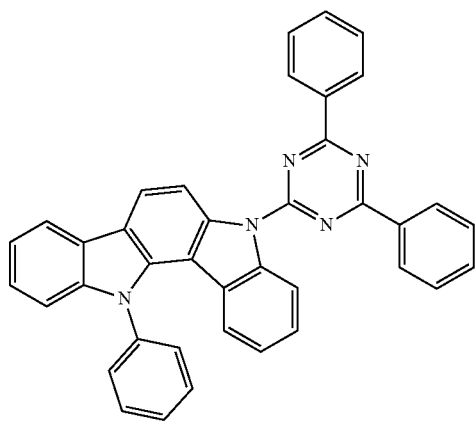
T-25
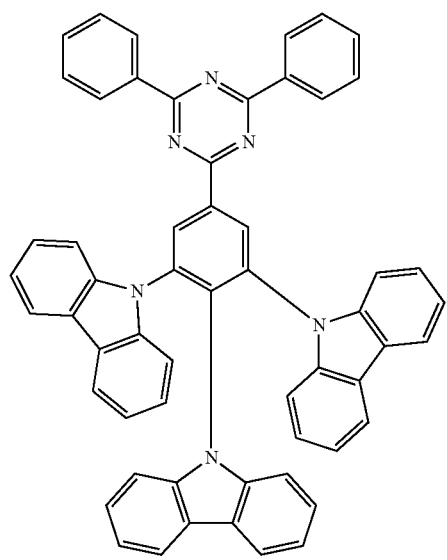
T-26
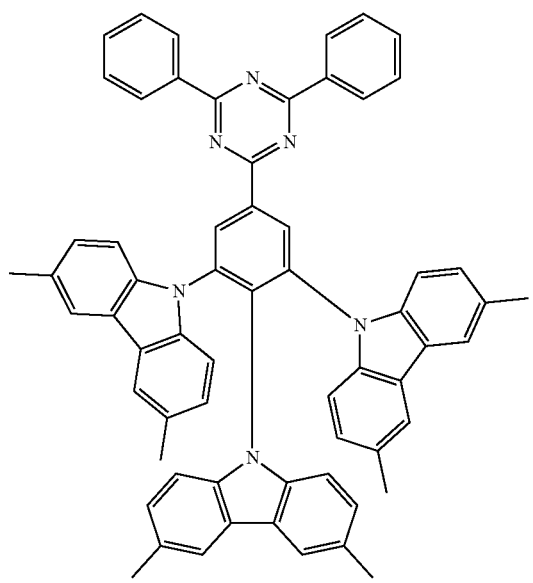

-continued
T-27
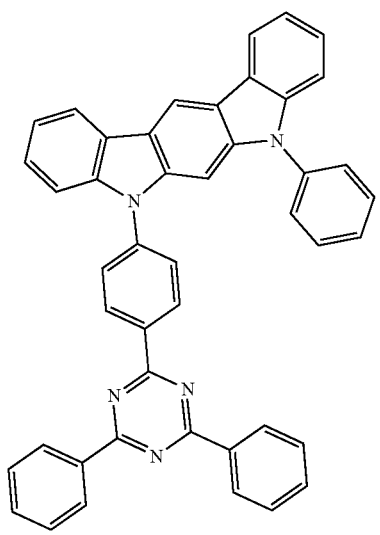
T-28
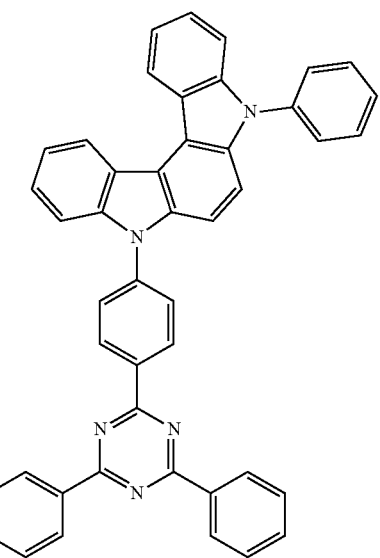
T-29
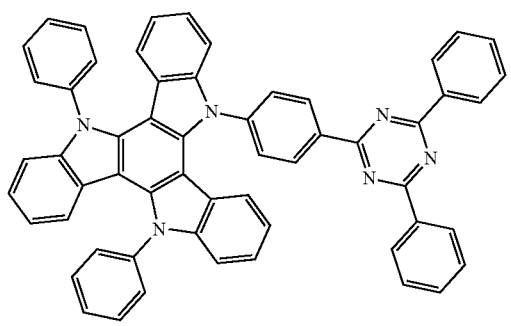
T-30
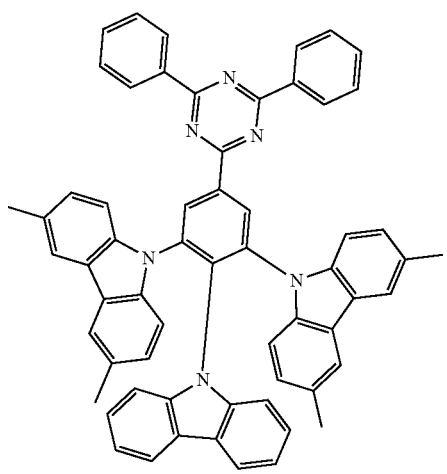
T-31
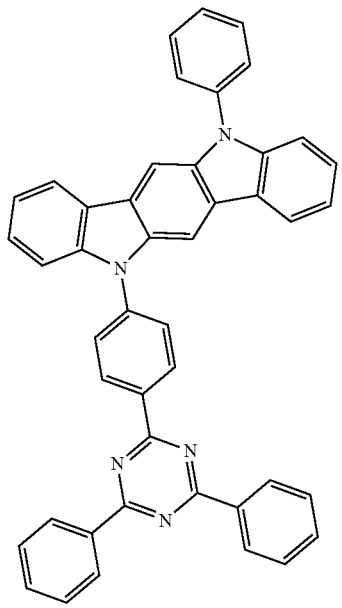
T-32
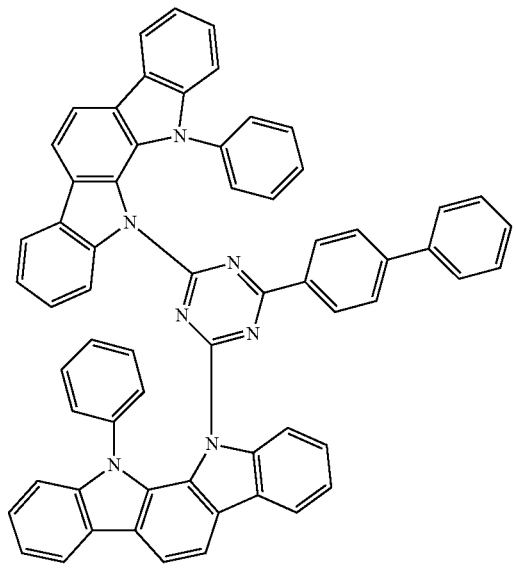

-continued
T-33
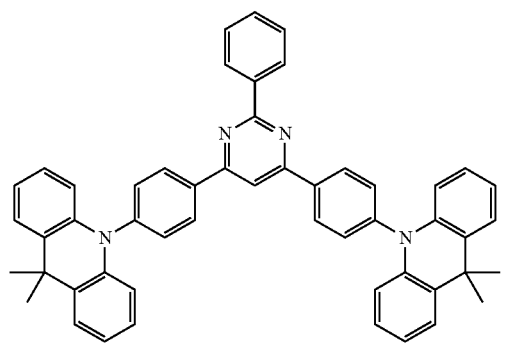
T-34
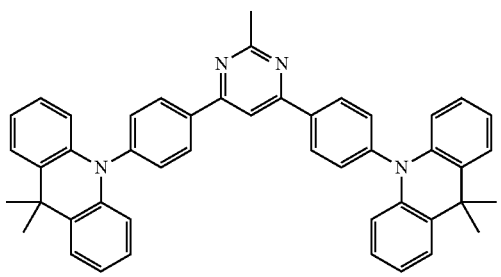
T-35
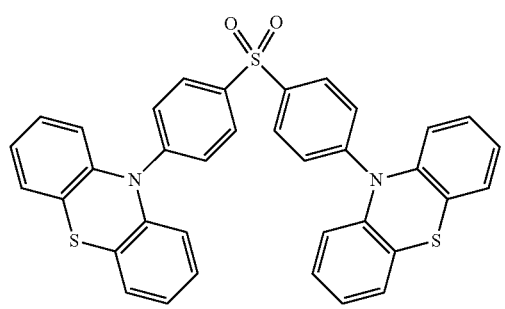
T-36
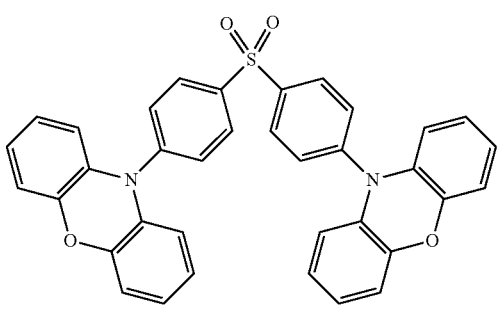
T-37
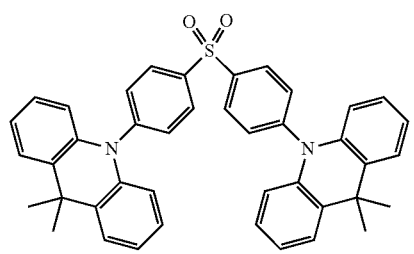
T-38
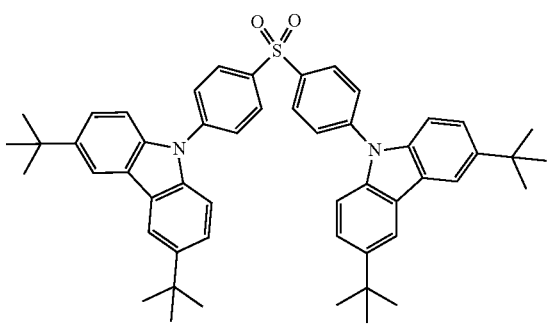
T-39
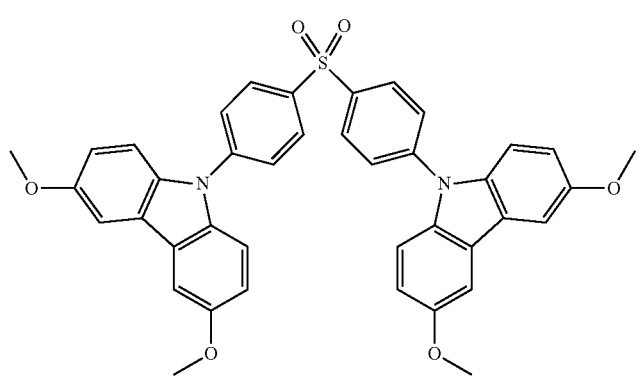

-continued
T-40
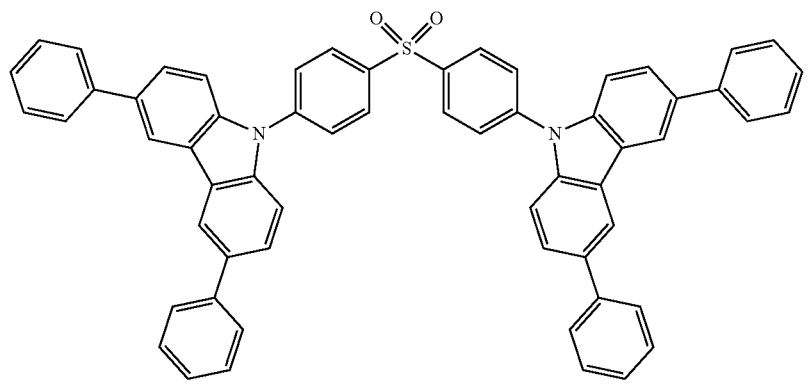
T-41
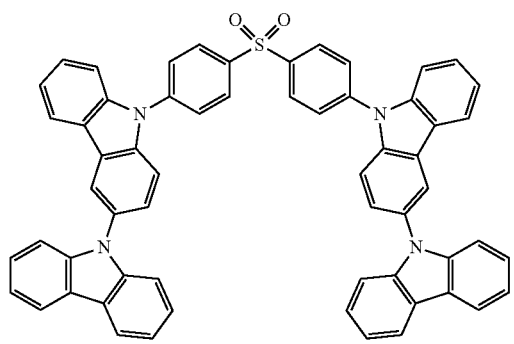
T-42
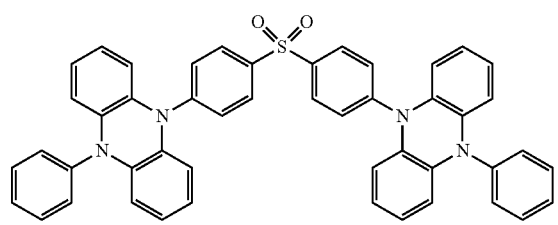
T-43
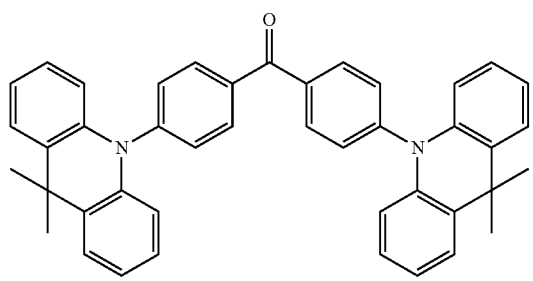
T-44
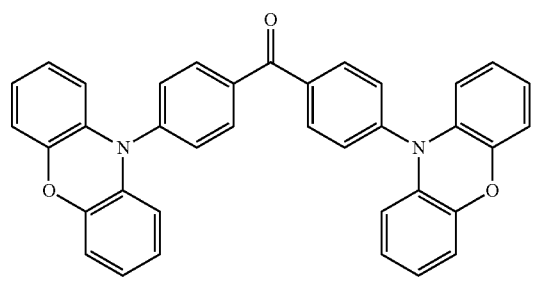
T-45
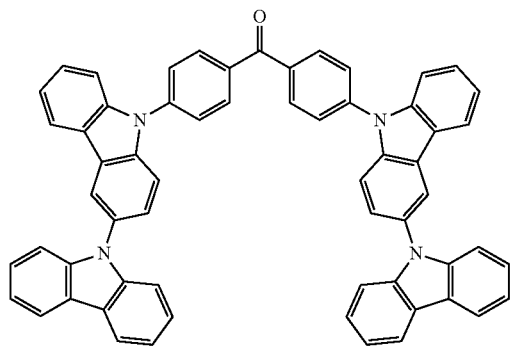
T-46
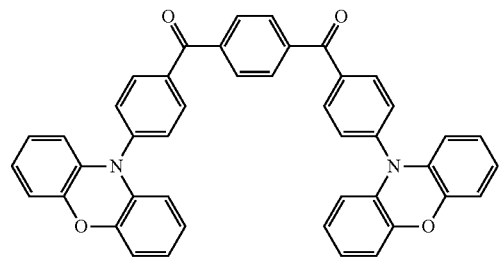

T-47
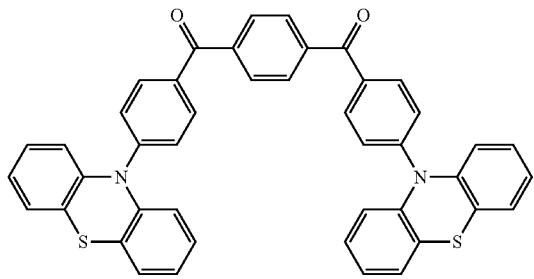
T-48
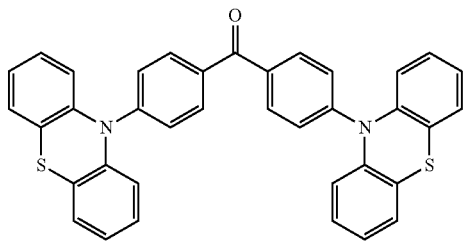
T-49
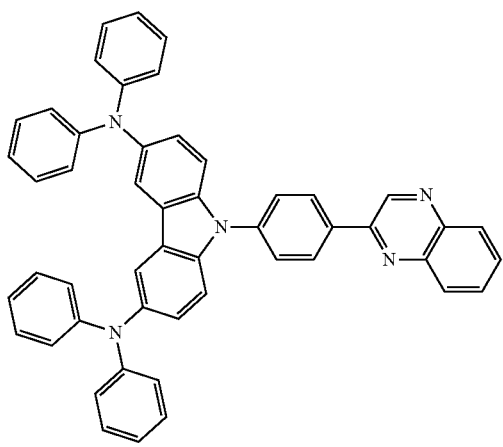
T-50
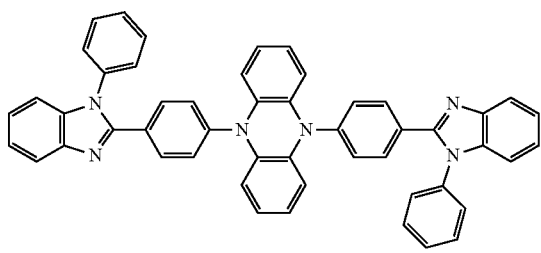
T-51
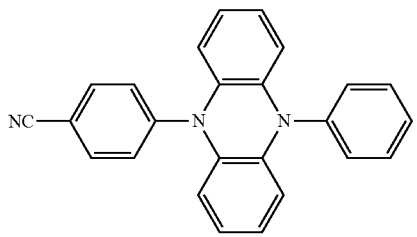
T-52
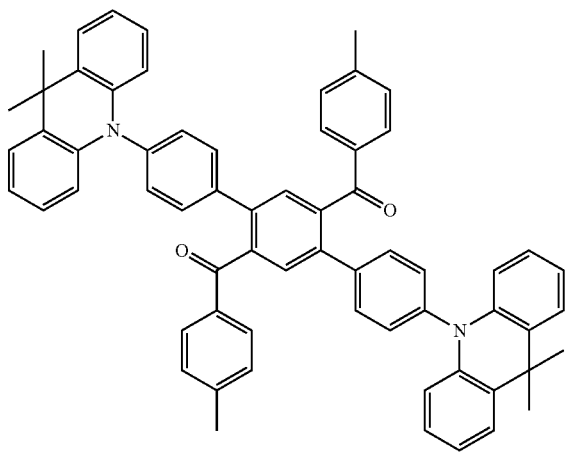
T-53
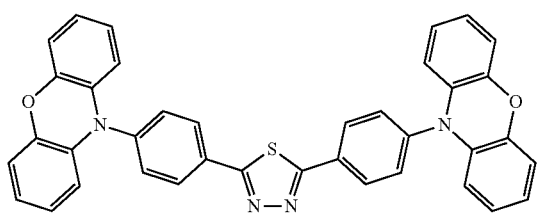
T-54
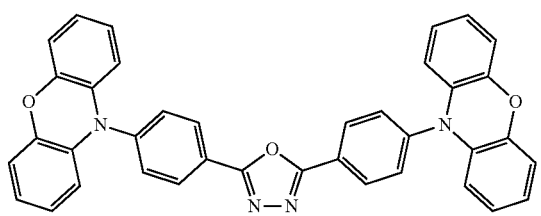

-continued
T-55
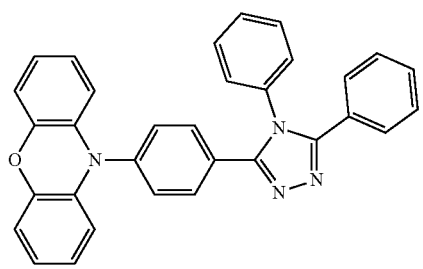
T-56
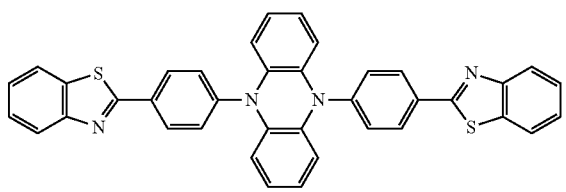
T-57
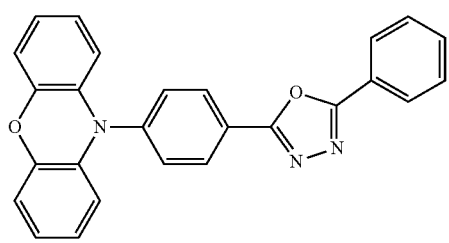
T-58
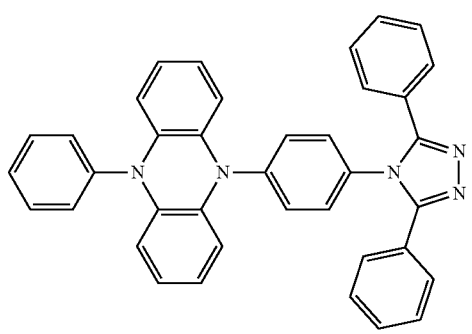
T-59
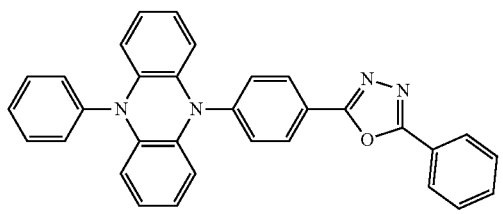
T-60
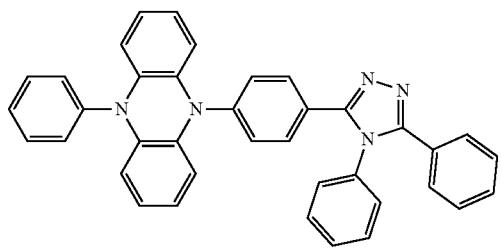
T-61
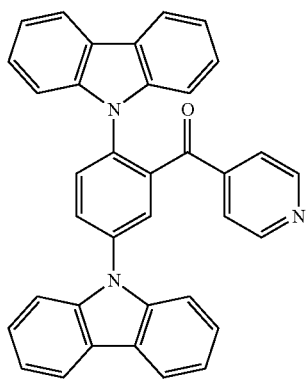
T-62
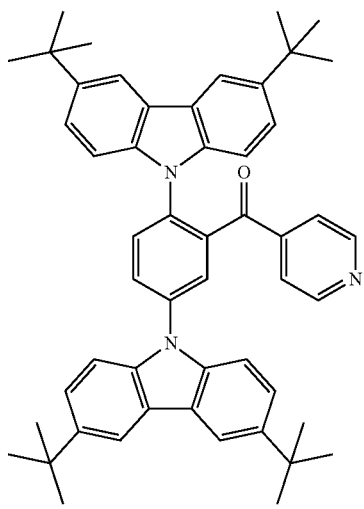

-continued
T-63
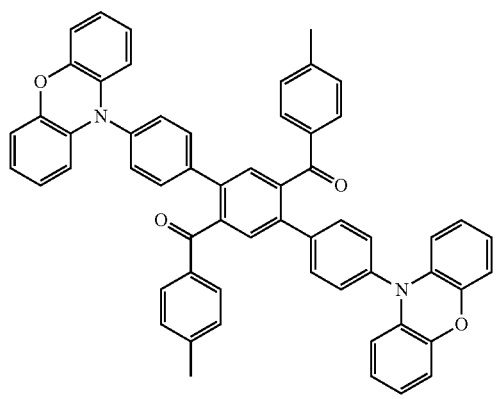
T-64
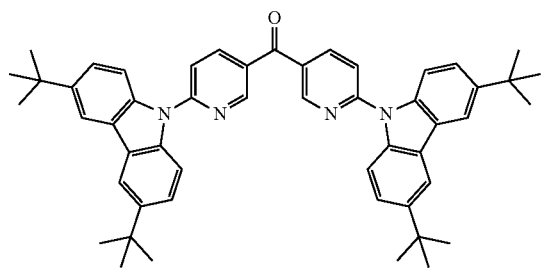
T-65
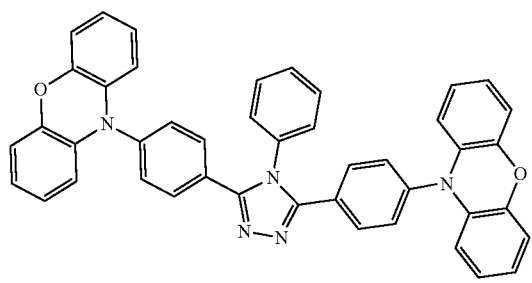
T-66
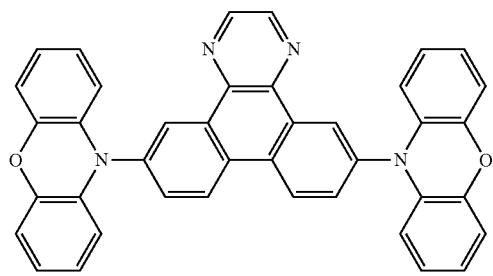
T-67
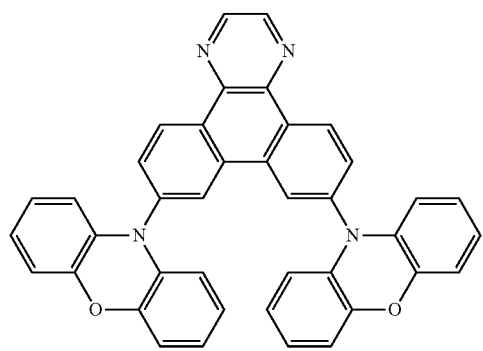
T-68
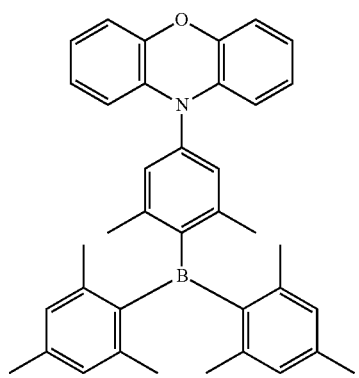
T-69
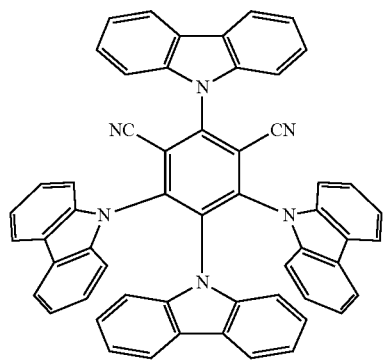
T-70
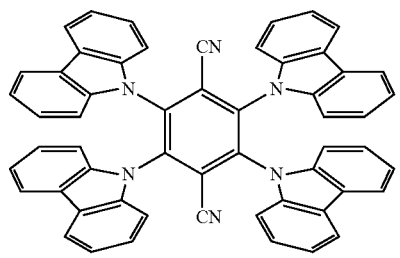

-continued
T-71
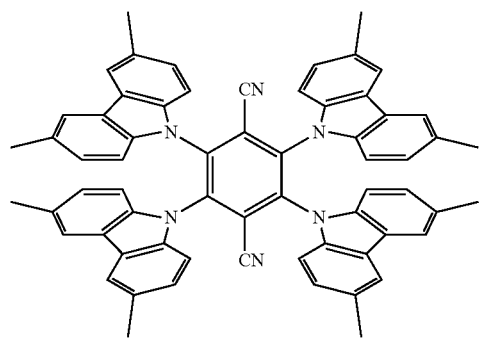
T-72
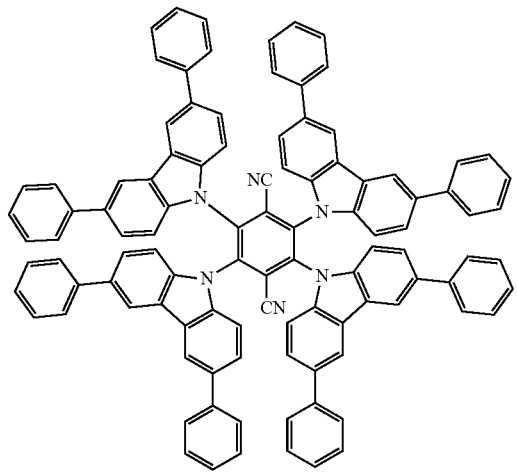
T-73
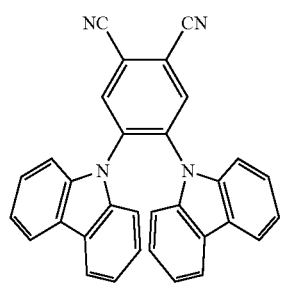
T-74
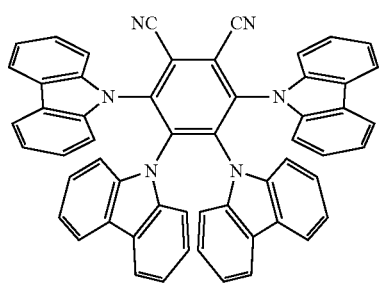
T-75
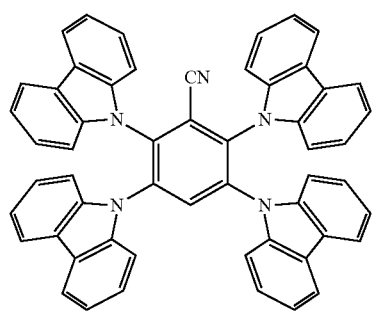
T-76
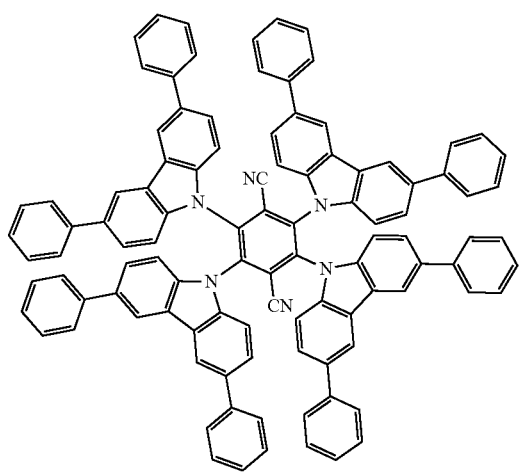

T-77
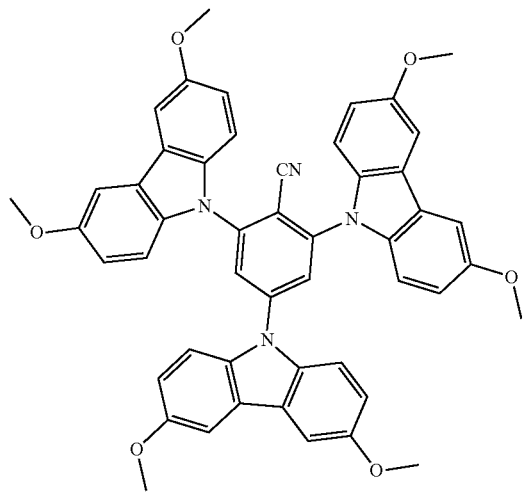
T-78
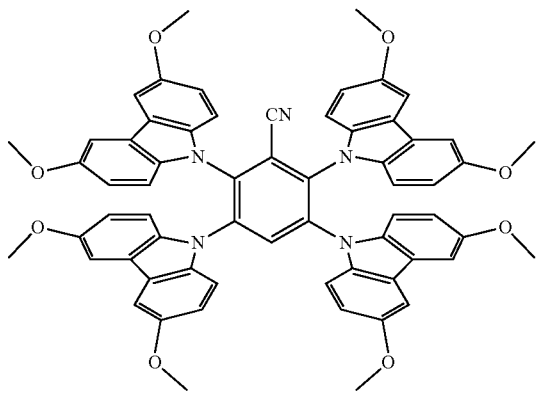
T-79
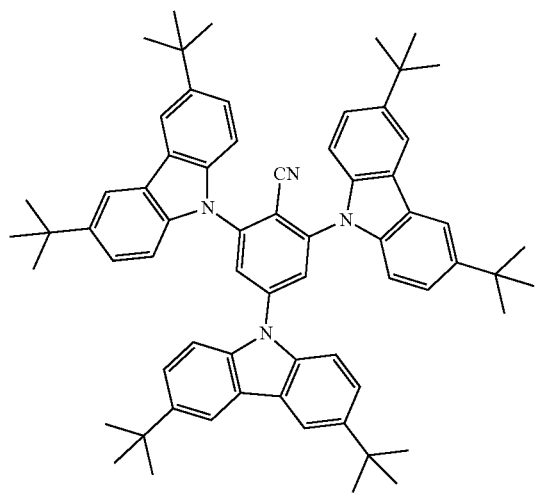
T-80
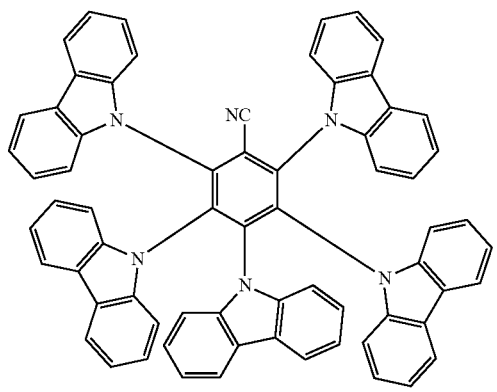
T-81
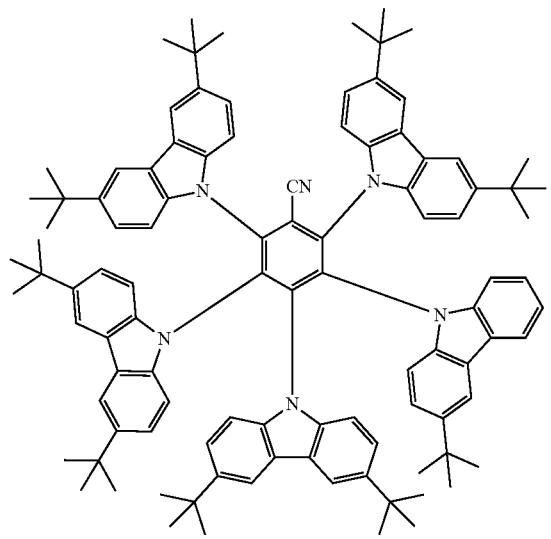
T-82
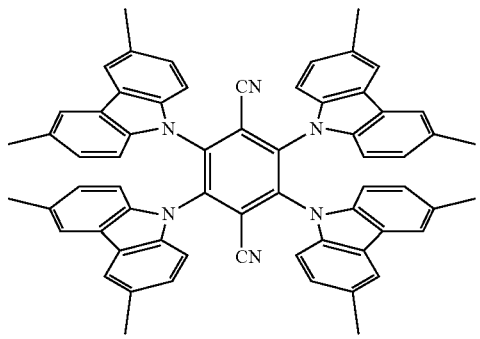

T-83

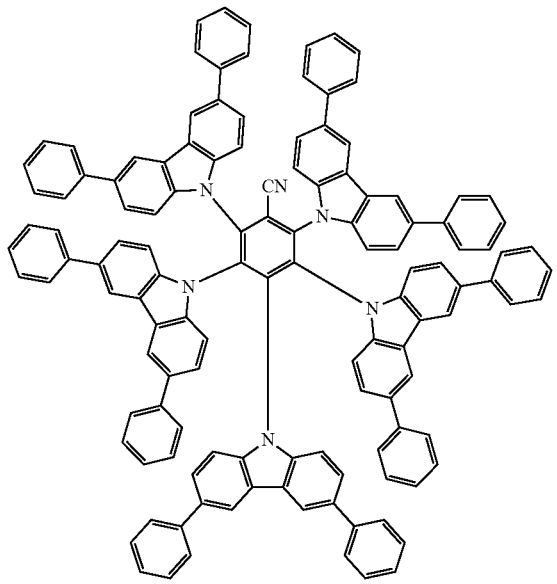

T-84

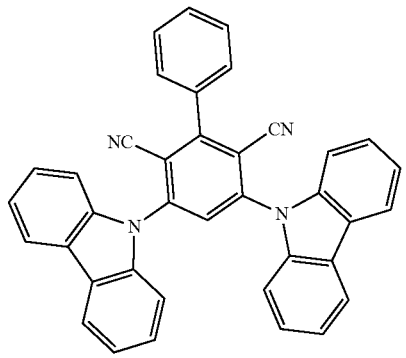

T-85

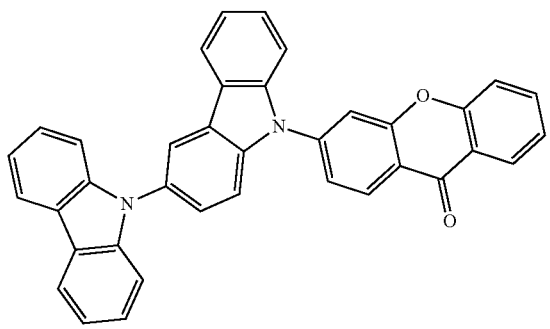

T-86

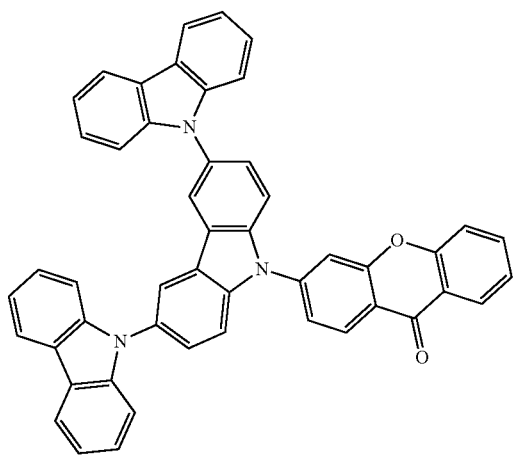

T-87

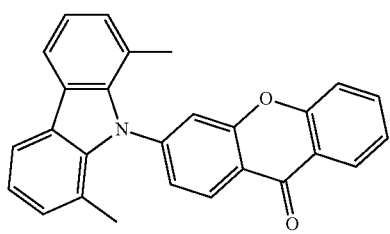

T-88

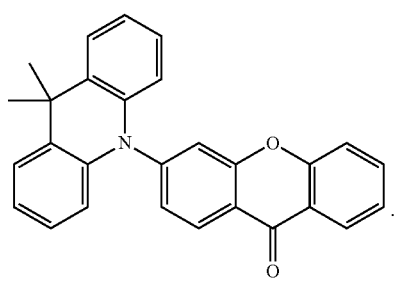

15. The organic electroluminescence device according to claim 1, wherein energy level difference between HOMO energy level and LUMO energy level of the wide bandgap material is ≥2 eV.

16. The organic electroluminescence device according to claim 1, wherein the wide bandgap material is a compound comprising at least one of carbazolyl, carbolinyl, spirofluorenyl, fluorenyl, silyl, and phosphonooxy.

17. The organic electroluminescence device according to claim 16, wherein the wide bandgap material is a compound having one of the following structures:

| (W-1) | (W-2) |
|---|---|
| 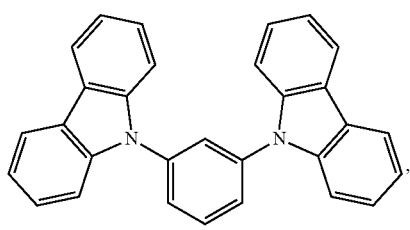 | 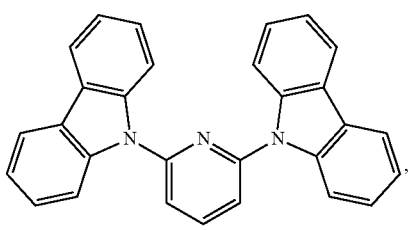 |
| (W-3) | (W-4) |
| 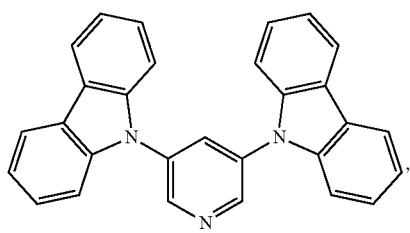 | 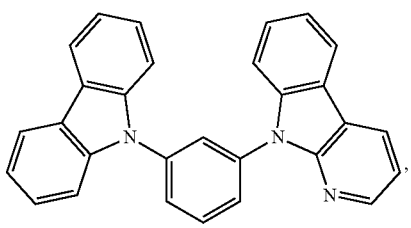 |
| (W-5) | (W-6) |
| 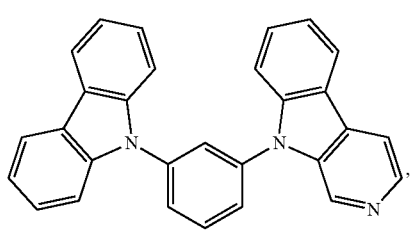 | 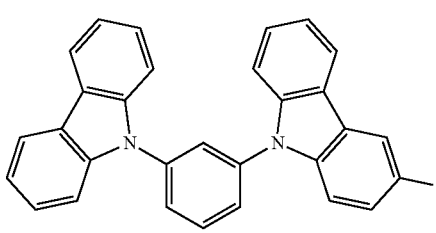 |
| (W-7) | (W-8) |
| 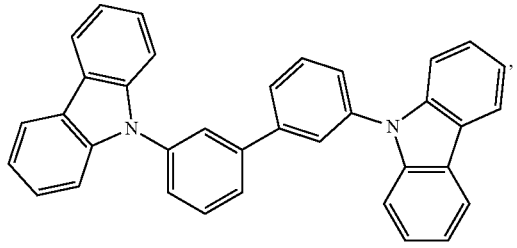 | 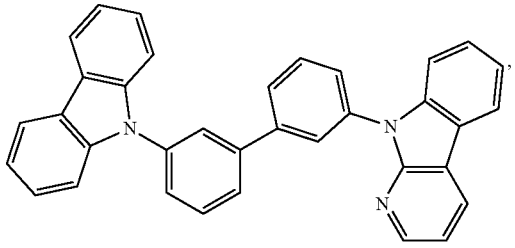 |
| (W-9) | (W-10) |
| 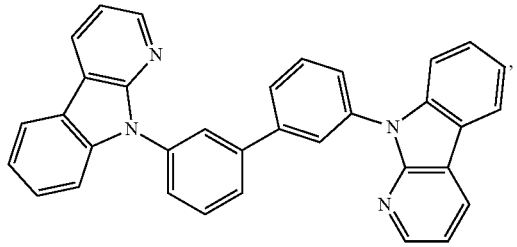 | 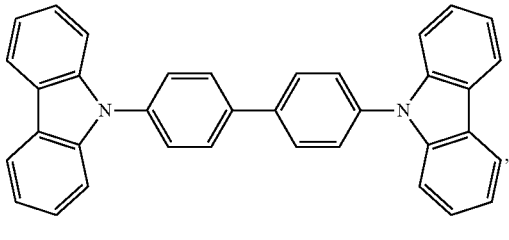 |
| (W-11) | (W-12) |
| 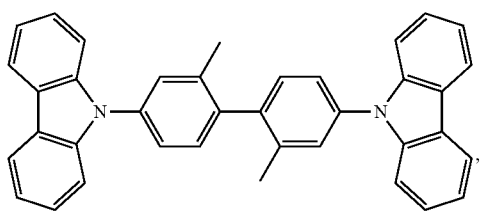 | 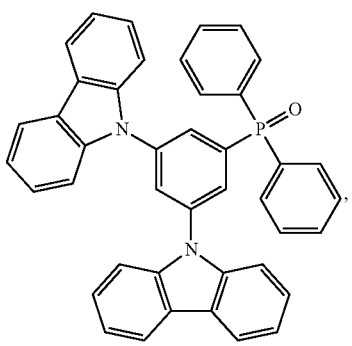 |

-continued
(W-13)
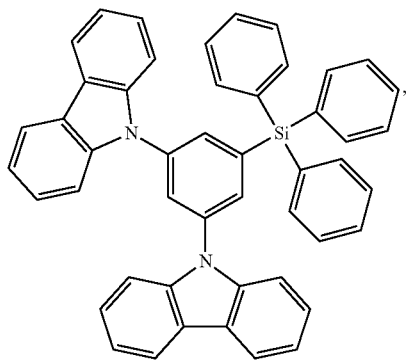
(W-14)
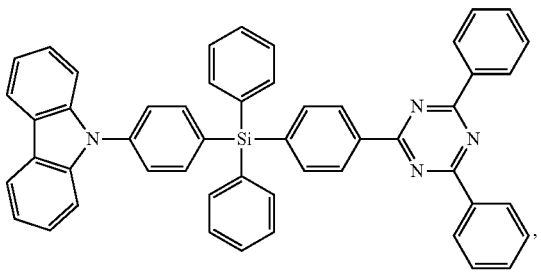
(W-15)
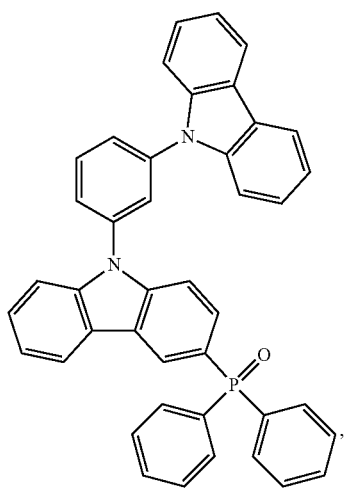
(W-16)
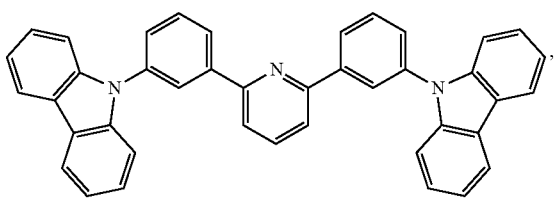
(W-17)
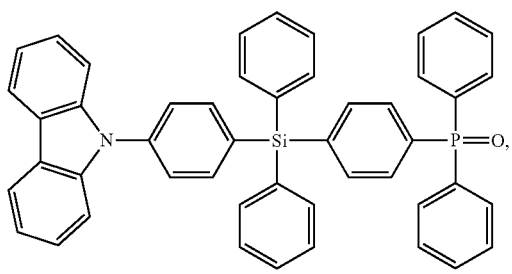
(W-18)
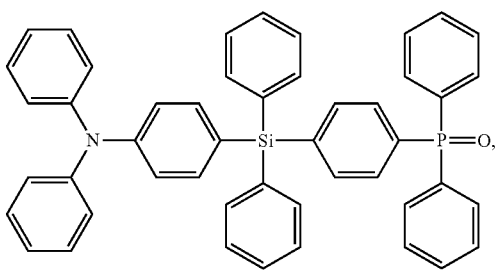
(W-19)
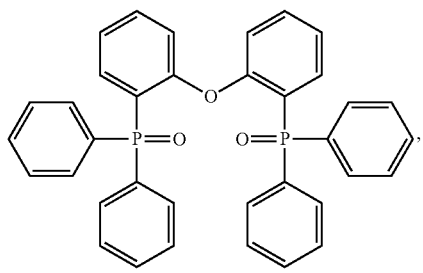
(W-20)
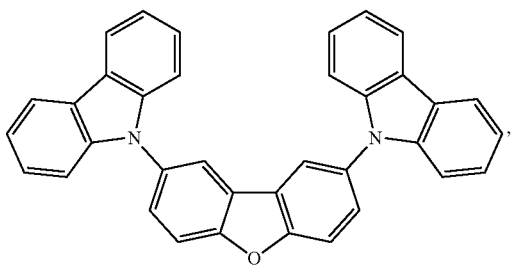

-continued
(W-21)
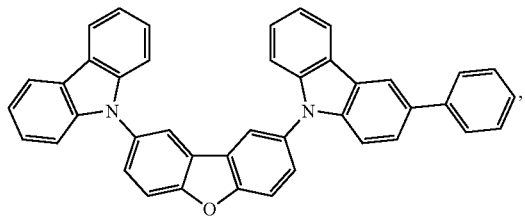
(W-22)
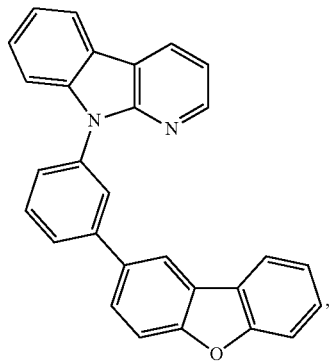
(W-23)
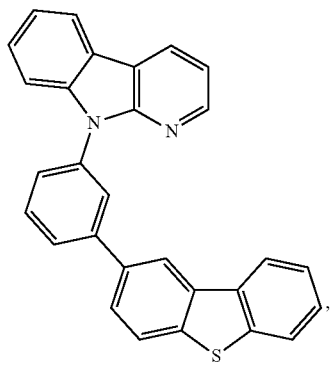
(W-24)
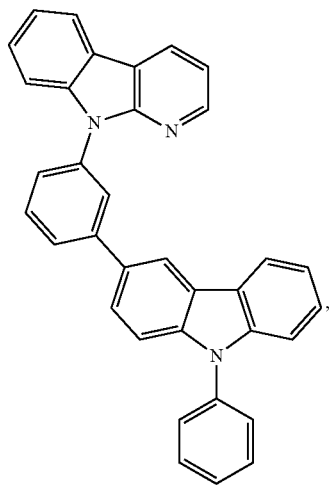
(W-25)
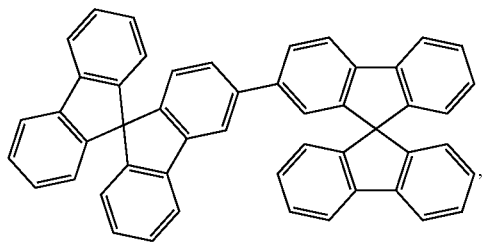
(W-26)
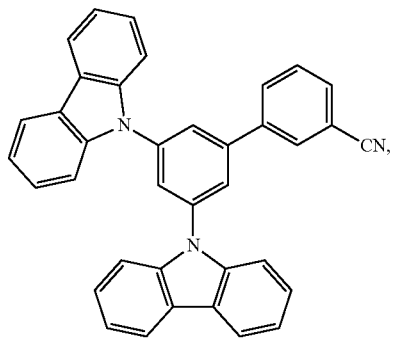
(W-27)
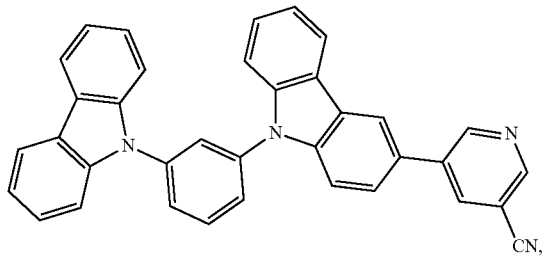

(W-28)
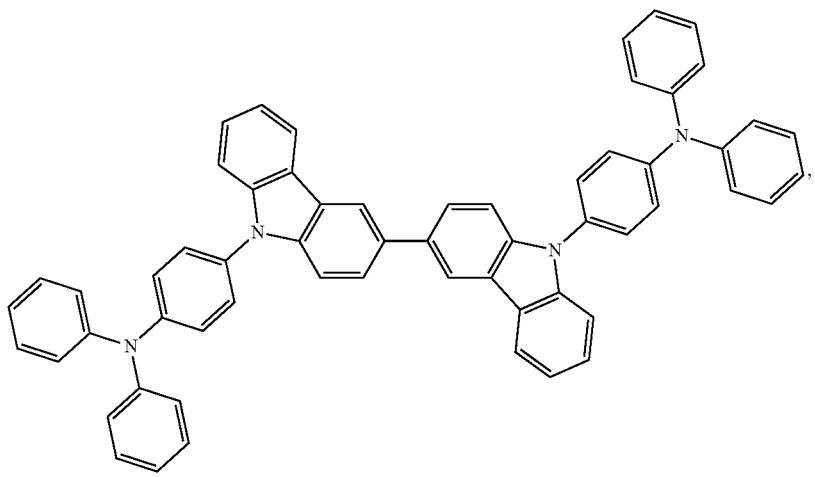
(W-29)
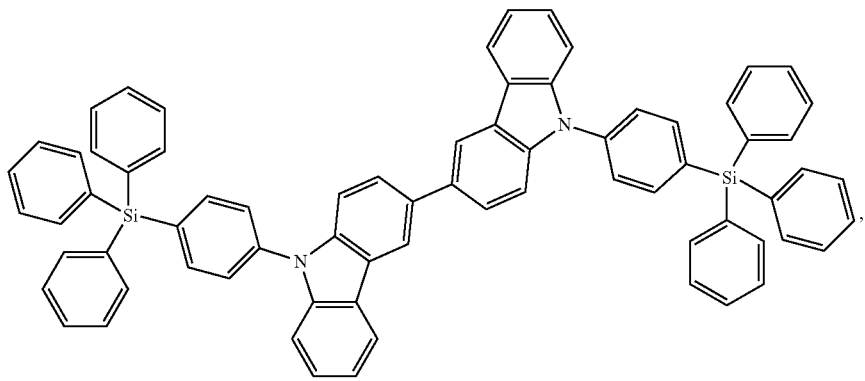
(W-30)
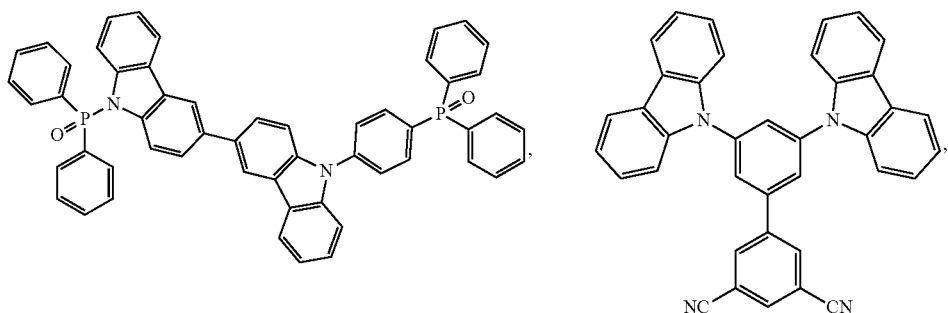
(W-31)
(W-32)
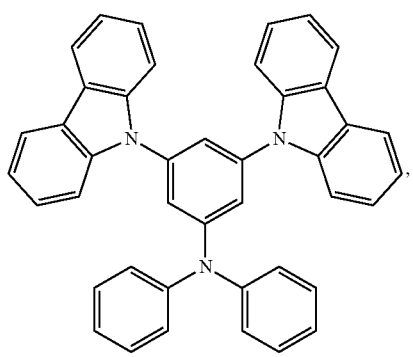
(W-33)
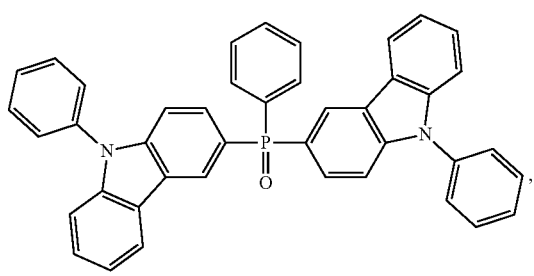

-continued
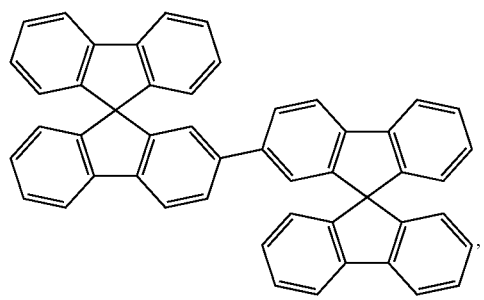
(W-34)
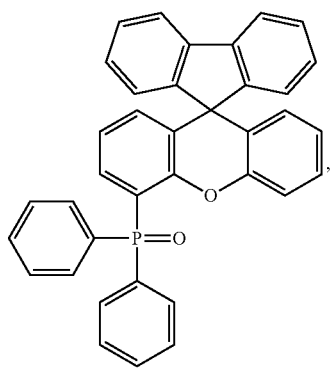
(W-35)
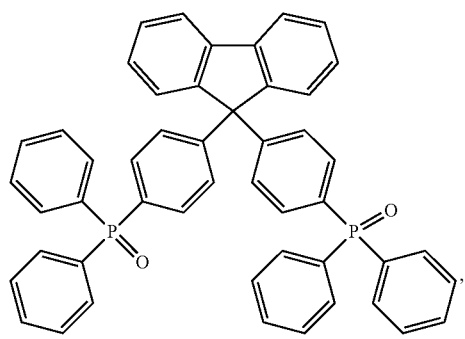
(W-36)
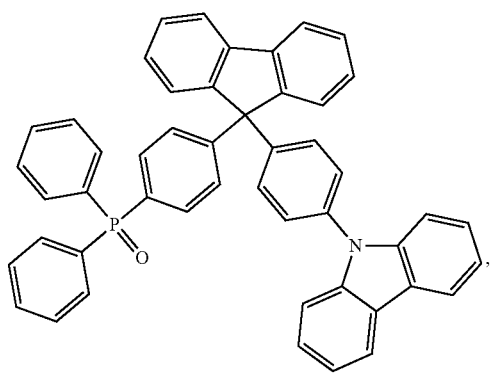
(W-37)
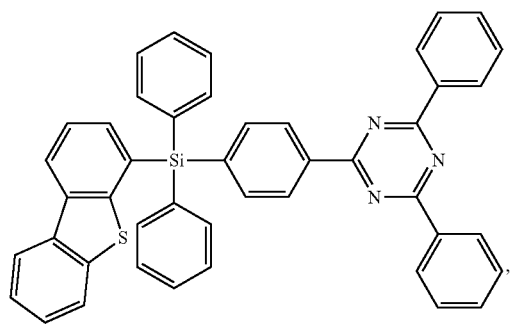
(W-38)
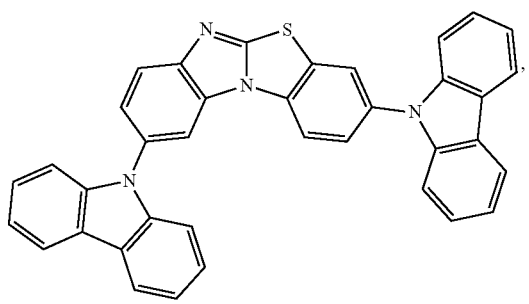
(W-39)
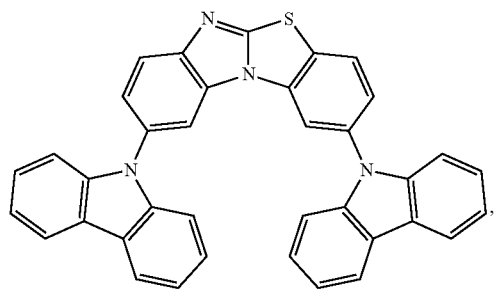
(W-40)
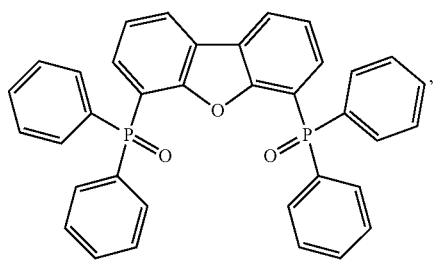
(W41)

-continued

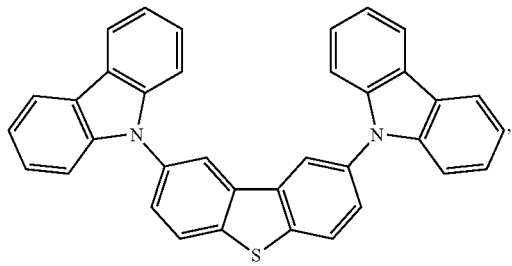
(W-42)

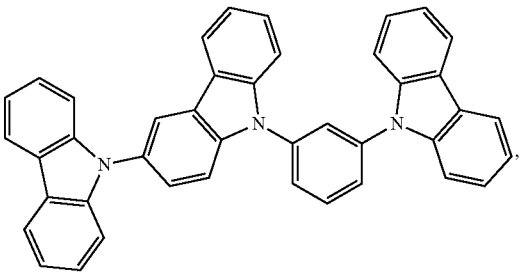
(W-43)

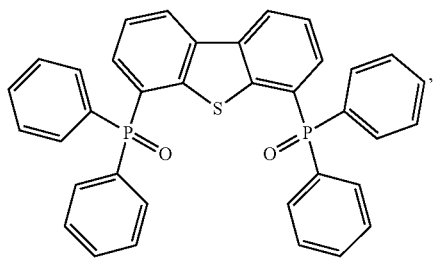
(W-44)

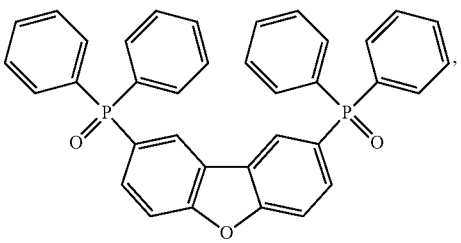
(W-45)

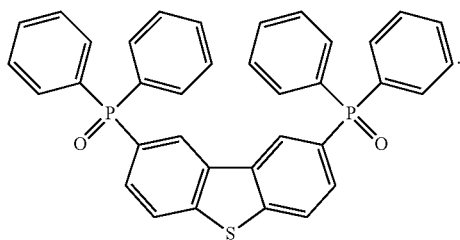
(W-46)

18. The organic electroluminescence device according to claim 1, wherein a mass percentage of the sensitizer material in the organic light emitting layer is 1 wt %-60 wt %;

a mass percentage of the wide bandgap material in the organic light emitting layer is 20 wt %-98.9 wt %; and a mass percentage of the resonance thermally activated delayed fluorescent material in the organic light emitting layer is 0.1 wt %-20 wt %.

19. A method for preparing an organic electroluminescence device, comprising: forming an organic light emitting layer by co-evaporation plating of a wide bandgap material source, a thermally activated delayed fluorescent material source, and a resonance thermally activated delayed fluorescent material source.

20. A display apparatus, comprising the organic electroluminescence device according to claim 1.

* * * * *